United States Patent
Gutierrez

(10) Patent No.: US 10,003,282 B2
(45) Date of Patent: Jun. 19, 2018

(54) LINEARLY DEPLOYED ACTUATORS

(71) Applicant: DIGITALOPTICS CORPORATION MEMS, San Jose, CA (US)

(72) Inventor: Roman C. Gutierrez, Arcadia, CA (US)

(73) Assignee: DigitalOptics Corporation MEMS, San Jose, CA (US)

( * ) Notice: Subject to any disclaimer, the term of this patent is extended or adjusted under 35 U.S.C. 154(b) by 247 days.

(21) Appl. No.: 14/887,054

(22) Filed: Oct. 19, 2015

(65) Prior Publication Data

US 2016/0043665 A1   Feb. 11, 2016

Related U.S. Application Data

(63) Continuation of application No. 14/456,992, filed on Aug. 11, 2014, now Pat. No. 9,166,463, which is a
(Continued)

(51) Int. Cl.
*B81B 3/00* (2006.01)
*G02B 6/36* (2006.01)
(Continued)

(52) U.S. Cl.
CPC ........... *H02N 11/006* (2013.01); *G02B 7/102* (2013.01); *G02B 26/0841* (2013.01);
(Continued)

(58) Field of Classification Search
CPC ........ H02N 1/002; H02N 11/006; B81B 3/00; B81B 3/0043; B81B 3/0045;
(Continued)

(56) References Cited

U.S. PATENT DOCUMENTS 2,774,001 A   12/1956 Riedel
4,333,722 A   6/1982 Lee
(Continued)

FOREIGN PATENT DOCUMENTS

CN   1880995   12/2006
CN   101308240   11/2008
(Continued)

OTHER PUBLICATIONS

Koga et al., "Electrostatic Linear Microactuator Mechanism for Focusing a CCD Camera", Journal of Lightwave Technology, vol. 17, No. 1, Jan. 1999, pp. 43-47.
(Continued)

*Primary Examiner* — Burton Mullins

(57) ABSTRACT

A method for making an actuator includes forming a substantially planar actuator device of an electrically conductive material, the device incorporating an outer frame, a fixed frame attached to the outer frame, a moveable frame disposed parallel to the fixed frame, a motion control flexure coupling the moveable frame to the outer frame for coplanar, rectilinear movement relative to the outer frame and the fixed frame, and an actuator incorporating a plurality of interdigitated teeth, a fixed portion of which is attached to the fixed frame and a moving portion of which is attached to the moveable frame, moving the moveable frame to a deployed position that is coplanar with, parallel to and spaced at a selected distance apart from the fixed frame and fixing the moveable frame at the deployed position for substantially rectilinear, perpendicular movement relative to the fixed frame.

19 Claims, 48 Drawing Sheets

Related U.S. Application Data continuation of application No. 12/946,670, filed on Nov. 15, 2010, now Pat. No. 8,803,256.

(51) Int. Cl.
| | | |
|---|---|---|
| *G02B 26/08* | (2006.01) | |
| *H02N 11/00* | (2006.01) | |
| *H02K 41/02* | (2006.01) | |
| *H02N 1/00* | (2006.01) | |
| *G02B 7/10* | (2006.01) | |
| *G03B 3/00* | (2006.01) | |
| *G02B 6/35* | (2006.01) | |

(52) U.S. Cl.
CPC ............ *H02K 41/02* (2013.01); *H02N 1/008* (2013.01); *B81B 3/0035* (2013.01); *B81B 3/0051* (2013.01); *G02B 6/3584* (2013.01); *G03B 3/00* (2013.01); *G03B 2205/0084* (2013.01); *Y10T 29/49826* (2015.01); *Y10T 29/49863* (2015.01); *Y10T 74/18072* (2015.01)

(58) Field of Classification Search
CPC ..... B81B 3/0048; B81B 7/0003; G02B 6/358; G02B 6/3584; G02B 26/00; G02B 26/08; G02B 26/0833; G02B 26/0841; B81C 1/00436; B81C 1/00523; Y10T 16/54; Y10T 16/5403; Y10T 16/5518; G03B 3/00; G03B 2205/0053; G03B 2205/0069
USPC .............. 310/309; 359/224.1, 290–291, 876; 73/504.9; 438/52; 257/415
See application file for complete search history.

(56) References Cited

U.S. PATENT DOCUMENTS

| | | | |
|---|---|---|---|
| 4,384,778 A | 5/1983 | Lee et al. | |
| 4,408,857 A | 10/1983 | Frank | |
| 4,496,217 A | 1/1985 | Aoyagi | |
| 4,716,432 A | 12/1987 | Stephany | |
| 4,860,040 A | 8/1989 | Tamamura et al. | |
| 5,150,260 A | 9/1992 | Chigira | |
| 5,386,294 A | 1/1995 | Ototake et al. | |
| 5,699,621 A | 12/1997 | Trumper et al. | |
| 5,780,948 A | 7/1998 | Lee et al. | |
| 5,825,560 A | 10/1998 | Ogura et al. | |
| 5,867,302 A | 2/1999 | Fleming | |
| 5,986,826 A | 11/1999 | Kosaka et al. | |
| 5,994,159 A | 11/1999 | Aksyuk et al. | |
| 5,995,688 A | 11/1999 | Aksyuk et al. | |
| 5,998,906 A | 12/1999 | Jerman et al. | |
| 6,033,131 A | 3/2000 | Ghosh et al. | |
| 6,068,801 A | 5/2000 | Bodo et al. | |
| 6,167,809 B1 | 1/2001 | Robinson et al. | |
| 6,201,629 B1 * | 3/2001 | McClelland | G02B 26/0841 359/223.1 |
| 6,205,267 B1 | 3/2001 | Aksyuk et al. | |
| 6,239,473 B1 | 5/2001 | Adams et al. | |
| 6,262,827 B1 | 7/2001 | Ueda et al. | |
| 6,291,875 B1 | 9/2001 | Clark et al. | |
| 6,300,156 B1 | 10/2001 | Decker et al. | |
| 6,392,703 B1 | 5/2002 | Uchino et al. | |
| 6,426,777 B1 | 7/2002 | Sato | |
| 6,497,141 B1 | 12/2002 | Turner et al. | |
| 6,520,777 B2 | 2/2003 | Cho et al. | |
| 6,535,311 B1 | 3/2003 | Lindquist | |
| 6,543,087 B2 * | 4/2003 | Yeh | B81B 3/0062 16/292 |
| 6,590,313 B2 | 7/2003 | Agrawal et al. | |
| 6,675,671 B1 | 1/2004 | Jokiel et al. | |
| 6,679,055 B1 | 1/2004 | Ellis | |
| 6,736,521 B1 * | 5/2004 | Turner | B81B 3/0051 359/224.1 |
| 6,771,001 B2 | 8/2004 | Mao et al. | |
| 6,806,991 B1 | 10/2004 | Sarkar et al. |
| 6,847,907 B1 | 1/2005 | Novotny |
| 6,850,675 B1 | 2/2005 | Calvet et al. |
| 6,914,635 B2 | 7/2005 | Ostergard |
| 6,936,493 B1 | 8/2005 | Michalicek |
| 6,950,570 B1 | 9/2005 | Novotny |
| 6,958,777 B1 | 10/2005 | Pine |
| 7,027,206 B2 | 4/2006 | Mochizuki |
| 7,038,150 B1 | 5/2006 | Polosky et al. |
| 7,071,594 B1 | 7/2006 | Yan et al. |
| 7,113,688 B2 | 9/2006 | Calvet et al. |
| 7,148,603 B1 | 12/2006 | Garcia et al. |
| 7,154,199 B2 | 12/2006 | Yasuda |
| 7,190,854 B1 | 3/2007 | Novotny et al. |
| 7,224,883 B2 | 5/2007 | Gulvin et al. |
| 7,242,825 B2 | 7/2007 | Lin et al. |
| 7,266,272 B1 | 9/2007 | Calvet et al. |
| 7,279,761 B2 | 10/2007 | Acar et al. |
| 7,285,879 B2 | 10/2007 | Osaka |
| 7,359,131 B1 | 4/2008 | Gutierrez et al. |
| 7,372,074 B2 | 5/2008 | Milne et al. |
| 7,436,207 B2 | 10/2008 | Rogers et al. |
| 7,468,571 B2 | 12/2008 | Harada et al. |
| 7,477,842 B2 | 1/2009 | Gutierrez |
| 7,479,402 B2 | 1/2009 | Yu |
| 7,545,591 B1 | 6/2009 | Tong et al. |
| 7,555,210 B2 | 6/2009 | Calvet |
| 7,557,470 B2 | 7/2009 | Culpepper et al. |
| 7,579,848 B2 | 8/2009 | Bottoms et al. |
| 7,586,702 B1 | 9/2009 | Huang et al. |
| 7,592,737 B2 | 9/2009 | Bourbon et al. |
| 7,645,627 B2 | 1/2010 | Christenson et al. |
| 7,646,969 B2 | 1/2010 | Calvet et al. |
| 7,705,909 B2 | 4/2010 | Ishizawa et al. |
| 7,720,366 B2 | 5/2010 | Iwasaki et al. |
| 7,796,847 B2 | 9/2010 | Kubby et al. |
| 7,838,322 B1 | 11/2010 | Vargo et al. |
| 7,855,489 B2 | 12/2010 | Hirano |
| 7,872,394 B1 | 1/2011 | Gritters et al. |
| 7,986,449 B2 | 7/2011 | Davis et al. |
| 7,990,628 B1 | 8/2011 | Calvet et al. |
| 8,004,780 B2 | 8/2011 | Gutierrez et al. |
| 8,154,378 B2 | 4/2012 | Aksyuk et al. |
| 8,178,936 B2 | 5/2012 | Zhe et al. |
| 8,289,614 B1 | 10/2012 | Calvet et al. |
| 8,299,598 B2 | 10/2012 | Moden |
| 8,337,103 B2 | 12/2012 | Gutierrez |
| 8,358,925 B2 | 1/2013 | Gutierrez et al. |
| 8,391,700 B1 | 3/2013 | Gutierrez et al. |
| 8,430,580 B2 | 4/2013 | Gutierrez et al. |
| 8,521,017 B2 | 8/2013 | Calvet et al. |
| 8,547,627 B2 | 10/2013 | Jain et al. |
| 8,604,663 B2 | 12/2013 | Gutierrez et al. |
| 8,605,375 B2 | 12/2013 | Gutierrez et al. |
| 8,608,393 B2 | 12/2013 | Gutierrez et al. |
| 8,619,378 B2 | 12/2013 | Gutierrez |
| 8,637,961 B2 | 1/2014 | Gutierrez et al. |
| 8,884,381 B2 | 11/2014 | Jain et al. |
| 9,052,567 B2 | 6/2015 | Gutierrez |
| 9,061,883 B2 | 6/2015 | Gutierrez et al. |
| 9,352,962 B2 | 5/2016 | Jain et al. |
| 2001/0004420 A1 | 6/2001 | Kuwana et al. |
| 2002/0006687 A1 | 1/2002 | Lam |
| 2002/0070634 A1 | 6/2002 | Tai et al. |
| 2002/0105699 A1 | 8/2002 | Miracky et al. |
| 2002/0125789 A1 | 9/2002 | Brandt |
| 2002/0130586 A1 | 9/2002 | Mao et al. |
| 2003/0026547 A1 | 2/2003 | Trzecieski |
| 2003/0048036 A1 | 3/2003 | Lemkin |
| 2003/0062422 A1 | 4/2003 | Fateley et al. |
| 2003/0063838 A1 | 4/2003 | Hagood et al. |
| 2003/0076421 A1 | 4/2003 | Dutta |
| 2003/0086751 A1 | 5/2003 | Culpepper |
| 2003/0210116 A1 | 11/2003 | Lane et al. |
| 2004/0048410 A1 | 3/2004 | O'Brien et al. |
| 2004/0066494 A1 | 4/2004 | Lee et al. |
| 2004/0183936 A1 | 9/2004 | Kim et al. |
| 2004/0184132 A1 | 9/2004 | Novotny |
| 2004/0189969 A1 | 9/2004 | Mizuno |

(56) References Cited

U.S. PATENT DOCUMENTS

| | | |
|---|---|---|
| 2005/0000311 A1 | 1/2005 | Storm |
| 2005/0002008 A1 | 1/2005 | De Weerdt et al. |
| 2005/0002086 A1 | 1/2005 | Starkweather et al. |
| 2005/0007489 A1 | 1/2005 | Ahn et al. |
| 2005/0095813 A1 | 5/2005 | Zhu et al. |
| 2005/0139542 A1 | 6/2005 | Dickensheets et al. |
| 2005/0148433 A1 | 7/2005 | Wang et al. |
| 2005/0156481 A1 | 7/2005 | Zhou et al. |
| 2005/0219399 A1 | 10/2005 | Sato et al. |
| 2005/0249487 A1 | 11/2005 | Gutierrez |
| 2006/0028320 A1 | 2/2006 | Osaka |
| 2006/0033938 A1 | 2/2006 | Kopf et al. |
| 2006/0056084 A1 | 3/2006 | Araki |
| 2006/0092514 A1 | 5/2006 | Koo et al. |
| 2006/0153556 A1 | 7/2006 | Lee et al. |
| 2006/0183332 A1 | 8/2006 | Kang |
| 2006/0192858 A1 | 8/2006 | Calvet |
| 2006/0193618 A1 | 8/2006 | Calvet |
| 2006/0204242 A1 | 9/2006 | Gutierrez et al. |
| 2006/0209012 A1 | 9/2006 | Hagood, IV |
| 2006/0219006 A1 | 10/2006 | Nasiri et al. |
| 2006/0250325 A1 | 11/2006 | Hagood et al. |
| 2006/0252297 A1 | 11/2006 | Culpepper |
| 2006/0277997 A1 | 12/2006 | Foster et al. |
| 2007/0024155 A1 | 2/2007 | Calvet et al. |
| 2007/0133976 A1 | 6/2007 | Gutierrez et al. |
| 2008/0020573 A1 | 1/2008 | Birkmeyer et al. |
| 2008/0044172 A1 | 2/2008 | Tang et al. |
| 2008/0054757 A1 | 3/2008 | Aksyuk et al. |
| 2008/0198249 A1 | 8/2008 | Tanimura et al. |
| 2008/0240704 A1 | 10/2008 | Takahashi |
| 2008/0279498 A1 | 11/2008 | Sampsell et al. |
| 2008/0309191 A1 | 12/2008 | Chou et al. |
| 2009/0031548 A1 | 2/2009 | Zaitsu et al. |
| 2009/0152980 A1 | 6/2009 | Huang |
| 2009/0185796 A1 | 7/2009 | Tsutsumi et al. |
| 2009/0213236 A1 | 8/2009 | Chiou et al. |
| 2009/0244302 A1 | 10/2009 | Tsai |
| 2009/0244668 A1 | 10/2009 | Fujino et al. |
| 2009/0284816 A1 | 11/2009 | Davis et al. |
| 2009/0310959 A1 | 12/2009 | Shih et al. |
| 2010/0232777 A1 | 9/2010 | Tseng et al. |
| 2010/0284081 A1 | 11/2010 | Gutierrez et al. |
| 2011/0026148 A1 | 2/2011 | Tanimura et al. |
| 2012/0081598 A1 | 4/2012 | Calvet et al. |
| 2012/0119324 A1 | 5/2012 | Jain et al. |
| 2012/0119425 A1 | 5/2012 | Gutierrez et al. |
| 2012/0120297 A1 | 5/2012 | Gutierrez |
| 2012/0120308 A1 | 5/2012 | Gutierrez et al. |

FOREIGN PATENT DOCUMENTS

| | | |
|---|---|---|
| CN | 101561544 | 10/2009 |
| EP | 1959284 | 8/2008 |
| EP | 2264507 | 12/2010 |
| JP | 2006072294 | 3/2006 |
| JP | 2006297543 | 11/2006 |
| JP | 2006301452 | 11/2006 |
| JP | 2008010624 | 1/2008 |
| JP | 2010145264 | 7/2010 |
| JP | 2010167536 | 8/2010 |
| KR | 20080079115 | 8/2008 |
| WO | WO 2002063371 | 8/2002 |
| WO | WO 2008061025 | 5/2008 |
| WO | WO 2010038229 | 4/2010 |

OTHER PUBLICATIONS

Tsuboi et al., "A Rotational Comb-Driven Micromirror With A Large Deflection Angle and Low Drive Voltage," Technical Digest. MEMS. IEEE International Conference on Microelectro Mechanical Systems, Jan. 20, 2002, pp. 532-535.

Chiu et al., "Design, Fabrication, and Control of Components in MEMS-Based Optical Pickups," IEEE Transactions on Magnetics, IEEE Service Center, New York, US, vol. 17, No. 2, Feb. 1, 2007, pp. 780-784.

Wu et al., "Development of tracking and focusing micro actuators for dual-stage optical pick-up head," Journal of Optics A: Pure and Applied Optics, Institute of Physics Publishing, Bristol, GB, vol. 8, No. 7, Jul. 1, 2006, pp. S323-S329.

Kim et al., "Integrated Micro Optical Flying Head With Lens Positioning Actuator For Small Form Factor Data Storage," Transducers '03. 12$^{th}$ International Conference on Solid-State Sensors, Actuators and Microsystems, Digest of Technical Papers (Cat. No. 03TH8664), vol. 1, Jun. 8-12, 2003, pp. 607-610.

Kwon et al., "Large-Displacement Vertical Microlens Scanner With Low Driving Voltage," IEEE Photonics Technology Letters, IEEE Service Center, Piscataway, NJ, US, vol. 14, No. 11, Nov. 2002, pp. 1572-1574.

Takahashi et al., "Switched-Layer Design for SOI Bulk Micromachined XYZ Stage Using Stiction Bar for Interlayer Electrical Connection," Journal of Microelectromechanical Systems, IEEE Service Center, US, vol. 18, No. 4, Aug. 2009, pp. 818-827.

* cited by examiner

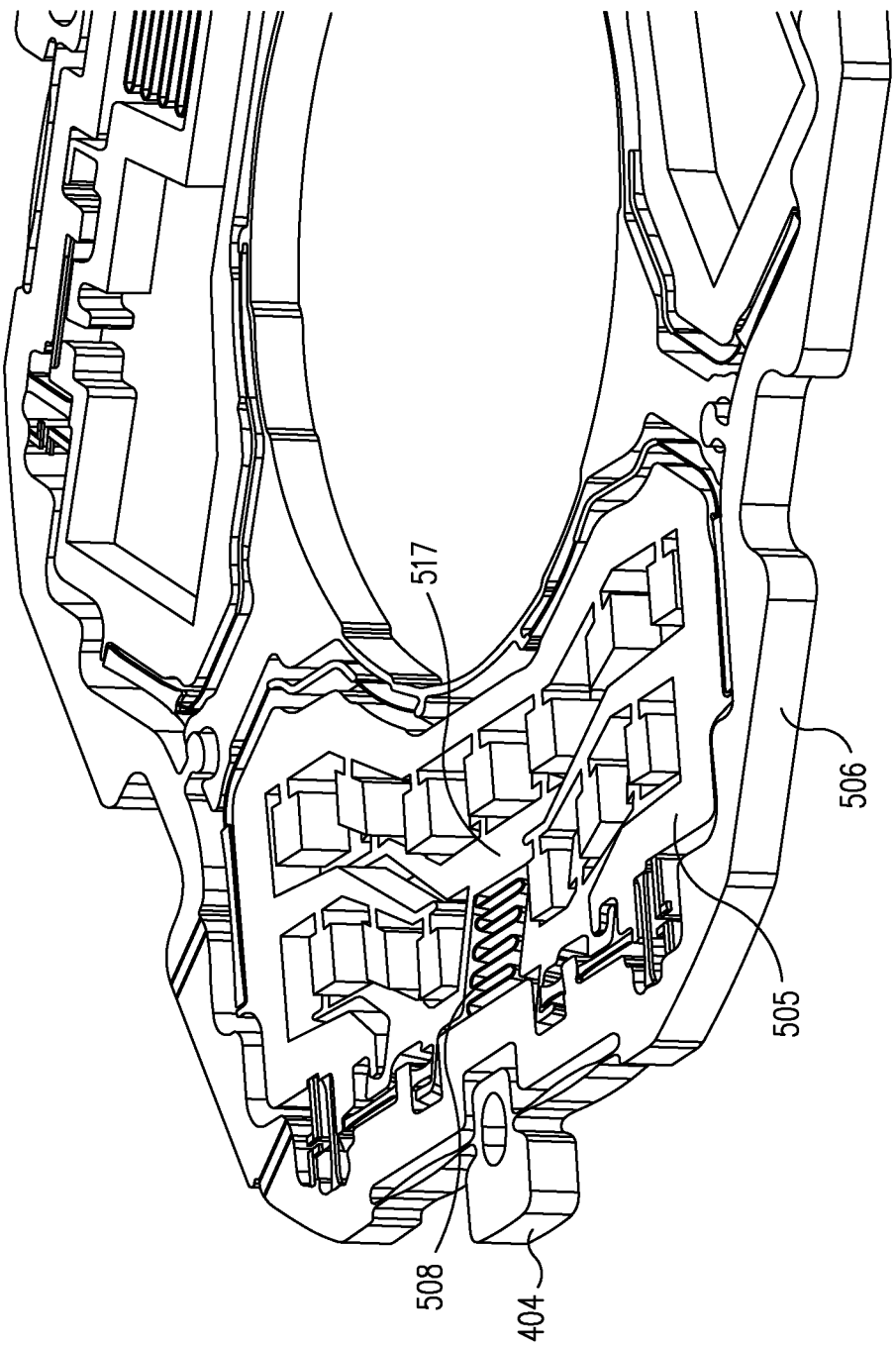

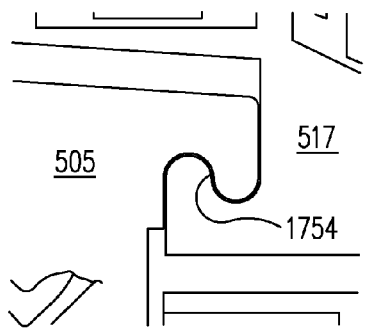
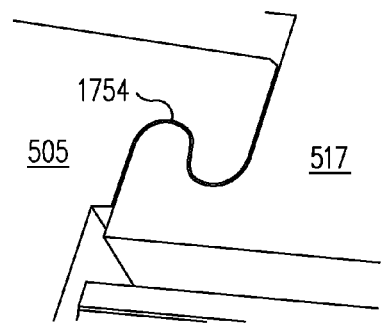
FIG. 17I  FIG. 17J
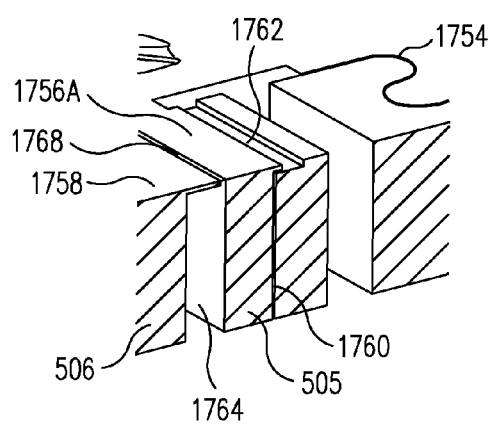
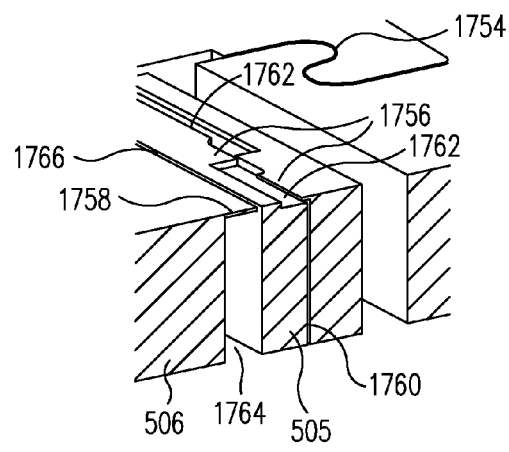
FIG. 17K  FIG. 17L
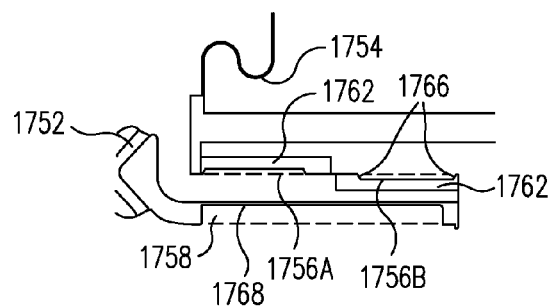
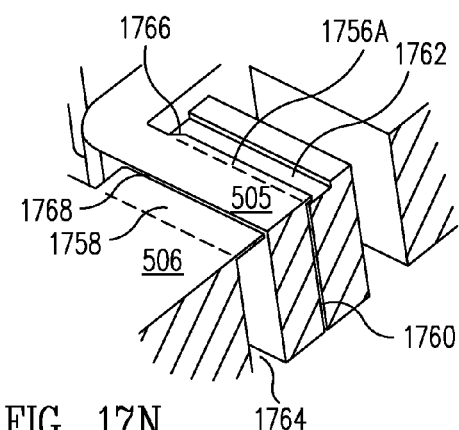
FIG. 17M  FIG. 17N

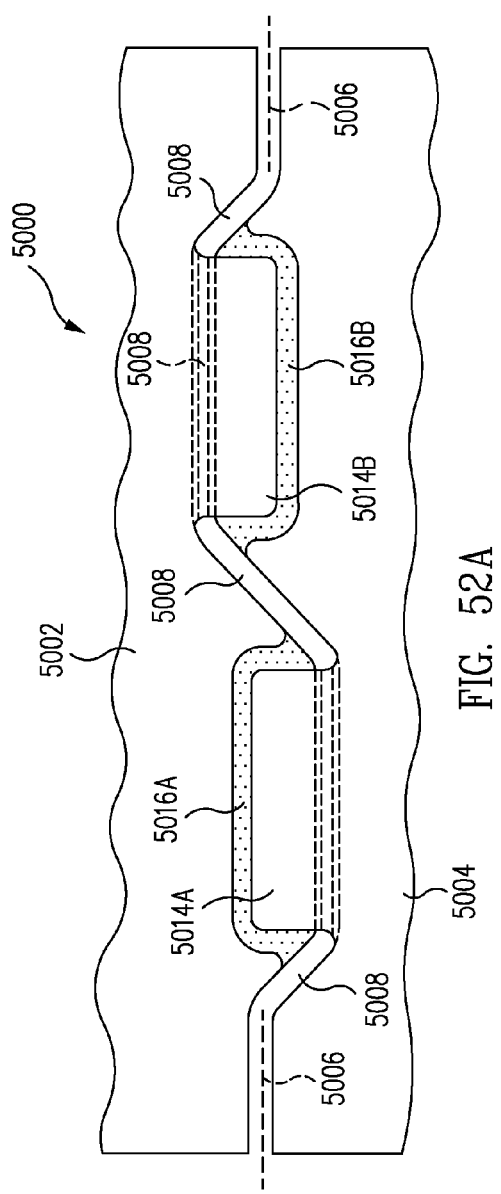
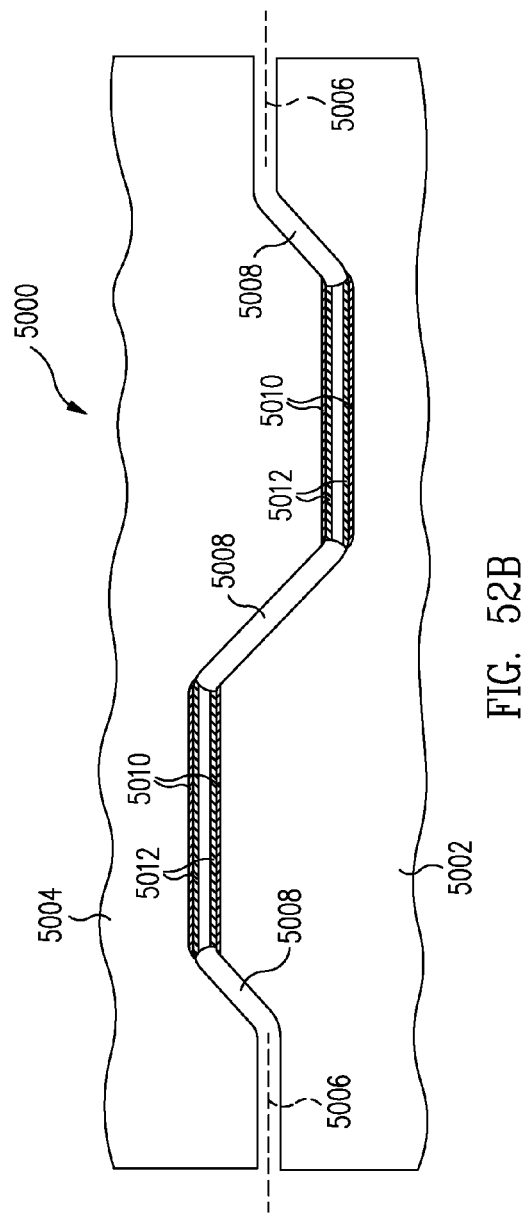
FIG. 52A
FIG. 52B

LINEARLY DEPLOYED ACTUATORS

CROSS REFERENCE TO RELATED APPLICATION

This application is a continuation of U.S. patent application Ser. No. 14/456,992, filed on Aug. 11, 2014, which is a continuation of U.S. patent application Ser. No. 12/946,670, filed Nov. 15, 2010, which are is incorporated by reference herein in their entirety.

BACKGROUND

Technical Field

This disclosure generally relates to actuators and more particularly relates, for example, to MEMS actuators with motion control that are suitable for use in miniature cameras or other devices and methods for making them.

Related Art

Actuators for use in miniature cameras and other devices are well known. Such actuators typically comprise voice coils that are used to move a lens for focusing, zooming, or optical image stabilization.

Miniature cameras are used in a variety of different electronic devices. For example, miniature cameras are commonly used in cellular telephones, laptop computers, and surveillance devices. Miniature cameras may have many other applications.

It is frequently desirable to reduce the size of miniature cameras. As the size of electronic devices continues to be reduced, the size of miniature cameras that are part of such electronic devices must typically be reduced as well.

Further, it is desirable to enhance the shock resistance of such miniature cameras. As the size of miniature cameras is reduced, smaller, more delicate components must often be utilized in their construction. Since such consumer products are typically subject to substantial abuse, such as rough handling and dropping, the components of miniature cameras must be protected from the shock that is associated with such abuse.

Accordingly, a need exists for reduced sized actuator devices for use in miniature cameras and other devices that are capable of withstanding shock and abuse, along with reliable and cost effective methods for making them.

SUMMARY

In accordance with the present disclosure, linear actuators suitable for use in a variety of applications and methods for making them are provided.

In one embodiment, an actuator comprises a substantially planar actuator device formed of an electrically conductive material and comprising an outer frame, a fixed frame attached to the outer frame, a moveable frame disposed parallel to the fixed frame, a motion control flexure coupling the moveable frame to the outer frame for coplanar, rectilinear movement relative to the outer frame and the fixed frame, and an actuator incorporating a plurality of interdigitated teeth, a fixed portion of which is attached to the fixed frame and a moving portion of which is attached to the moveable frame, wherein the moveable frame is fixed at a deployed position that is coplanar with, parallel to and spaced a selected distance apart from the fixed frame for substantially rectilinear, perpendicular movement relative thereto.

In another embodiment, a method for making an actuator comprises forming a substantially planar actuator device of an electrically conductive material and comprising an outer frame, a fixed frame attached to the outer frame, a moveable frame disposed parallel to the fixed frame, a motion control flexure coupling the moveable frame to the outer frame for coplanar, rectilinear movement relative to the outer frame and the fixed frame, and an actuator incorporating a plurality of interdigitated teeth, a fixed portion of which is attached to the fixed frame and a moving portion of which is attached to the moveable frame, then moving the moveable frame to a deployed position that is coplanar with, parallel to and spaced a selected distance apart from the fixed frame and fixing the moveable frame at the deployed position for substantially rectilinear, perpendicular movement relative to the fixed frame.

The scope of the disclosure is defined by the claims, which are incorporated into this section by reference. A more complete understanding of embodiments will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

FIG. 9B illustrates a portion of the actuator device in a deployed configuration with a small voltage applied thereto, in accordance with an embodiment.

FIGS. 17I and 17J illustrate the lateral snubber assembly, in accordance with an embodiment.

FIGS. 17K and 17L illustrate cross-sectional views of the single snubber flap and the interlocking snubber flaps, in accordance with an embodiment.

FIG. 17M illustrates a top view of the lateral snubber assembly, the single snubber flap and the interlocking snubber flaps, in accordance with an embodiment.

FIG. 17N illustrates cross-sectional views of the single snubber flap and the interlocking snubber flaps, in accordance with an embodiment.

FIGS. 52A-52B illustrate other features of the interlocking flap damper, in accordance with an embodiment.

Figure 1:
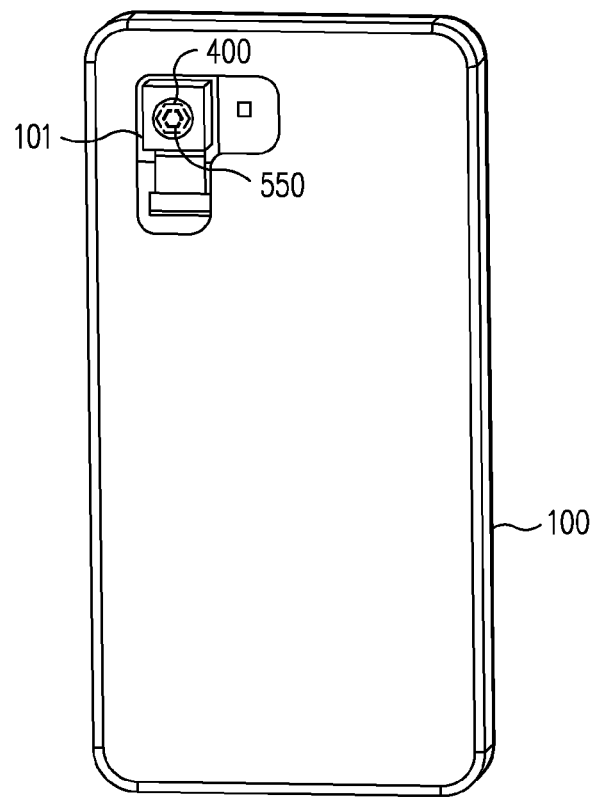
FIG. 1 illustrates an electronic device having an actuator device, in accordance with an embodiment.

Embodiments of the disclosure and their advantages are best understood by referring to the detailed description that

DETAILED DESCRIPTION

An actuator device suitable for use in a wide variety of different electronic devices is disclosed in accordance with various embodiments. The actuator device may be adapted for use in a camera, such as a miniature camera, for example. The actuator device may be used to either manually or automatically focus the miniature camera. The actuator device may be used to zoom the miniature camera or to provide optical image stabilization for the miniature camera. The actuator device may be used to align the optics within the camera. The actuator device may be used for any other desired application in an electronic device or in any other device.

In accordance with one or more embodiments, the actuator device may comprise one or more MEMS actuators. The actuator device may be formed using monolithic construction. The actuator device may be formed using non-monolithic construction.

The actuator device may be formed using contemporary fabrication techniques, such as etching and micromachining, for example. Various other fabrication techniques are contemplated.

The actuator device may be formed of silicon (e.g., single crystal silicon and/or polycrystalline silicon). The actuator device may be formed of other semiconductors such as silicon, germanium, diamond, and gallium arsenide. The material of which the actuator device is formed may be doped to obtain a desired conductivity thereof. The actuator device may be formed of a metal such as tungsten, titanium, germanium, aluminum, or nickel. Any desired combination of such materials may be used.

Motion control of the actuator device and/or items moved by the actuator device is disclosed in accordance with various embodiments. The motion control may be used to facilitate a desired movement of an item while mitigating undesired movement of the item. For example, the motion control may be used to facilitate movement of a lens along an optical axis of the lens, while inhibiting other movements of the lens. Thus, the motion control may be used to facilitate movement of the lens in single desired translational degree of freedom while inhibiting movement of the lens in all other translational degrees of freedom and while inhibiting movement of the lens in all rotational degrees of freedom. In another example, the motion control may facilitate movement of the lens in all three translational degrees of freedom while inhibiting movement of the lens in all rotational degrees of freedom.

Thus, an enhanced miniature camera for standalone use and for use in electronic devices may be provided. The miniature camera is suitable for use in a wide variety of different electronic devices. For example, the miniature camera is suitable for use in electronic devices such as cellular telephones, laptop computers, televisions, handheld devices, and surveillance devices.

According to various embodiments, smaller size and enhanced shock resistance are provided. Enhanced fabrication techniques may be used to provide these and other advantages. Such fabrication techniques may additionally enhance the overall quality and reliability of miniature cameras while also substantially reducing the cost thereof.

FIG. 1 illustrates an electronic device 100 having an actuator device 400, in accordance with an embodiment. As discussed herein, the actuator device 400 may have one or more actuators 550. In one embodiment, the actuators 550 may be MEMS actuators, such as electrostatic comb drive actuators. In one embodiment, the actuators 550 may be rotational comb drive actuators.

The electronic device 100 may have one or more actuators 550 for moving any desired component thereof. For example, the electronic device 100 may have an optical device such as a miniature camera 101 that has the actuator 550 for moving optical elements such as one or more movable lenses 301 (shown in FIG. 2) that are adapted to provide focus, zoom, and/or image stabilization. The electronic device 100 may have any desired number of the actuators 550 for performing any desired functions.

The electronic device 100 may be a cellular telephone, a laptop computer, a surveillance device, or any other desired device. The miniature camera 101 may be built into the electronic device 100, may be attached to the electronic device 100, or may be separate (e.g., remote) with respect to the electronic device 100.

Figure 2:
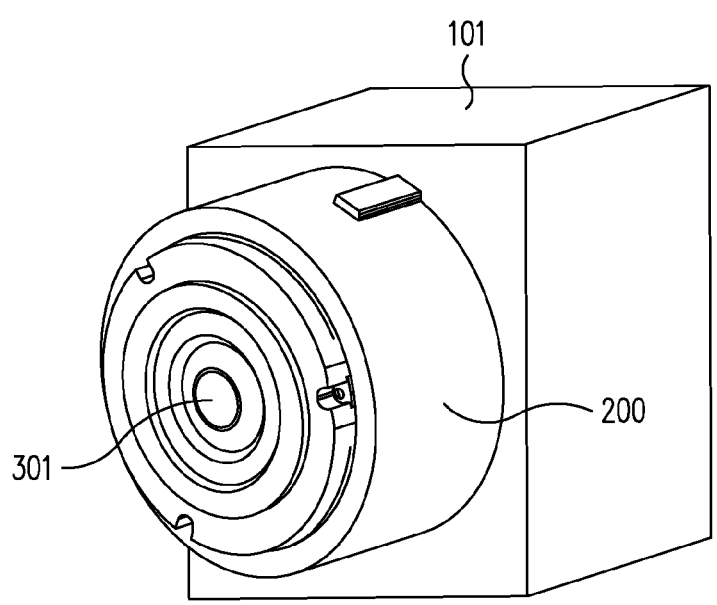
FIG. 2 illustrates a miniature camera having a lens barrel, in accordance with an embodiment.

FIG. 2 illustrates the miniature camera 101 having a lens barrel 200, in accordance with an embodiment. The lens barrel 200 may contain one or more optical elements, such as the movable lens 301, which may be moved by the actuator device 400 (shown in FIG. 1). The lens barrel 200 may have one or more optical elements which may be fixed. For example, the lens barrel 200 may contain one or more lenses, apertures (variable or fixed), shutters, mirrors (which may be flat, non-flat, powered, or non-powered), prisms, spatial light modulators, diffraction gratings, lasers, LEDs and/or detectors. Any of these items may be fixed or may be movable by the actuator device 400.

The actuator device 400 may move non-optical devices such as samples that are provided for scanning. The samples may be either biological samples or non-biological samples. Examples of biological samples include organisms, tissues, cells, and proteins. Examples of non-biological samples include solids, liquids, and gases. The actuator device 400 may be used to manipulate structures, light, sound, or any other desired thing.

The optical elements may be partially or fully contained within the lens barrel 200. The lens barrel 200 may have any desired shape. For example, the lens barrel 200 may be substantially round, triangular, rectangular, square, pentagonal, hexagonal, octagonal, or of any other shape or cross-sectional configuration. The lens barrel 200 may be either permanently or removably attached to the miniature camera 101. The lens barrel 200 may be defined by a portion of a housing of the miniature camera 101. The lens barrel 200 may be partially or completely disposed within the miniature camera 101.

Figure 3A:
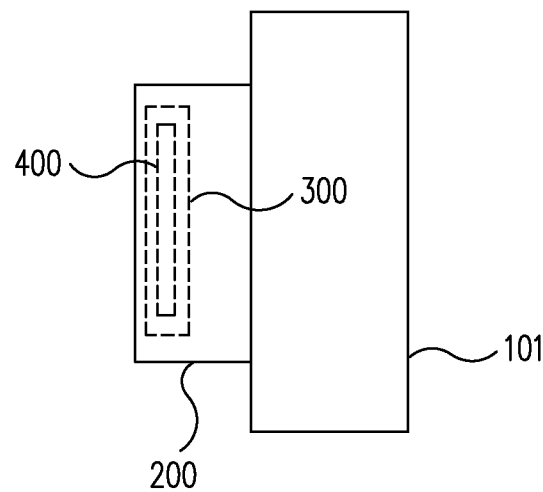
FIG. 3A illustrates the lens barrel having an actuator module disposed therein, in accordance with an embodiment.

FIG. 3A illustrates an actuator module 300 disposed within the lens barrel 200, in accordance with an embodiment. The actuator module 300 may contain the actuator device 400. The actuator device 400 may be completely contained within the lens barrel 200, partially contained within the lens barrel 200, or completely outside of the lens barrel 200. The actuator device 400 may be adapted to move optical elements contained within the lens barrel 200, optical elements not contained within the lens barrel 200, and/or any other desired items.

Figure 3B:
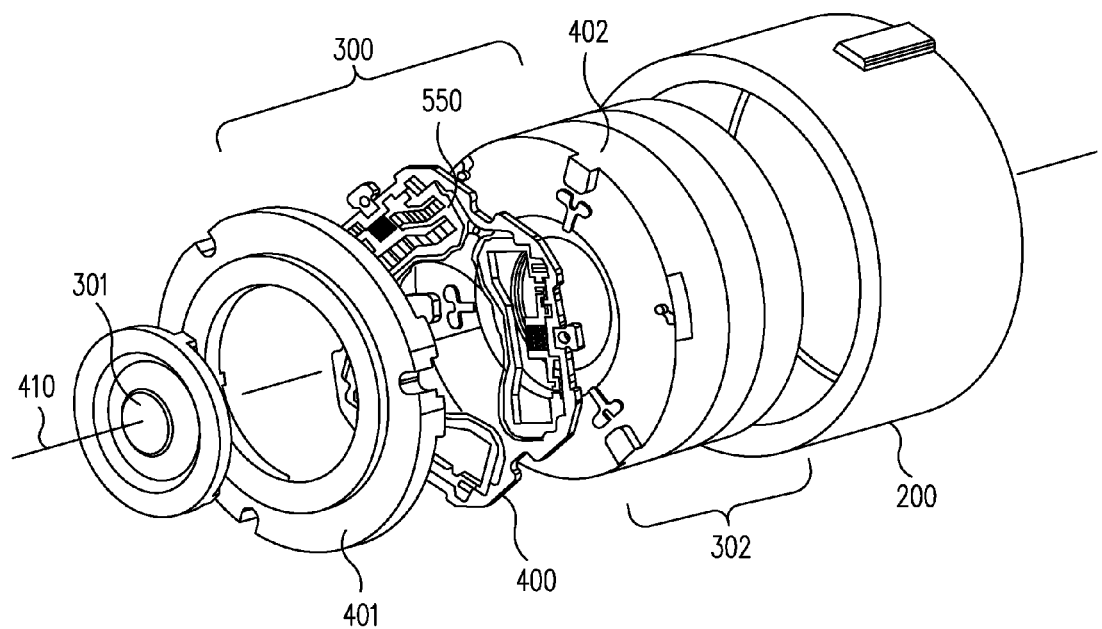
FIG. 3B illustrates the lens barrel and an actuator module in an exploded view, in accordance with an embodiment.

FIG. 3B illustrates the lens barrel 200 and the actuator module 300 in an exploded view, in accordance with an embodiment. The movable lens 301 is an example of an optical element that may be attached to the actuator device 400 and may be moved thereby. The actuator device 400 may be disposed intermediate an upper module cover 401 and a lower module cover 402.

Additional optical elements, such as fixed (e.g., stationary) lenses 302 may be provided. The additional optical elements may facilitate focus, zoom, and/or optical image stabilization, for example. Any desired number and/or type of movable (such as via the actuator device 400) and fixed optical elements may be provided.

Figure 4:
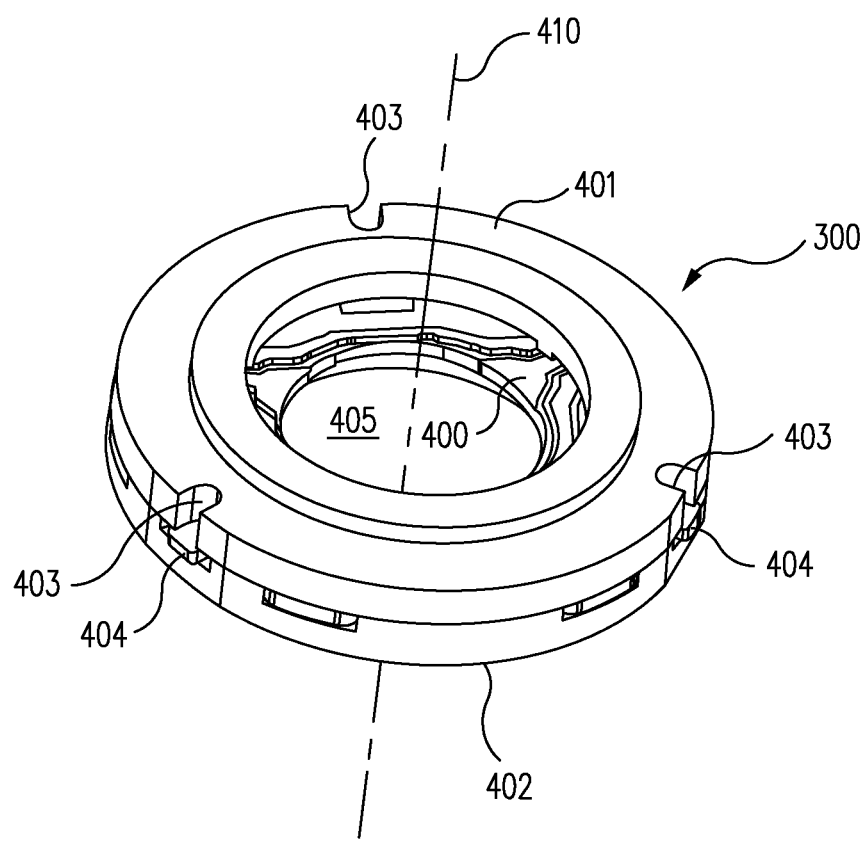
FIG. 4 illustrates the actuator module having the actuator device disposed therein, in accordance with an embodiment.

FIG. 4 illustrates the actuator module 300, in accordance with an embodiment. The actuator module 300 may be disposed partially or completely within the miniature camera 101. The actuator device 400 may be disposed partially or completely within the actuator module 300. For example, the actuator device 400 may be sandwiched substantially between an upper module cover 401 and a lower module cover 402.

The actuator module 300 may have any desired shape. For example, the actuator module 300 may be substantially round, triangular, square, rectangular, pentagonal, hexagonal, octagonal, or of any other shape or cross-sectional configuration.

In one embodiment, the lens barrel 200 may be substantially round in cross-sectional configuration and the actuator module 300 may be substantially round in cross-sectional configuration. The use of a substantially round lens barrel 200 and a substantially round actuator module 300 may facilitate an advantageous reduction in size. The reduction in size may be facilitated, for example, because round lenses are commonly preferred. The use of a substantially round lens barrel 200 and a substantially round actuator module 300 with round lenses tends to result in a reduction of wasted volume and thus tends to facilitate a reduction in size.

As discussed herein, one or more optical elements, such as the movable lens 301, may be disposed in an opening 405 (e.g., a hole) formed in the actuator module 300. Actuation of the actuators 550 may effect movement of the optical elements along their optical axis 410, for example. Thus, actuation of the actuators 550 may move one or more lenses to effect focusing or zoom, for example.

The actuator module 300 may have cutouts 403 formed therein to facilitate assembly of the actuator module 300 and alignment of the actuator device 400 contained therein. The cutouts 403 and/or electrical contacts 404 partially disposed within the cutouts 403 may be used to facilitate alignment of the actuator module 300 with respect to the lens barrel 200.

Figure 5A:
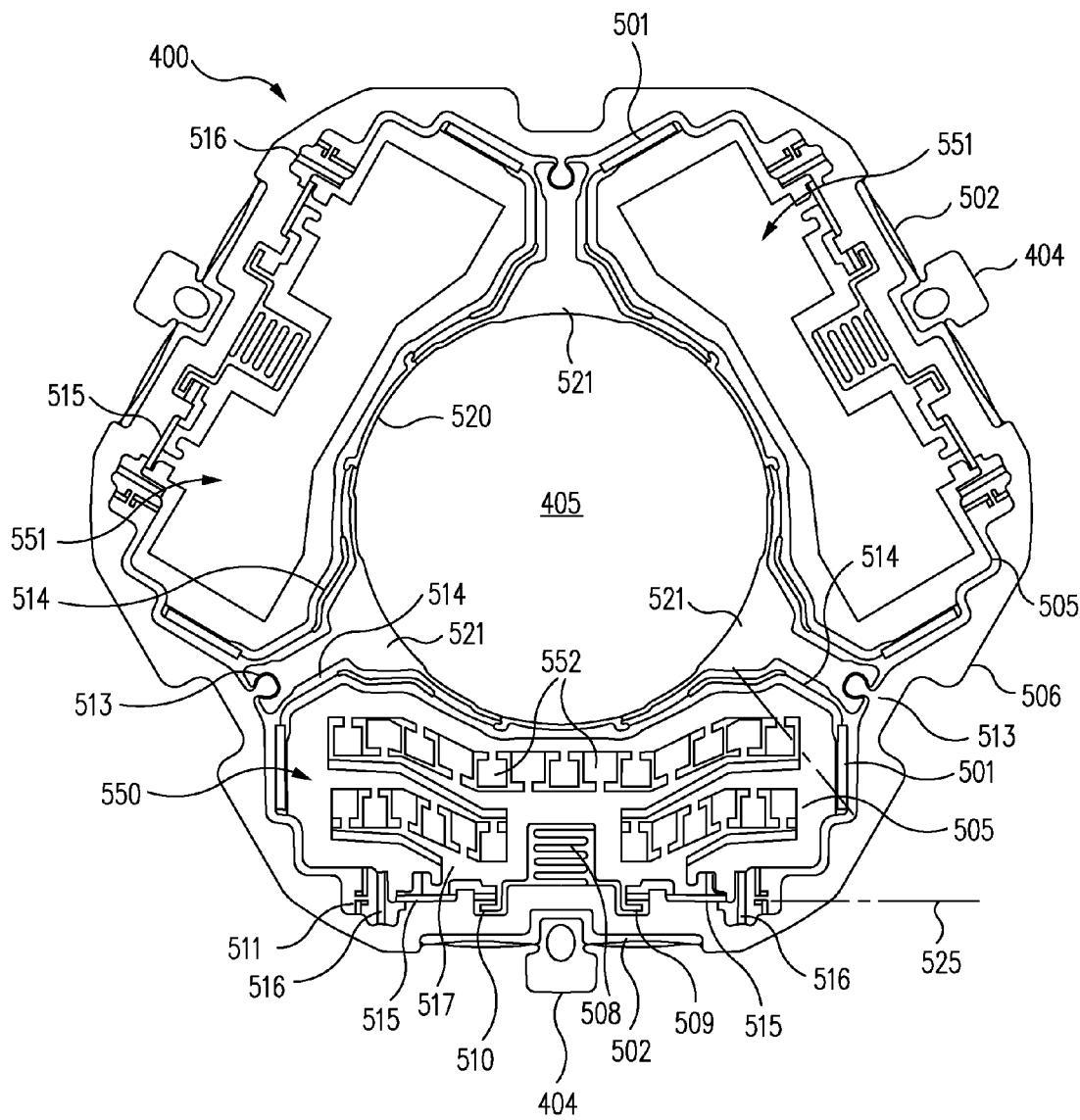
FIG. 5A illustrates a top view of the actuator device, in accordance with an embodiment.

FIG. 5A illustrates a top view of the actuator device 400 having the electrical contacts 404, the opening 405, inner hinge flexures 501, kinematic mount flexures 502, movable frames 505, an outer frame 506, serpentine contact flexures 508, deployment torsional flexures 509, deployment stops 510, flap dampers 511, ball-in-socket snubbers 513, cantilever flexures 514, motion control torsional flexures 515, outer hinge flexures 516, a fixed frame 517, a platform 520, lens pads 521, a pivot axis 525, the actuators 550, spaces 551, and blocks 552, in accordance with an embodiment.

Blocks 552 (FIG. 5A) are shown to represent teeth 560 (see FIGS. 5B and 7) of the actuator 550 in some figures. Those skilled in the art will appreciate that comb drives typically comprise a large number of very small teeth 560 that are difficult to show graphically on a drawing of this scale. For example, the actuator 550 may have between 1 and 10,000 teeth on each side thereof and may have approximately 2,000 teeth on each side thereof. Thus, in one embodiment, the blocks 552 may not represent the actual configuration of the teeth 560, but rather are shown in place of the teeth 560 to better illustrate the operation of the actuators 550, as discussed herein.

In accordance with an embodiment, the actuator device 400 may be substantially hexagonal in shape. The hexagonal shape readily facilitates placement of the actuator device 400 within the substantially round lens barrel 200. The hexagonal shape also facilitates efficient use of wafer real estate. Other shapes are contemplated.

The actuator device 400 may have a plurality of the actuators 550. Only one actuator 550 is illustrated in detail in FIG. 5A. The spaces 551 are shown in FIG. 5A for two additional actuators 550 that are not illustrated in detail. Thus, in one embodiment the actuator device 400 may have three actuators 550 disposed in a substantially radially symmetric pattern about the opening 405 such that the actuators 550 are spaced approximately 120° apart from one another. The actuator device 400 may have any desired number of the actuators 550 disposed in any desired pattern. As further examples, the actuator device 400 may have two actuators 550 spaced approximately 180° apart from one another or may have four actuators 550 spaced approximately 90° apart from one another.

As discussed herein, the actuators 550 may include one or more MEMS actuators, voice coil actuators, or any other desired type or combination of types of actuators. For example, in one embodiment, each actuator 550 may be a vertical rotational comb drive.

The actuators 550 may cooperate with one another to move a platform 520 along the optical axis 410 (FIG. 3B), which in FIG. 5A is perpendicular to the plane of the actuator device 400. The actuators 550 may cooperate with one another to move the platform 520 in a manner that maintains the platform 520 substantially orthogonal with respect to the optical axis 410 and in a manner that substantially mitigates rotation of the platform 520.

Actuation of the actuators 550 is accomplished by the application of a voltage differential between adjacent teeth 560, represented by blocks 552. Such actuation effects rotation of the actuators 550 to facilitate the herein described movement of the platform 520.

In various embodiments, the platform 520 may be adapted substantially as a ring (e.g., as shown in FIG. 5A). Other shapes are contemplated. The platform 520 may have any desired shape.

Prior to deployment, the actuator device 400 may be a substantially planar structure. For example, the actuator device 400 may be substantially formed from a single, monolithic piece of material, such as silicon. The actuator device 400 may be formed from a single die. The die may be approximately 4 to 5 millimeters across and approximately 150 microns thick, for example.

The actuator device 400 may be formed by a MEMS technique, such as milling or etching. A plurality of actuator devices 400 may be formed upon a single wafer. The overall shape or footprint of the actuator device 400 may be adapted to enhance the formation of a plurality of the actuator devices 400 on a single wafer.

Prior to operation, the fixed frame 517 of each actuator 550 may be deployed to offset the adjacent pairs of teeth 560 represented by blocks 552 with respect to one another, in accordance with an embodiment. Deployment may result in a substantially non-planar overall configuration of the actuator device 400. When deployed, each actuator 550 may have a portion thereof (e.g., the fixed frame 517) extending from the plane of the outer frame 506. The fixed frame 517 may extend from the plane of the outer frame 506 at an angle with respect thereto. Thus, when deployed, the fixed frame 517 may be substantially out-of-plane with respect to the outer frame 506.

Once deployed, the fixed frames 517 may be fixed or locked into position such that they do not move further with respect to the outer frame 506, and are angularly offset or rotated with respect to the outer frame 506 and with respect to the movable frame 505 (when the actuator 550 is not actuated). The fixed frames 517 may be mechanically fixed in position, adhesively bonded in position, or any desired combination of mechanically fixed and adhesively bonded.

Actuation of the actuator 550 may cause the movable frame 505 to rotate toward the deployed fixed frame 517 to effect desired movement of the platform 520. Motion control torsional flexures 515 and outer hinge flexures 516 cooperate to facilitate motion controlled rotation of the movable frame 505, as discussed herein. The movable frame 505 rotates about the pivot axis 525.

Figure 5B:
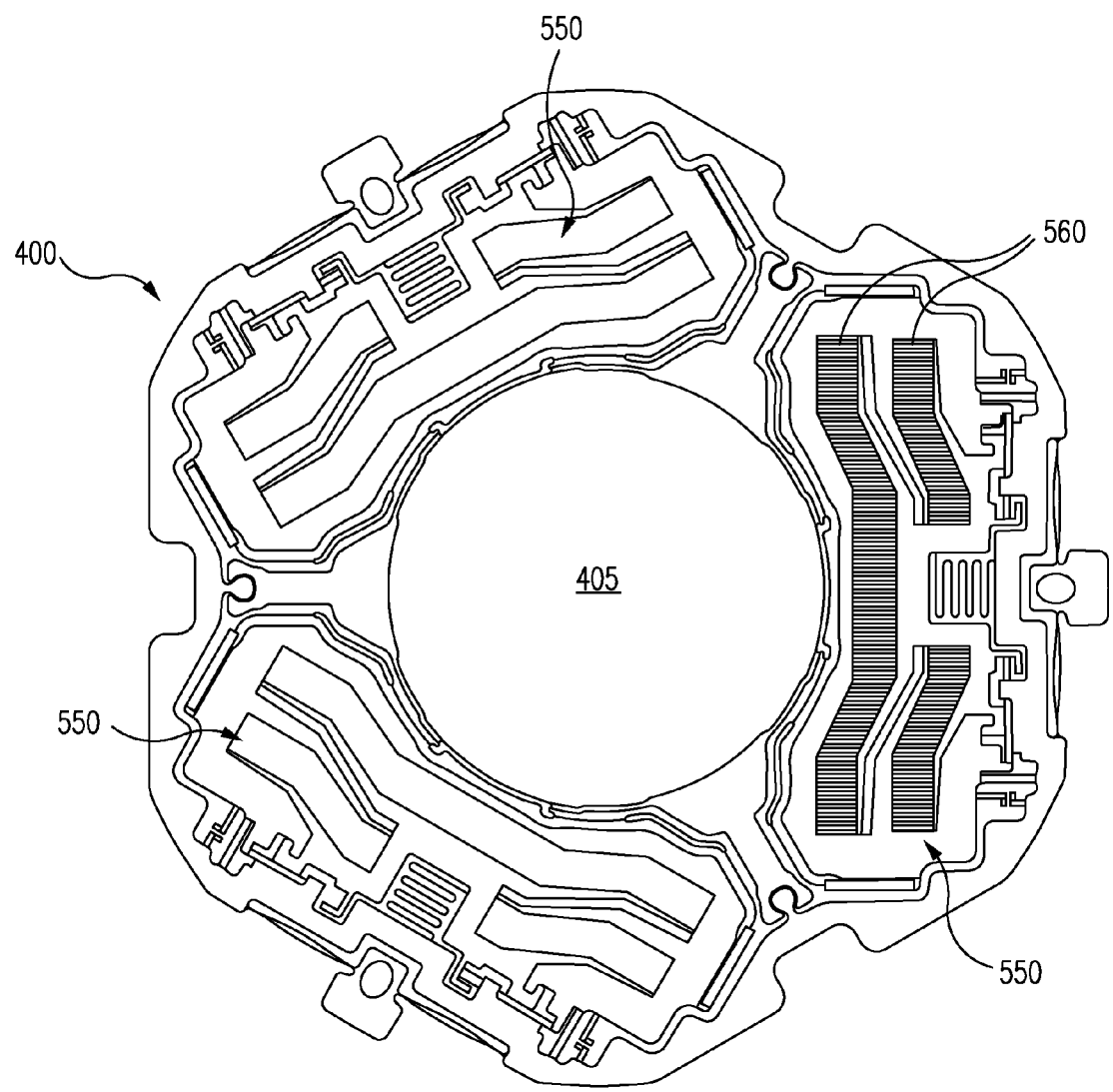
FIG. 5B illustrates a top view of the actuator device, in accordance with an embodiment.

FIG. 5B illustrates a top view of the actuator device 400 having teeth 560 shown in the actuator 550 in place of the blocks 552 representative thereof, in accordance with an embodiment. The teeth 560 shown may be considered to be reduced in number and exaggerated in size for clarity in FIG. 5B.

Figure 6A:
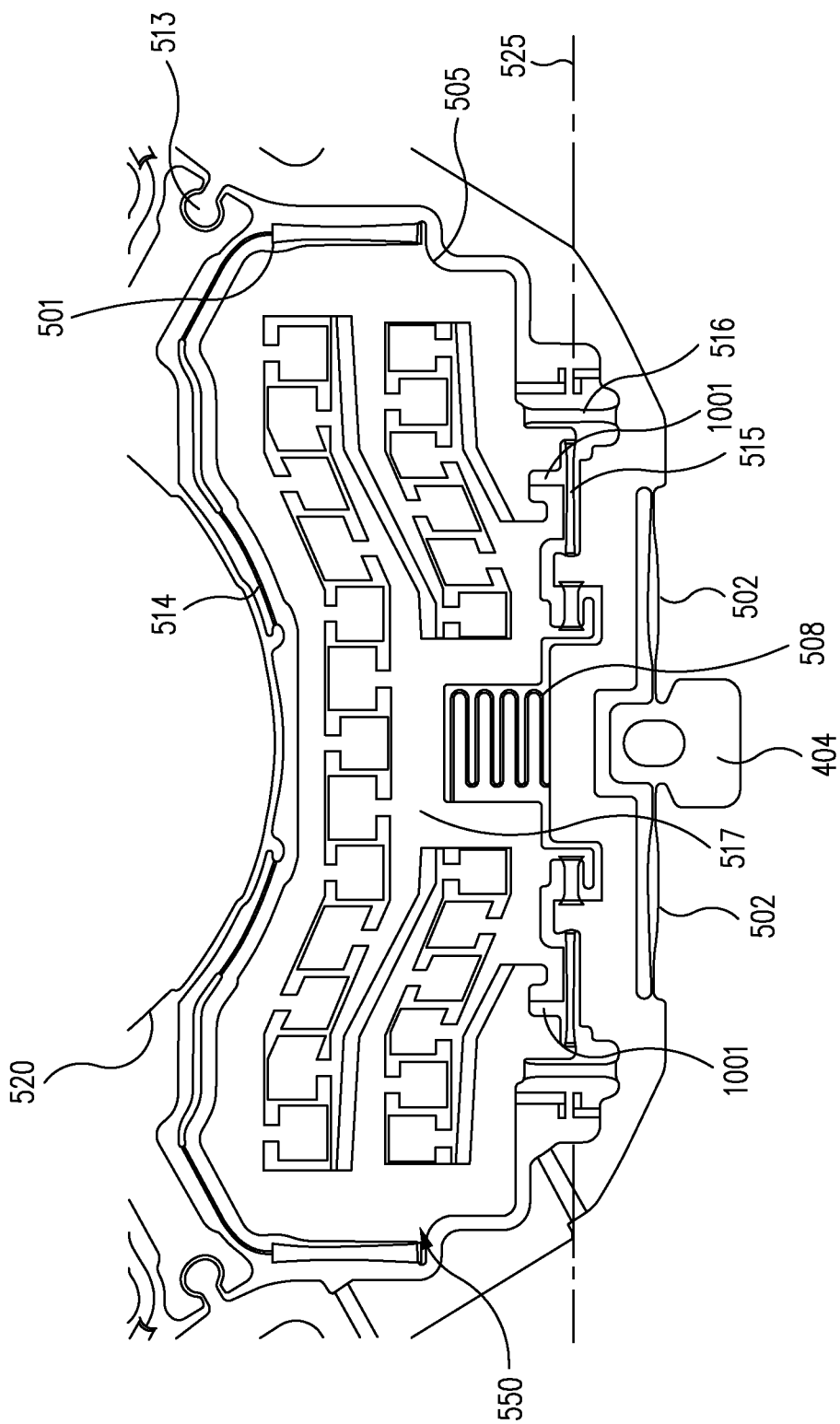
FIG. 6A illustrates a portion of the actuator device, in accordance with an embodiment.

FIG. 6A illustrates a top view of one of the actuators 550 having the inner hinge flexures 501, the ball-in-socket snubbers 513, the movable frame 505, the outer hinge flexures 516, the motion control torsional flexures 515, the cantilever flexures 514, the fixed frame 517, the pivot axis 525, the serpentine contact flexure 508, the pseudokinematic mount and electrical contact 404, and the platform 520, in accordance with an embodiment. FIG. 6A further illustrates a lateral snubber assembly 1001, which is further described herein.

The inner hinge flexure 501 cooperates with the cantilever flexure 514 to transfer desired motion from the movable frame 505 to the platform 520. Thus, actuation of the actuator 550 results in rotation of the movable frame 505, which in turn results in translation of the platform 520, as discussed herein.

The movable frame 505 may pivot on the outer hinge flexures 516 in a fashion similar to a door pivoting on its hinges. Upon the application of a shear force to the actuator device 400, one of the two outer hinge flexures 516 of the actuator 550 may be in tension while the outer hinge flexure 516 may be in compression. The two motion control torsional flexures 515 tend to mitigate undesirable buckling of the outer hinge flexure 516 in such instances.

Each actuator may be substantially disposed within a motion control mechanism that provides comparatively high lateral stiffness and comparatively soft rotational stiffness. In one embodiment, the motion control mechanism may have one or more (e.g., two) outer hinges flexures 516 and may have one or more (e.g., two) motion control torsional flexures 515. Thus, movement of the movable frame 505 may be substantially constrained to desirable rotation thereof.

In one embodiment, the motion control mechanism for one actuator 550 may comprise the outer frame 506, movable frame 505, the motion control torsional flexures 515, the outer hinge flexures 516, the inner hinge flexures 501, the cantilever flexure 514, and the platform 520. In one embodiment, the motion control mechanism may comprise all structures that tend to limit movement of the platform 520 to desired translational movement.

Each actuator 550 may be substantially contained within the motion control mechanism to substantially limit competition for real estate on the actuator device 400, in accordance with an embodiment. Since each actuator 550 and its associated motion control mechanism occupy substantially the same surface area of the actuator device 400, they do not compete for real estate. Thus, as the actuator 550 increases in size, its associated motion control mechanism may also increase in size. In certain embodiments, it is desirable to increase the size of an actuator 550 to increase the force provided thereby. In certain embodiments, it is desirable to also increase the size of the motion control mechanism to maintain its ability to desirably limit movement of the platform 520. The movable frame 550 may be considered as a portion of the motion control mechanism.

Figure 6B:
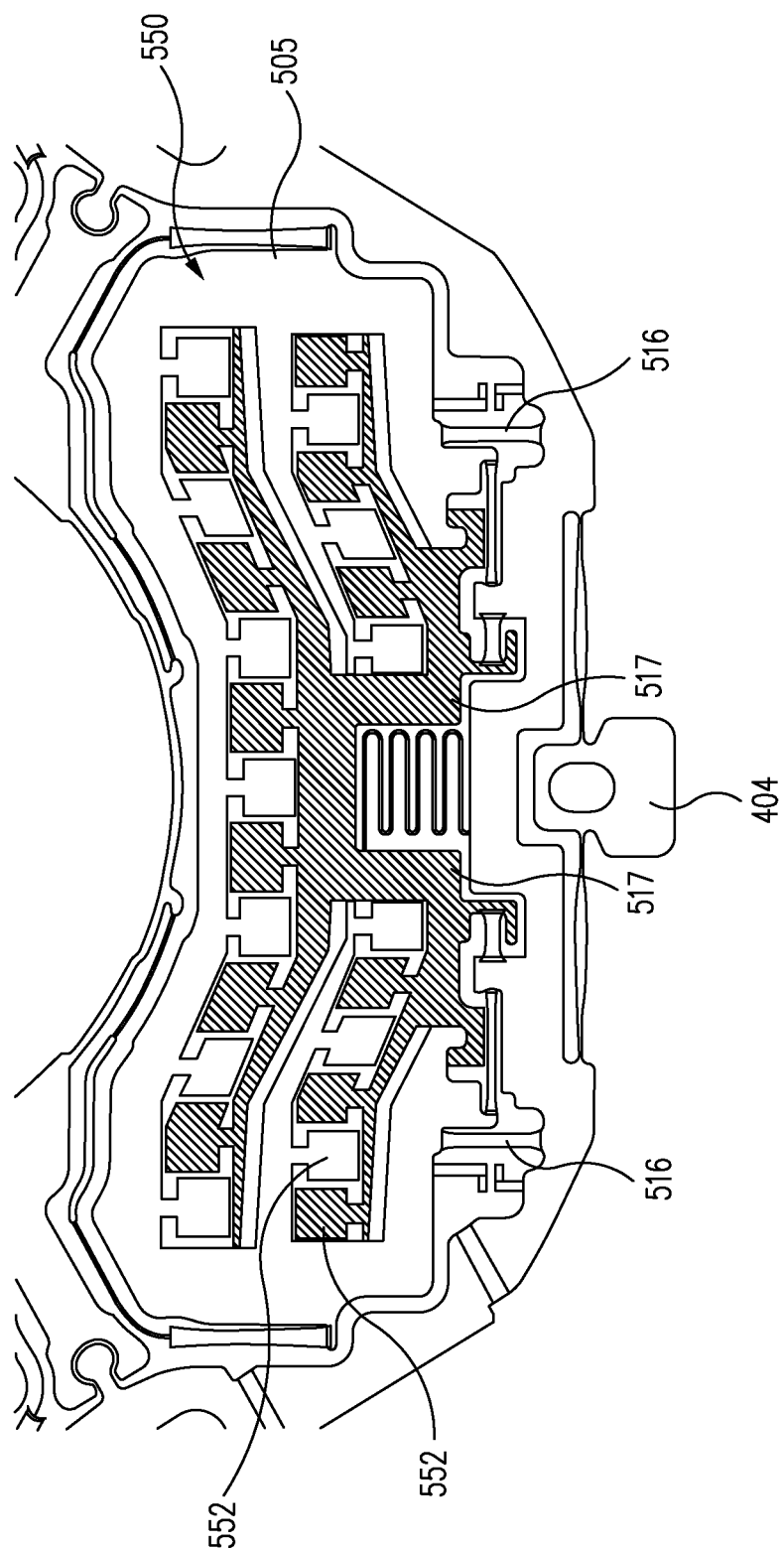
FIG. 6B illustrates a portion of the actuator device, in accordance with an embodiment.

FIG. 6B illustrates the actuator 550 showing the fixed frame 517 shaded for clarity, in accordance with an embodiment. The shaded fixed frame 517 may be deployed to a position out-of-plane of the actuator device 400 and may be fixed in this deployed position.

Figure 7:
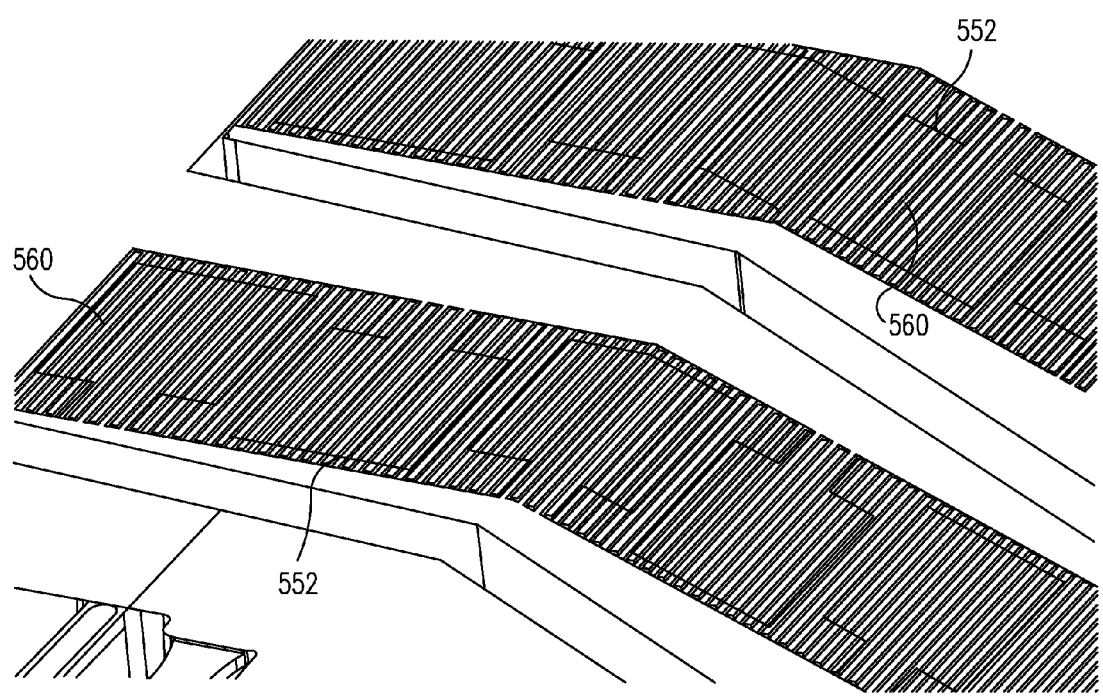
FIG. 7 illustrates portions of the actuator device, in accordance with an embodiment.

The movable frame 505 may support moving portions of the actuator 550, such as some of the teeth 560 (see FIG. 7). The fixed frame 517 may support fixed portions of the actuator 550, such as others of the teeth 560 (see FIG. 7). The application of a voltage to the actuator 550 may cause the movable frame 505 to rotate about the outer hinge flexures 516 toward the fixed frame 517. Removal or reduction of the voltage may permit a spring force applied by the inner hinge flexures 514, the outer hinge flexures 516 and the motion control torsional flexure 515 to rotate the movable frame 505 away from the fixed frame 517. Sufficient clearance between the movable frame 505 and the fixed frame 517 may be provided to accommodate such desired movement.

Figure 6C:
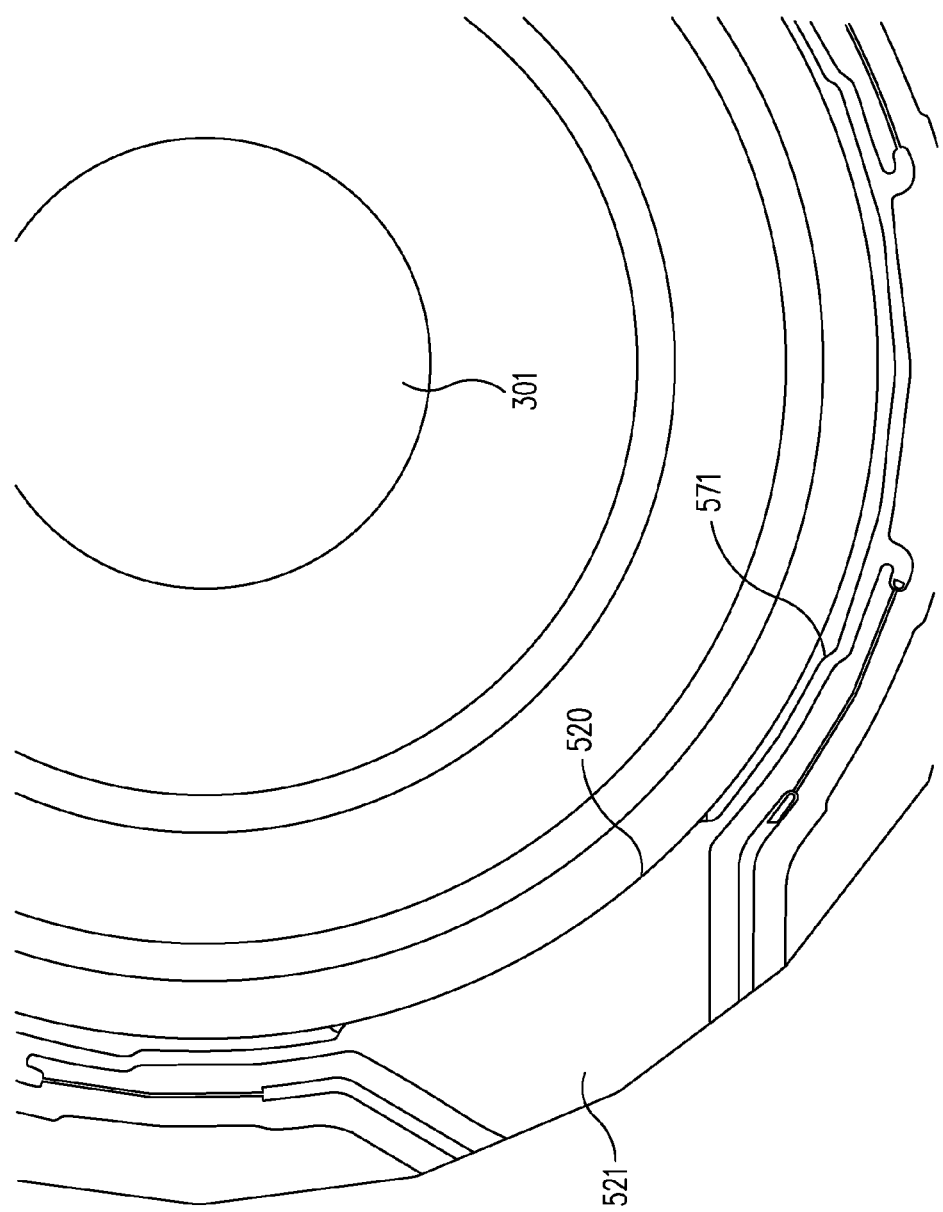
FIG. 6C illustrates a portion of a platform, in accordance with an embodiment.

FIG. 6C illustrates a portion of the platform 520 having radial variations 571, in accordance with an embodiment. In one embodiment, the radial variations 571 may be formed in the platform 520 to permit the platform 520 to expand. The radial variations 571 may be angular bends in the platform 520. Thus, an optical element such as the movable lens 301 may be inserted into the opening 405 of the platform 520, which may expand to receive the movable lens 301 and which may grip the movable lens 301. The opening 405 may expand as the radial variations 571 of the platform 520 deform (e.g., tend to straighten), so as to increase the circumference of the opening 405.

Figure 6D:
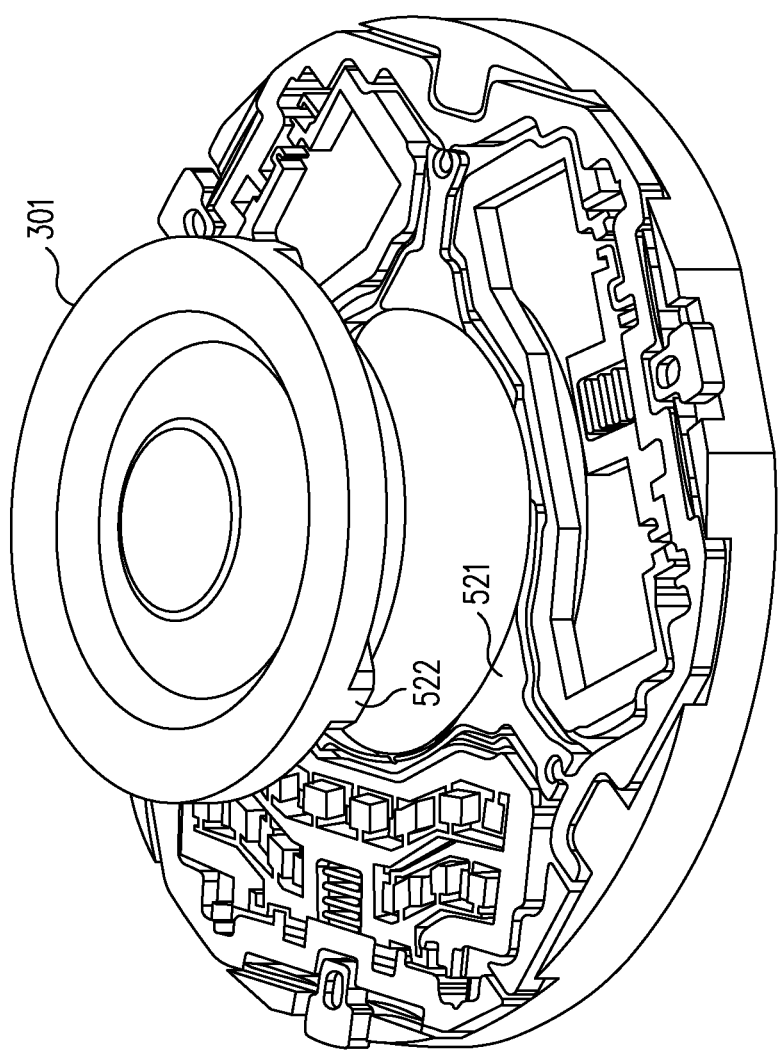
FIG. 6D illustrates a bottom view of a movable lens positioned for mounting to the actuator device, in accordance with an embodiment.
Figure 6E:
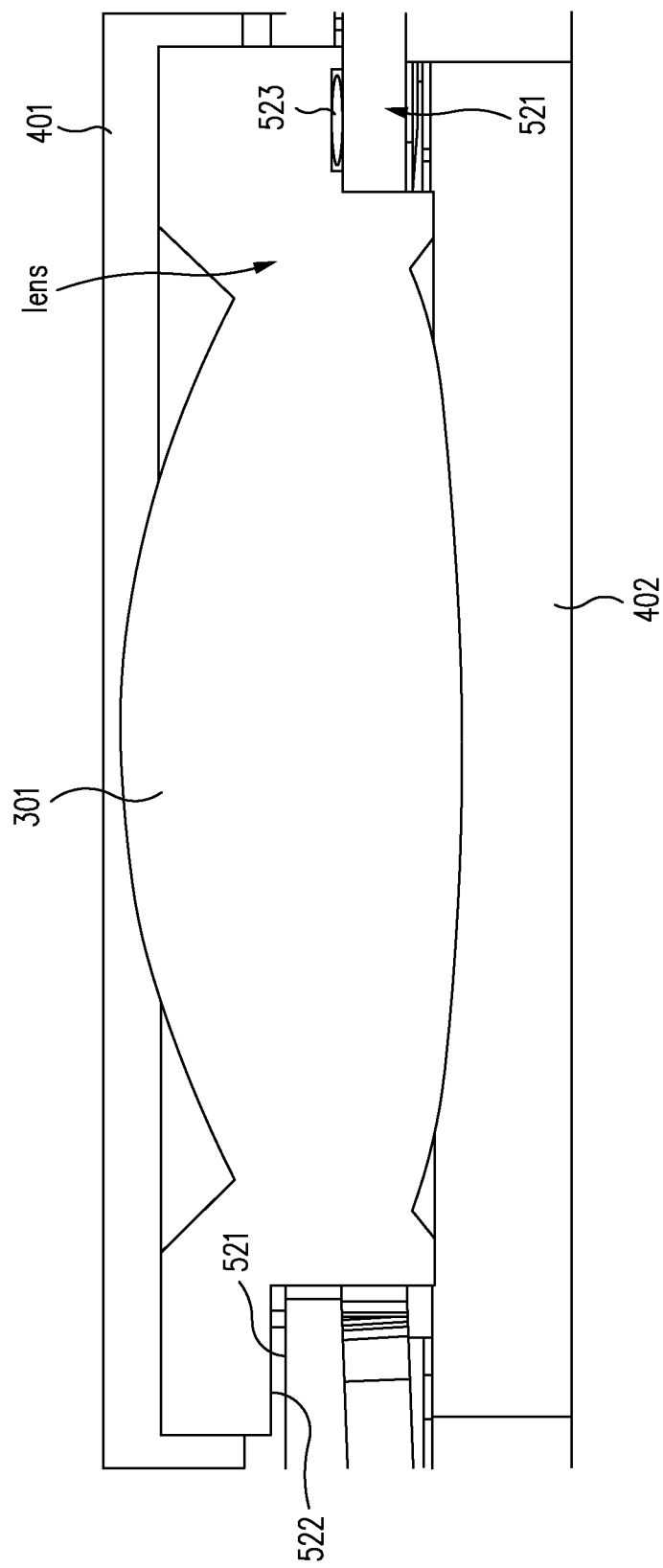
FIG. 6E illustrates a side view of the movable lens mounted to the actuator device, in accordance with an embodiment.

FIG. 6D illustrates a perspective view of a movable lens positioned for mounting to the actuator device 400 and FIG. 6E illustrates a side view of the movable lens 301 attached to the actuator device 400, in accordance with an embodiment. In one embodiment, the movable lens 301 may be adhesively bonded to the platform 550, such as by adhesively bonding standoffs 522 of the movable lens 301 to the lens pads 521. For example, epoxy 523 may be used to adhesively bond the movable lens 301 to the platform 520. The movable lens 301 may be supported by the lens pad 521.

FIG. 7 illustrates a portion of the actuator 550 showing blocks 552 superimposed over the teeth 560 of an actuator 550, in accordance with an embodiment. As discussed herein, the blocks 552 are representative of the teeth 560.

Figure 8:
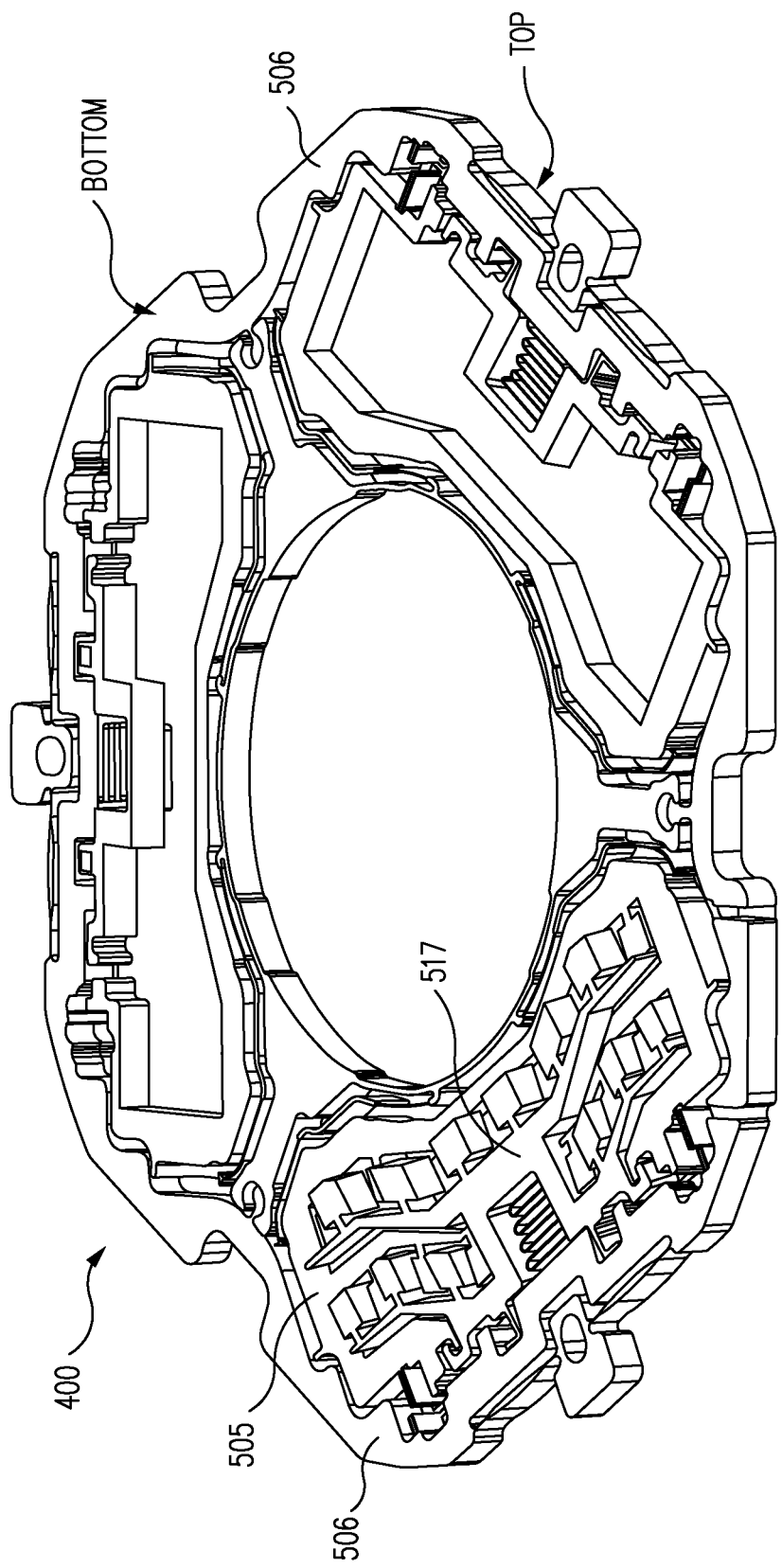
FIG. 8 illustrates a bottom view of the actuator device in a deployed configuration, in accordance with an embodiment.

FIG. 8 illustrates a bottom perspective view of the actuator device 400 in a deployed configuration, in accordance with an embodiment. In the deployed configuration the unactuated movable frame 505 is substantially in-plane with respect to the outer frame 506 and the deployed fixed frame 517 is substantially out-of-plane with respect to the outer frame 506 and the movable frame 505.

A voltage may be applied to each actuator 550 via the electrical contacts 404. For example, two of the three contacts 404 may be used to apply a voltage from the lens barrel 200 to the actuator device 400. The third contact 404 may be unused or may be used to redundantly apply one polarity of the voltage from the lens barrel 200 to the actuator device 400.

Substantially the same voltage may be applied to the three actuators 550 to result in substantially the same movement of the moving frames 505 thereof. Application of substantially the same voltage to the three actuators 550 may result in translation of the platform 520 with respect to the outer frame 506 such that the platform 520 remains substantially parallel to the outer frame 506. Thus, an optical element such as the movable lens 301 may be maintained in a desired alignment as the optical element is moved, such as along an optical axis 410 (FIG. 3B) thereof.

Substantially different voltages may be applied to the three actuators 550 to result in substantially different movements of the moving frames 505 thereof. Substantially different voltages may be applied to the three actuators 550 using the three contacts 404 and a common return. Thus, each contact 404 may apply a separately controlled voltage to a dedicated one of the three actuators 550.

The application of substantially different voltages to the three actuators 550 may result in translation of the platform 520 with respect to the outer frame 506 such that the platform tilts substantially with respect to the outer frame 506. Thus, when substantially different voltages are applied, the platform 520 does not necessarily remain substantially parallel to the outer frame. The application of different voltages to the three actuators 550 may be used to align the platform 520 to the outer frame 506, for example. The application of different voltages to the three actuators 550 may be used to facilitate optical image stabilization or lens alignment, for example.

Figure 9A:
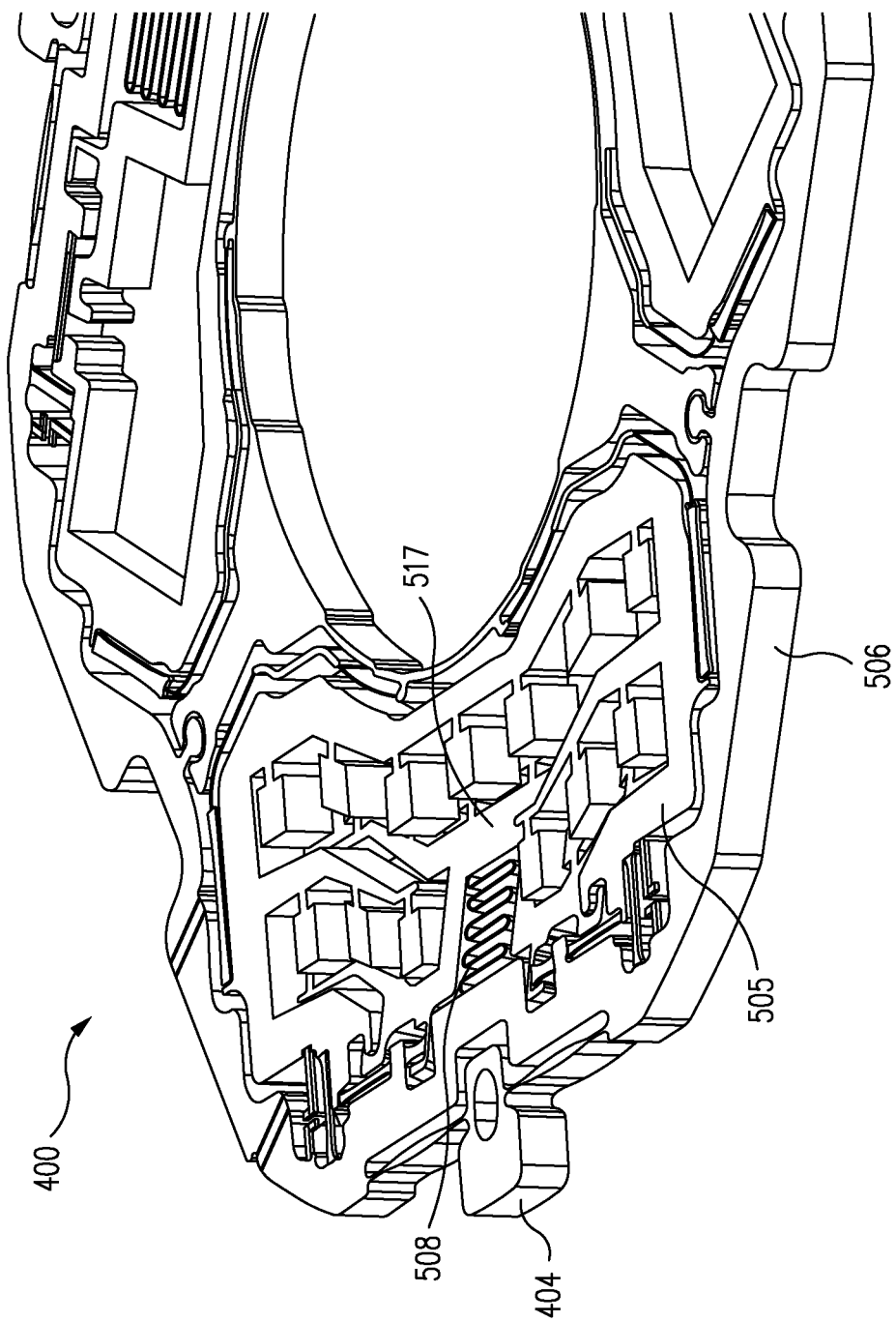
FIG. 9A illustrates a portion of the actuator device in a deployed configuration without any voltage applied thereto, in accordance with an embodiment.

FIG. 9A illustrates a portion of the actuator device 400 in a deployed configuration without any voltage applied thereto, in accordance with an embodiment. Without any voltage applied to the actuator device 400, the movable frame 505 is substantially in-plane with respect to the outer frame 506 and the deployed fixed frame 517 is substantially out-of-plane with respect to the outer frame 506 and the movable frame 505.

FIG. 9B illustrates a portion of the actuator device 400 in a deployed configuration with a small voltage applied thereto, in accordance with an embodiment. With the small voltage applied, the movable frame 505 has rotated toward the deployed fixed frame 517 and is in a partially actuated position.

Figure 9C:
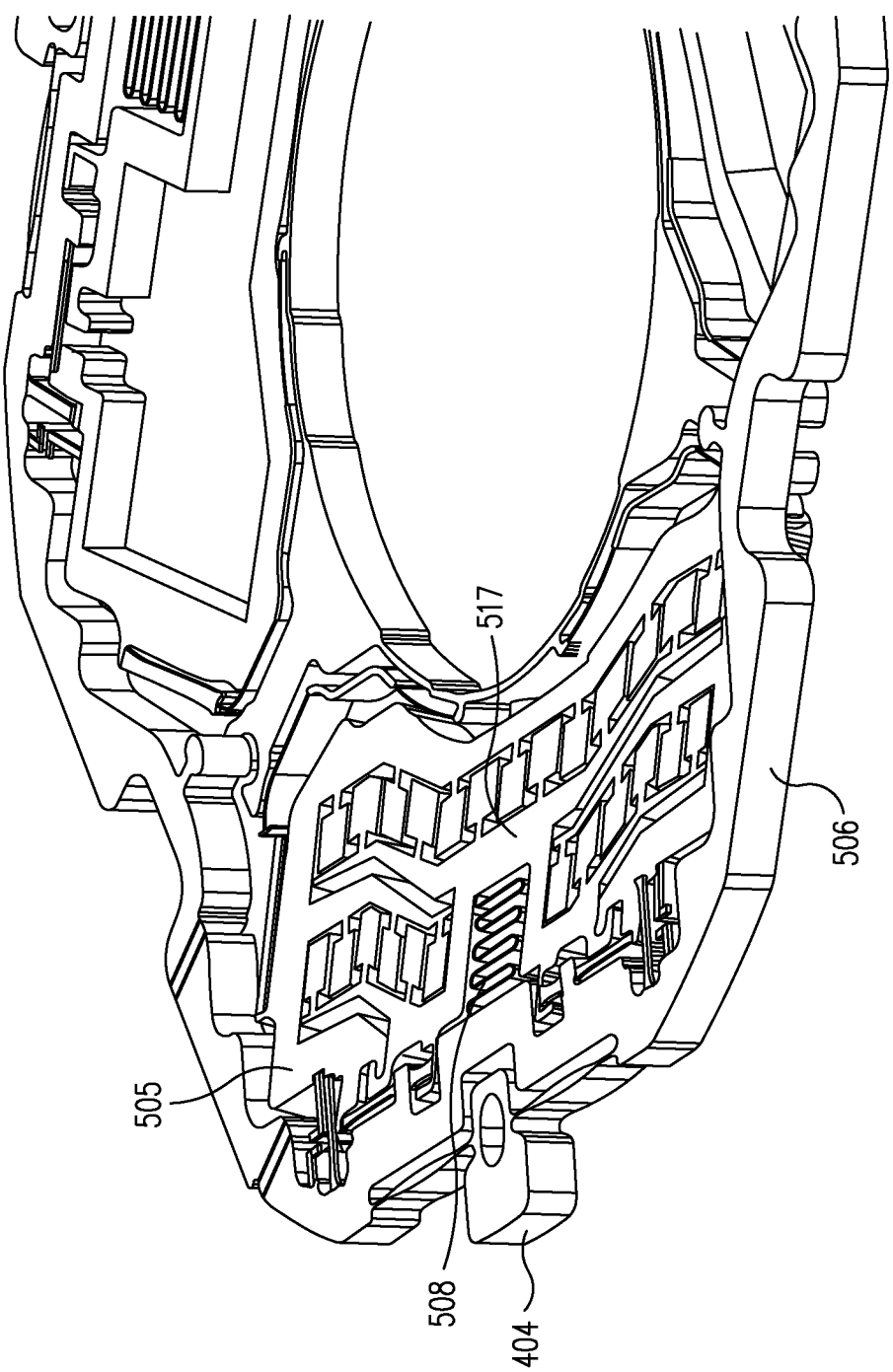
FIG. 9C illustrates a portion of the actuator device in a deployed configuration with a maximum voltage applied thereto, in accordance with an embodiment.

FIG. 9C illustrates a portion of the actuator device 400 in a deployed configuration with a maximum voltage applied thereto, in accordance with an embodiment. As may be seen, the movable frame 505 has rotated further toward the deployed fixed frame 517 and is in a fully actuated position.

Figure 10:
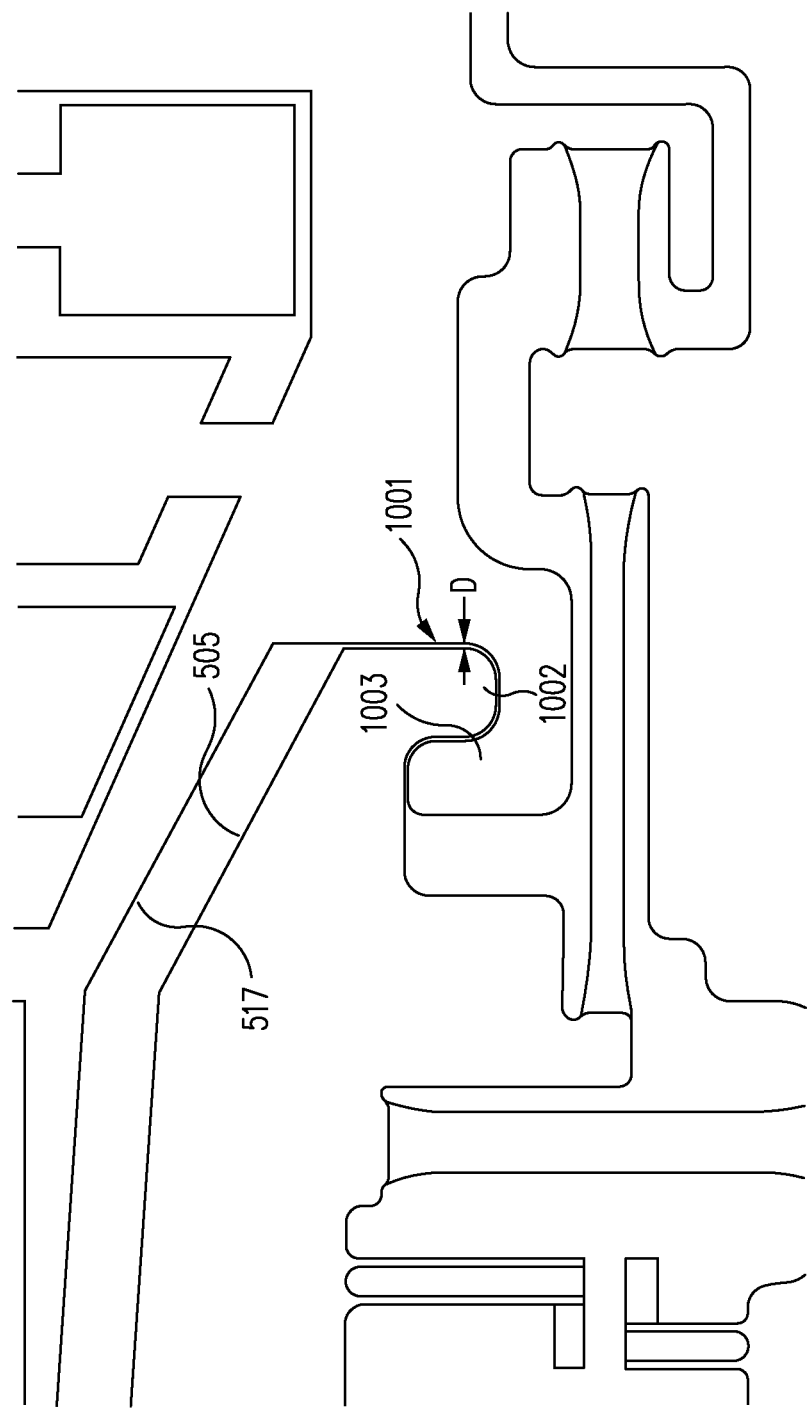
FIG. 10 illustrates a lateral snubber assembly, in accordance with an embodiment.

FIG. 10 illustrates a top view of a lateral snubber assembly 1001, in accordance with an embodiment. The lateral snubber assembly 1001 may have a first snubber member 1002 and a second snubber member 1003. The first snubber member 1002 may be formed upon the fixed frame 517 and the second snubber member may be formed upon the movable frame 505. The first snubber member 1002 and the second snubber member 1003 may cooperate to inhibit undesirable lateral motion of the movable frame 505 with respect to the fixed frame 517 (and consequently with respect to the outer frame 506, as well) during shock or large accelerations. A gap "D" between the first snubber member 1002 and the second snubber member 1003 may approximately 2-3 micrometers wide to limit such undesirable lateral motion.

Figure 11:
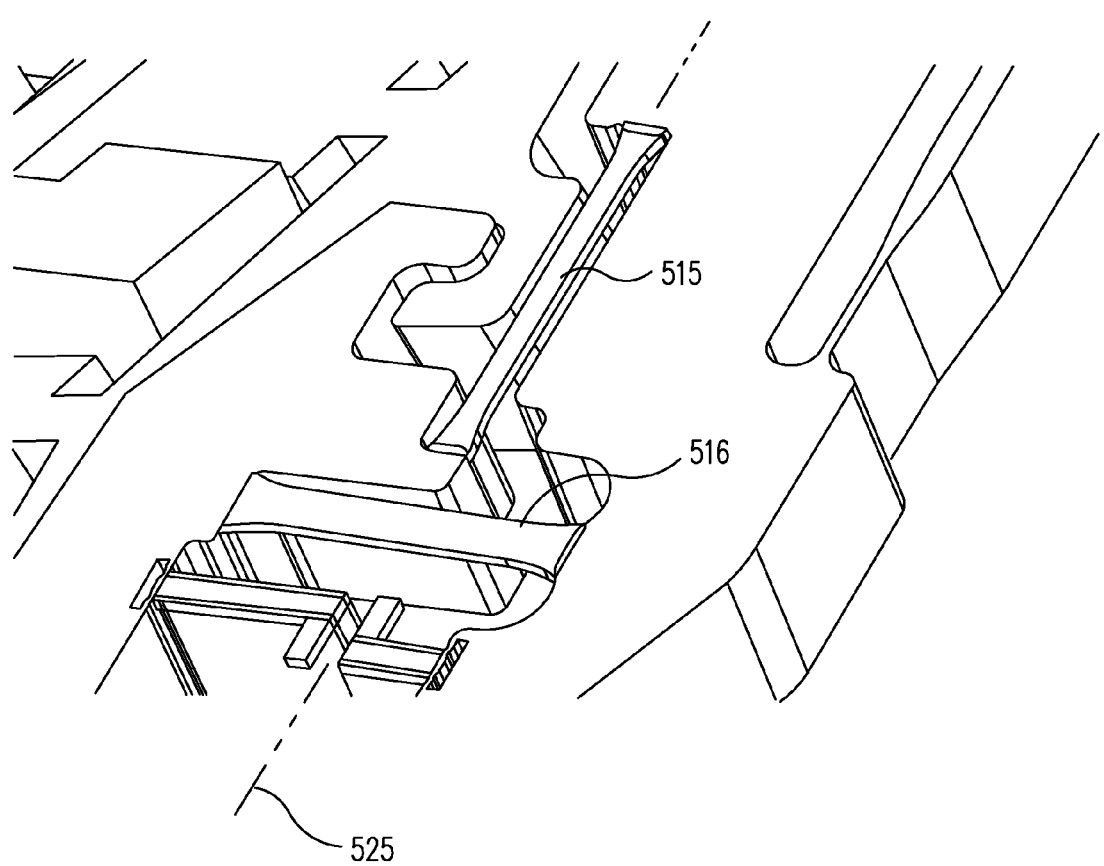
FIG. 11 illustrates a hinge flexure and a motion control torsional flexure, in accordance with an embodiment.

FIG. 11 illustrates a perspective view of the motion control torsional flexure 515 and the outer hinge flexure 516, in accordance with an embodiment. The motion control torsional flexure 515 and the outer hinge flexure 516 may be thinner than other portions of the actuator device 400 to provide the desired stiffness of the motion control torsional flexure 515 and the outer hinge flexure 516. For example, in one embodiment the outer hinge flexures 516, the inner hinge flexures 501, and the motion control torsional flexures 515 may have a width of approximately 100 microns and a thickness of approximately 2-3 microns.

The motion control torsional flexure 515 may be located on the pivot axis 525. In one embodiment, the pivot axis 525 is a line that connects the centers of the two outer hinge flexures 516. In one embodiment, the pivot axis 525 is the hinge line or axis about which the movable frame 506 rotates.

Figure 12:
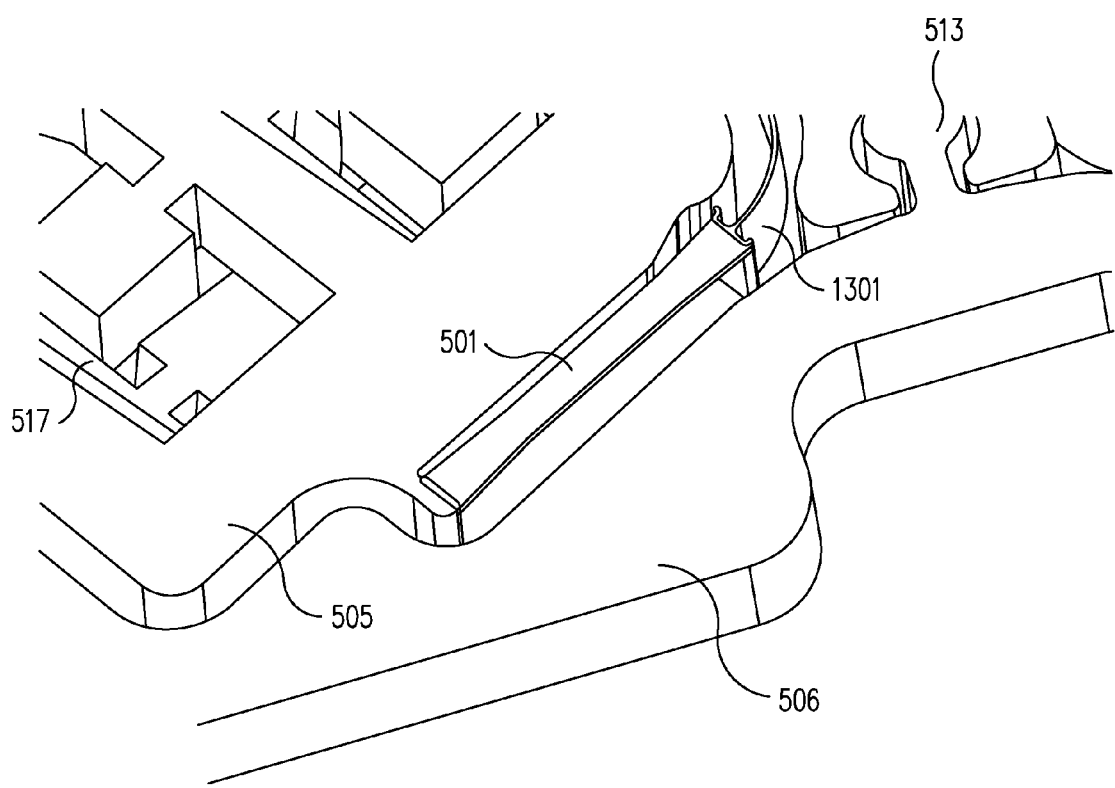
FIG. 12 illustrates an inner motion control hinge, in accordance with an embodiment.

FIG. 12 illustrates a perspective view of an inner hinge flexure 501, in accordance with an embodiment. The inner hinge flexure 501 may be thinner than other portions of the actuator device 400 to provide the desired stiffness of the inner hinge flexure 501. For example, in one embodiment, the inner hinge flexure 501 may be approximately 500 micrometers long, 60 micrometers wide, and 2-3 micrometers thick.

Figure 13:
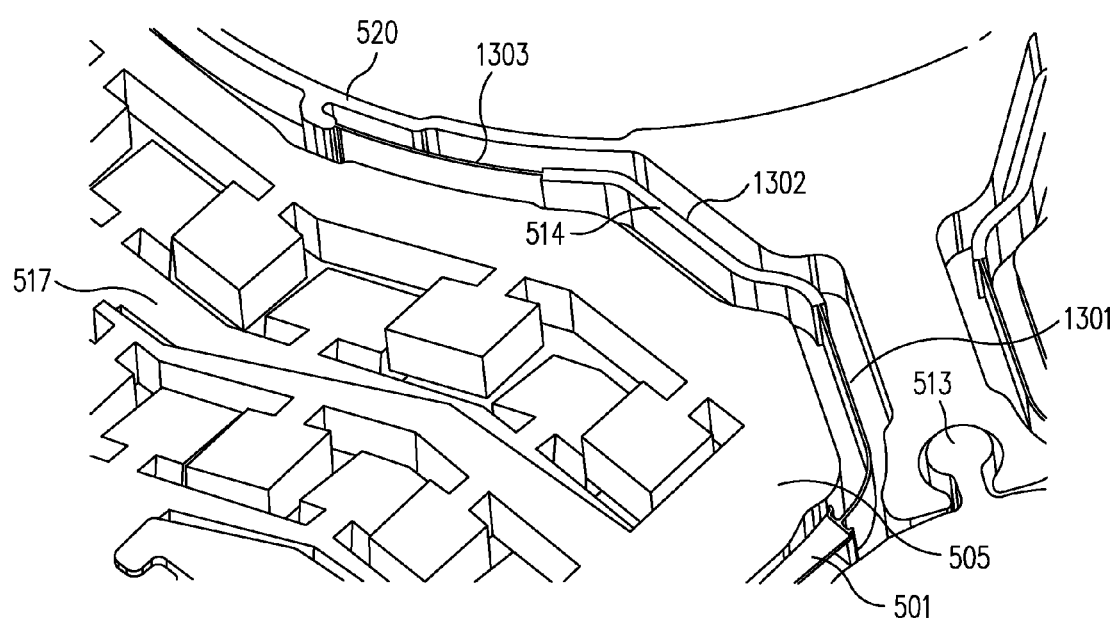
FIG. 13 illustrates a cantilever flexure, in accordance with an embodiment.

FIG. 13 illustrates a perspective view of a cantilever flexure 514 having the inner hinge flexure 501, a first thinned section 1301, a thicker section 1302, and a second thinned section 1303, in accordance with an embodiment. The cantilever flexure 514 may be used to transfer movement of the movable frames 505 to the platform 520. The cantilever flexure 514 may be used to facilitate the conversion of rotation of the movable frames 505 into translation of the platform 520.

The inner hinge flexure 501 may bend to permit the movable frame 505 to rotate while the platform 520 translates. The first thinned section 1301 and the second thinned section 1303 may bend to permit a change in distance between the movable frame 505 and the platform 520 as the movable frame 505 transfers movement to the platform 520.

The cantilever flexure 514 may be thinner proximate the ends thereof and may be thicker proximate the center thereof. Such configuration may determine a desired ratio of stiffnesses for the cantilever flexure 514. For example, it may be desirable to have a comparatively low stiffness radially to compensate for the change in distance between the movable frames 505 and the platform 520 as the movable frame 505 transfers movement to the platform 520.

Figure 14:
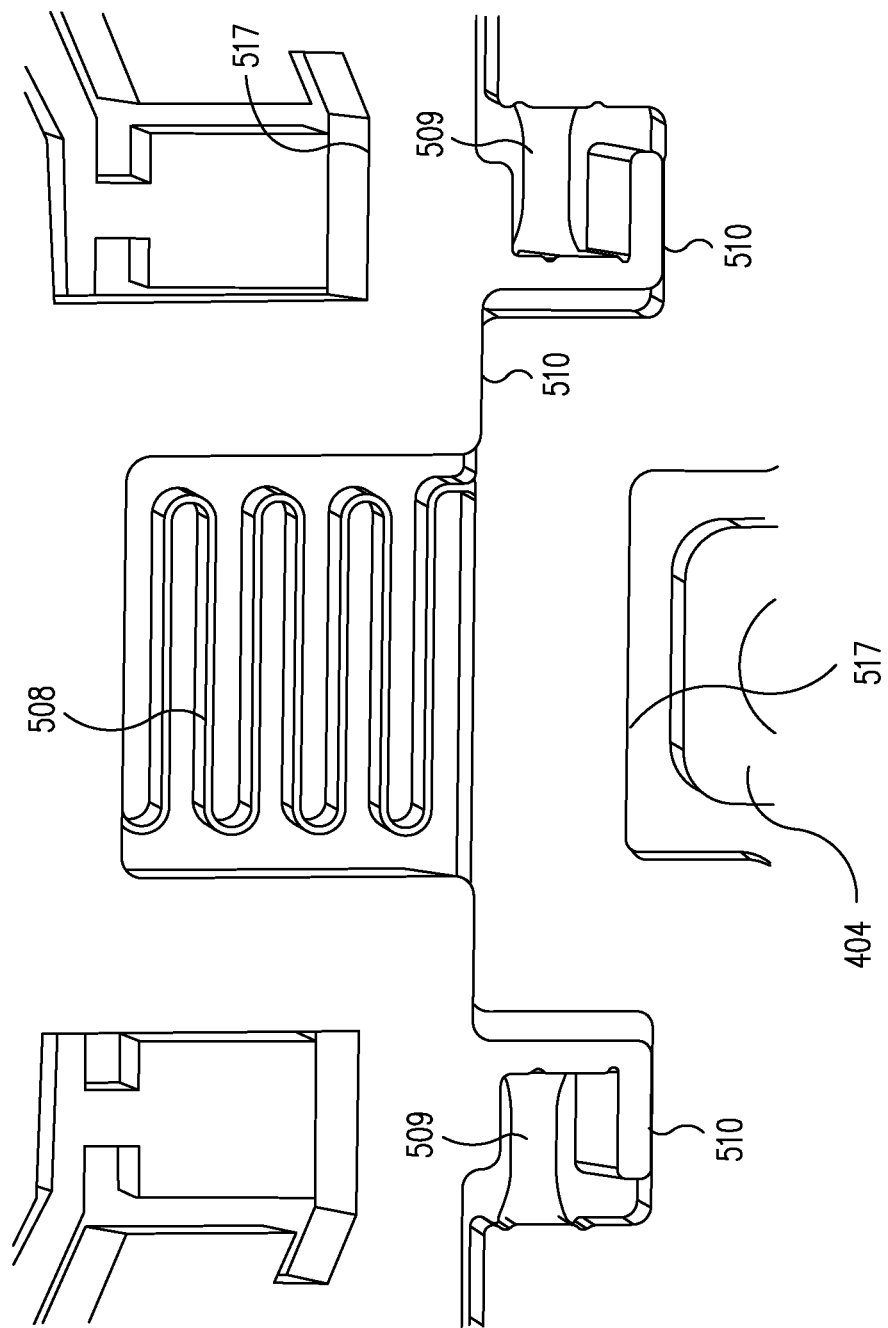
FIG. 14 illustrates a serpentine contact flexure and a deployment torsional flexure, in accordance with an embodiment.

FIG. 14 illustrates a perspective view of the serpentine contact flexure 508 and the deployment torsional flexure 509, in accordance with an embodiment. The serpentine contact flexure 508 may facilitate electrical contact between the electrical contacts 404 and the deployed fixed frame. The deployment torsional flexures 509 may facilitate rotation of the deployed fixed frame 517 with respect to the outer frame 506 during deployment.

Figure 15:
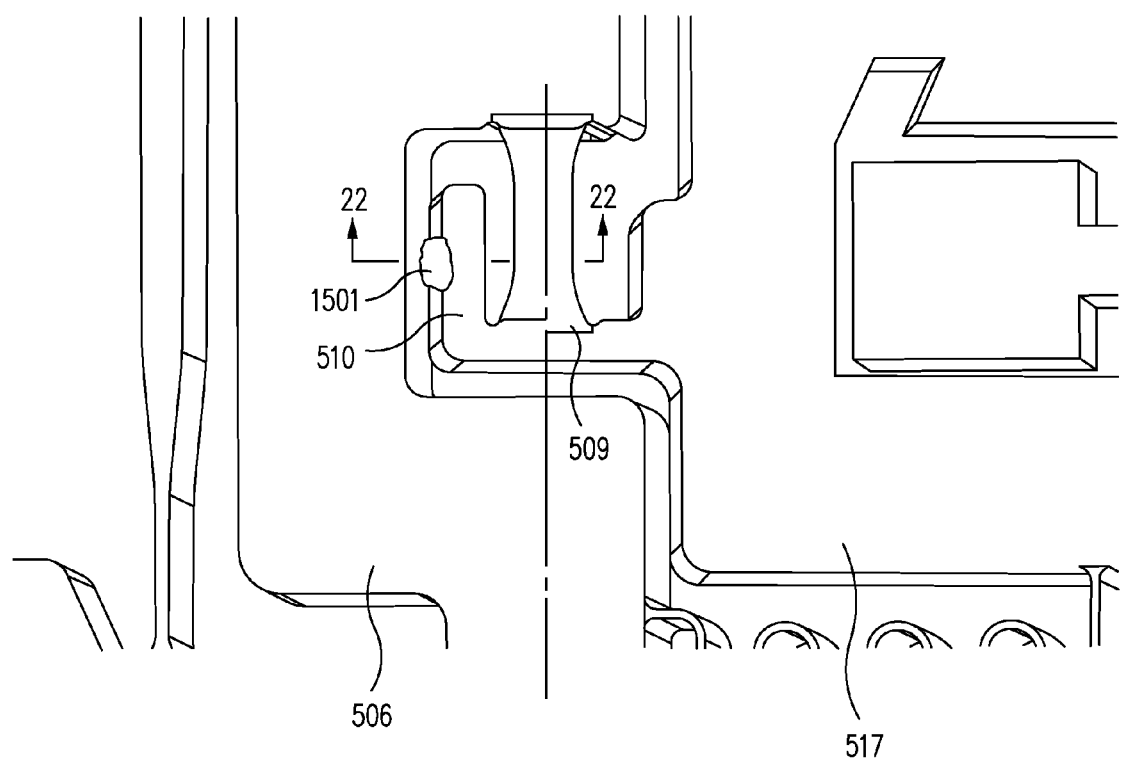
FIG. 15 illustrates a top view of a deployment stop, in accordance with an embodiment.

FIG. 15 illustrates a perspective top view of a deployment stop 510 showing that it does not contact an outer frame 506 on the top side when deployed, in accordance with an embodiment. An epoxy 1501 may be applied to the top surfaces of the deployment stop 510 and the outer frame 506 to fix the deployment stop 510 into position with respect to the outer frame 506. Thus, the epoxy 1501 may fix the deployed fixed frame 517 into position with respect to the outer frame 506. Various portions of the deployed fixed frame 517 may function as the deployment stops 517. For example, other portions of the deployed fixed frame 517 that abut the outer frame 506 when the deployed fixed frame is deployed may function as the deployment stops 510.

Figure 16:
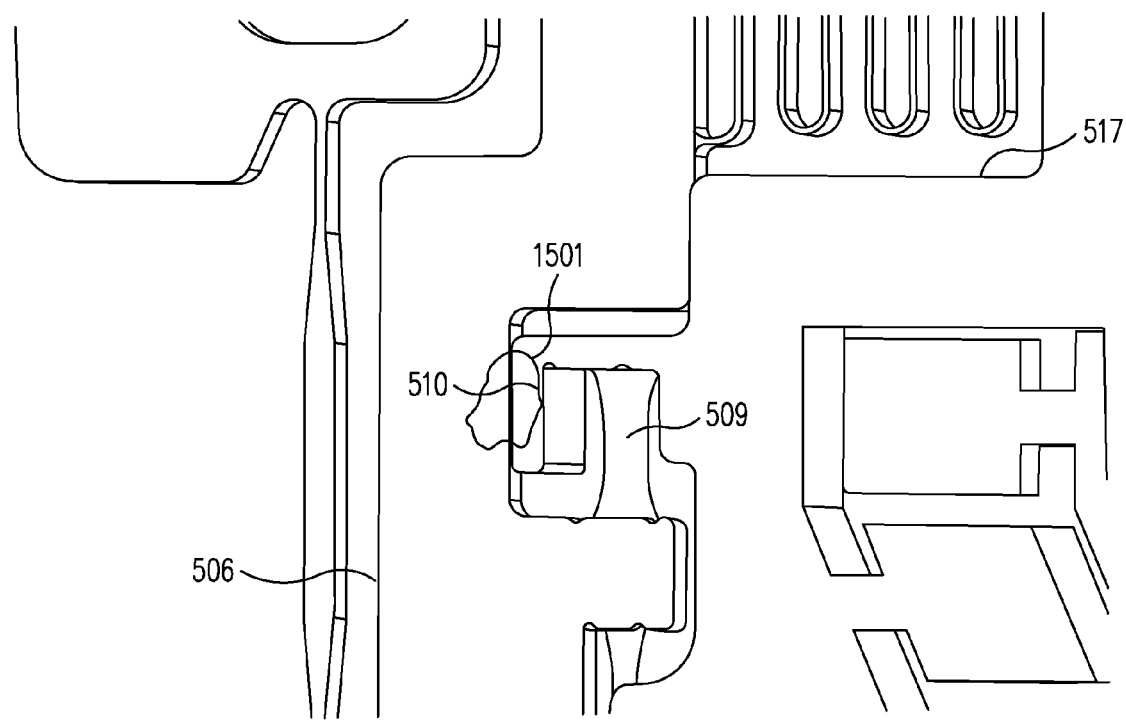
FIG. 16 illustrates a bottom view of the deployment stop, in accordance with an embodiment.

FIG. 16 illustrates a perspective bottom view of the deployment stop 510 showing that it contacts the outer frame 506 on the bottom side when deployed, in accordance with an embodiment. The epoxy 1501 may be applied to the bottom surfaces of the deployment stop 510 and the outer frame 506 to fix the deployment stop 510 into position with respect to the outer frame 506. The epoxy 1501 may be applied to both the top surfaces and the bottom surfaces of the deployment stop 510 and the outer frame 506, if desired.

Figure 17A:
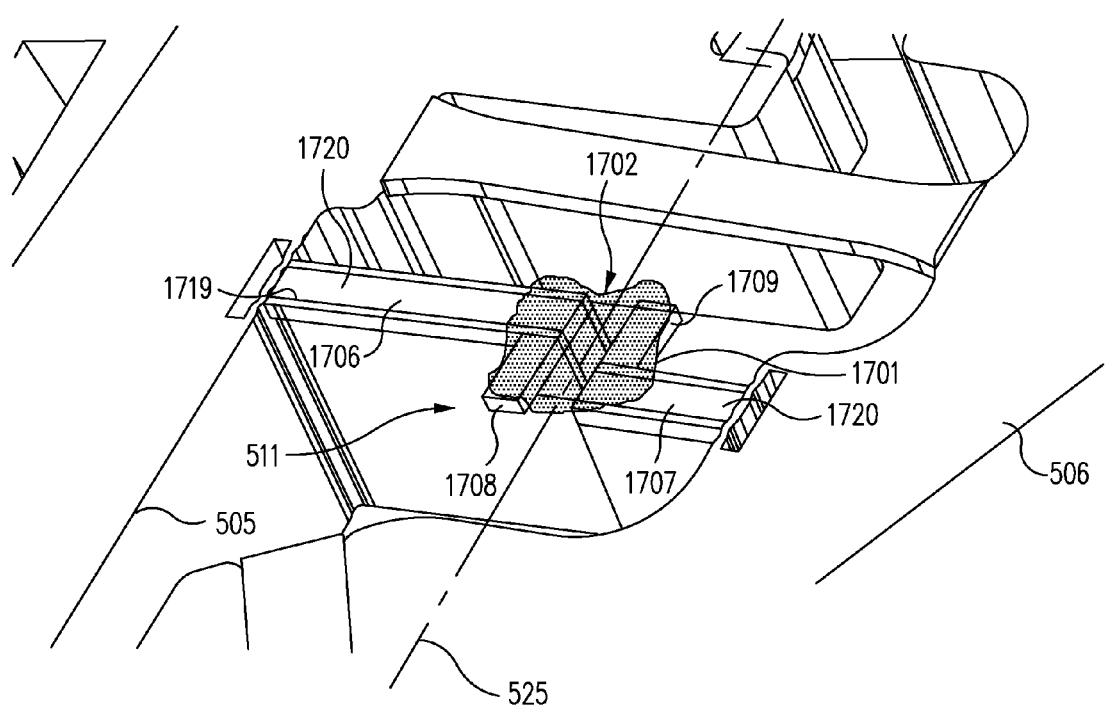
FIG. 17A illustrates a flap damper, in accordance with an embodiment.

FIG. 17A illustrates a perspective view of a flap damper 511, in accordance with an embodiment. The flap damper 511 is located where the desirable relative motion during intended operation, (e.g., actuation) of actuators 550, is comparatively low and where the potential undesirable relative motion during shock is comparatively high. For example, the flap damper 511 may be formed on the pivot axis 525.

A damping material 1701 may extend across a gap 1702 formed between the outer frame 506 and the movable frame 505. The damping material 1701 may have a high damping coefficient. For example, in one embodiment, the damping material 1701 may have a damping coefficient of between 0.7 and 0.9. For example, the damping material 1701 may have a damping coefficient of approximately 0.8. In one embodiment, the damping material 1701 may be an epoxy.

The damping material 1701 may readily permit the desired motion of the movable frame 505 relative to the outer frame 506. The damping material 1701 may inhibit undesired motion of the movable frame 505 relative to the outer frame 506 due to a shock. Thus, the damping material 1701 may permit rotation of the movable frame 505 relative to the outer frame 506 during actuation of the actuators 550 and may inhibit lateral motion and/or out of plane motion of the movable frame 505 relative to the outer frame 506 during a shock.

The flap damper 511 may have a flap 1706 that extends from the movable frame 505 and may have a flap 1707 that extends from the outer frame 506. A gap 1702 may be formed between the flap 1706 and the flap 1707.

An extension 1708 may extend from the flap 1706 and/or an extension 1709 may extend from the flap 1707. The extension 1708 and the extension 1709 may extend the length of the gap 1702 such that more damping material 1701 may be used than would be possible without the extension 1708 and/or the extension 1709.

Trenches 1719 may be formed in flaps 1706 and/or 1707 and a trench material 1720 that is different from the material of the flaps 1706 and 1707 may be deposited within the trenches 1719. For example, the flaps 1706 and 1707 may be formed of single crystalline silicon and the trench material 1720 may be formed of polycrystalline silicon. Any desired combination of materials may be used for the flaps 1706 and 1707 and for the trench material 1720, so as to achieve the desired stiffness of the flaps 1706 and 1707.

Figure 17B:
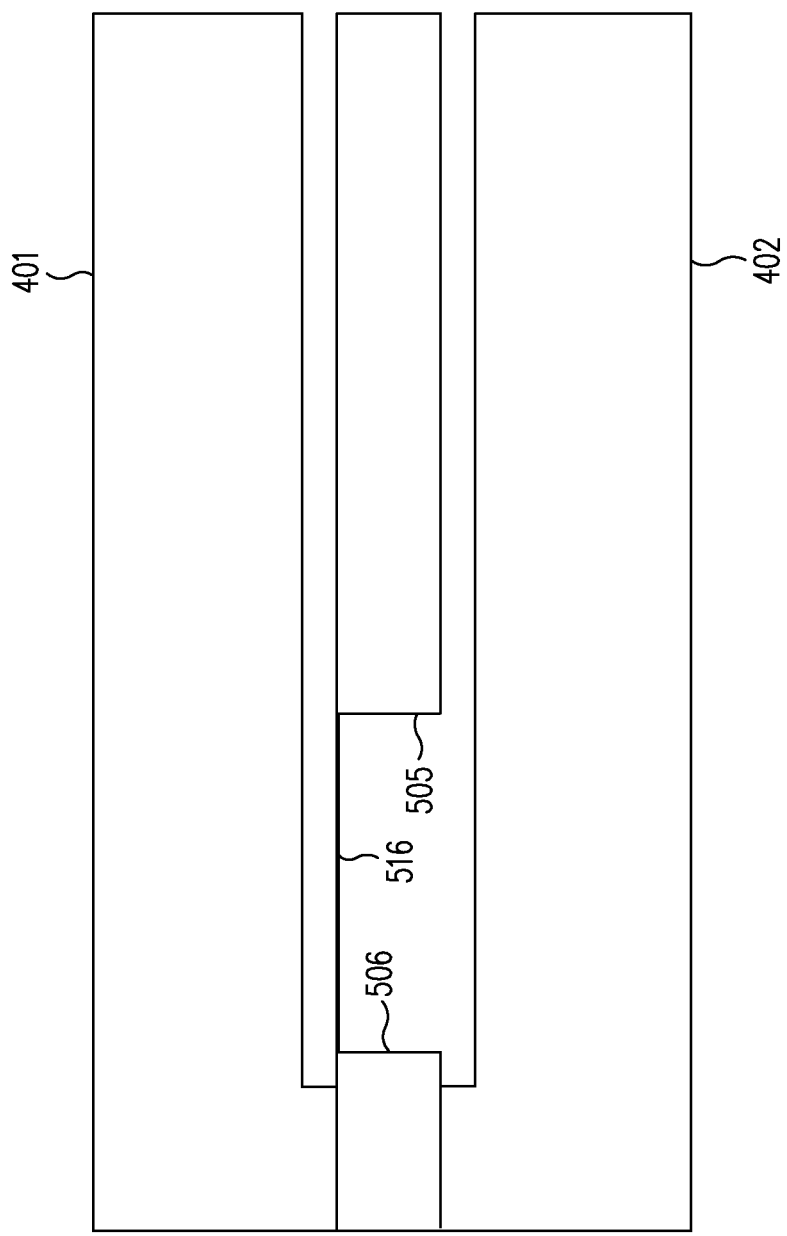
FIG. 17B illustrates a movable frame disposed between an upper module cover and a lower module cover with no shock applied, in accordance with an embodiment.

FIG. 17B illustrates the movable frame 505 disposed between the upper module cover 401 and the lower module cover 402 without a shock being applied thereto. In the absence of a shock, the movable frame 505 remains in its unactuated position and the outer hinge flexure 516 is unbent.

Figure 17C:
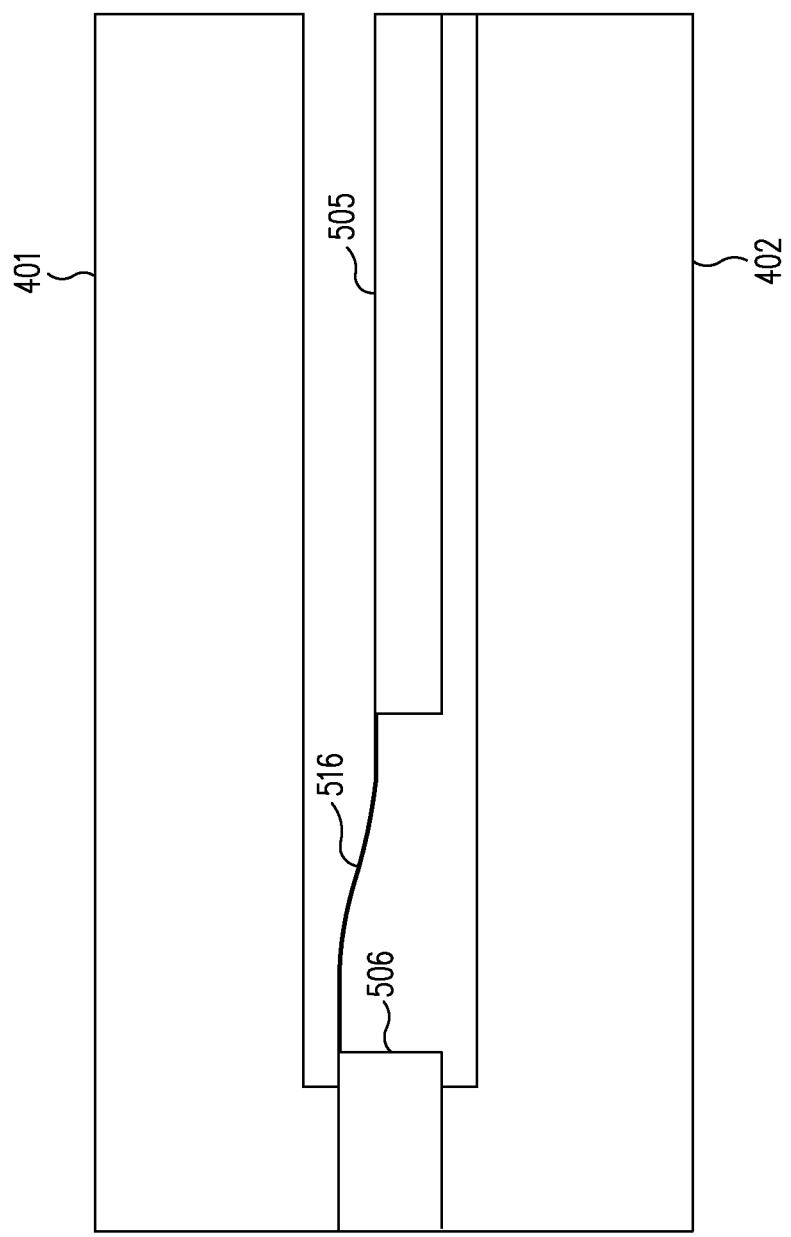
FIG. 17C illustrates the movable frame disposed between the upper module cover and the lower module cover with a shock applied, in accordance with an embodiment.

FIG. 17C illustrates the movable frame 505 after it has been moved to a position against the lower module cover 402 by a shock, such as may be caused by dropping the electronic device 100. Movement of the movable frame 505 may be limited or snubbed by the lower module housing 402 and undesirable double bending of the outer hinge flexure 516 may be limited thereby. In a similar fashion, the upper module housing 401 may limit movement of the movable frame 505 and double bending of the outer hinge flexure 516. Thus, undesirable stress within the outer hinge flexures 516 may be mitigated.

FIGS. 17D-17H illustrate an alternative embodiment of an outer hinge flexure 1752. As illustrated in these figures, in some embodiments, the outer hinge flexures 1752 may be X-shaped for increased control of the motion of the moveable frame 505 in the lateral direction. The outer hinge flexures 516, 1752 may generally tend to bend, such as about a central portion thereof, to facilitate movement of the moveable frame 505 with respect to the outer frame 506. Other shapes are contemplated. For example, the outer hinge flexure 1752 can be shaped like a H, I, M, N, V, W, Y, or may have any other desired shape. Each outer hinge flexure 1752 can comprise any desired number of structures that interconnect the outer frame 506 and the movable frame 505. The structures may be interconnected or may not be interconnected. The structures may be substantially identical with respect to one another or may be substantially different with respect to one another. Each outer hinge flexure 1752 may be substantially identical with respect to each other hinge flexure 1752 or may be substantially different with respect thereto.

The outer hinge flexures 516, 1752 and any other structures may be formed by etching as discussed herein. The outer hinge flexure and any outer structures may comprise single crystalline silicon, polycrystalline silicon, or any combination thereof.

FIGS. 17D-F and 17I-17N show an alternative embodiment of the lateral snubber assembly 1754, another embodiment of which is discussed above in connection with FIG. 10 herein. The lateral snubber assembly 1754 of FIGS. 17D-F and 17I-17N generally has more rounded curves with respect to the lateral snubber assembly 1001 of FIG. 10.

FIGS. 17D-17F and 17K-17N illustrate an example embodiment of an interlocking snubber flaps feature 1756 useful for constraining both vertical movement of a component, e.g., moveable component 505, in the ±Z directions, as well as lateral movement thereof, i.e., in the ±X and/or ±Y directions. As may be seen in the cross-sectional views of FIGS. 17K, 17L and 17N, the structure of and methods for forming the interlocking flaps feature 1756 are similar to those of the interlocking flaps feature 5000 discussed in detail below in connection with FIGS. 49-53.

Figure 17D:
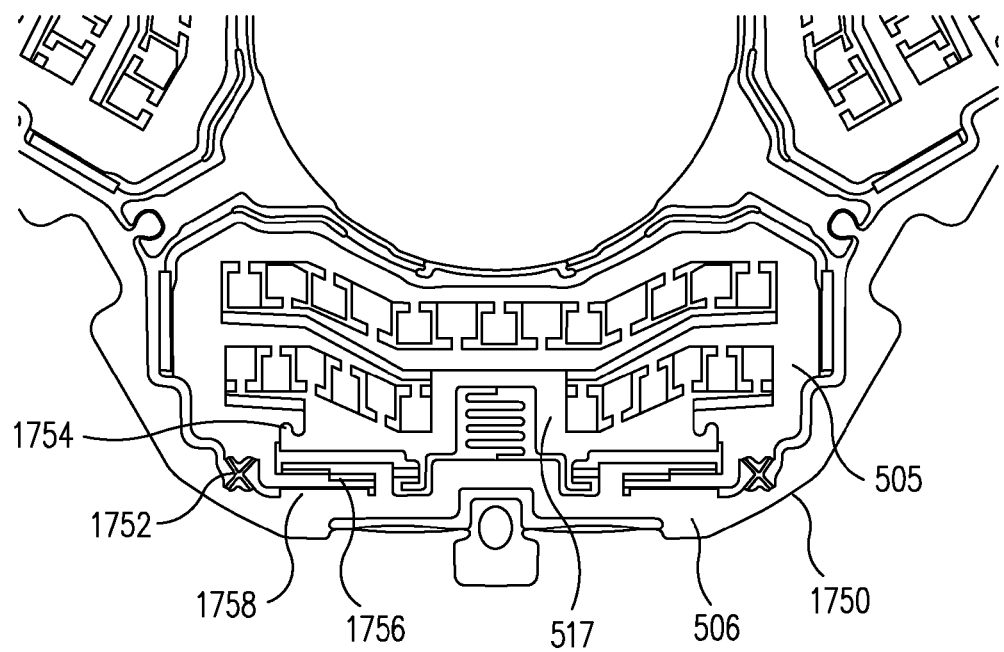
FIG. 17D illustrates a partial top view of another actuator device, in accordance with an embodiment.
Figure 17E:
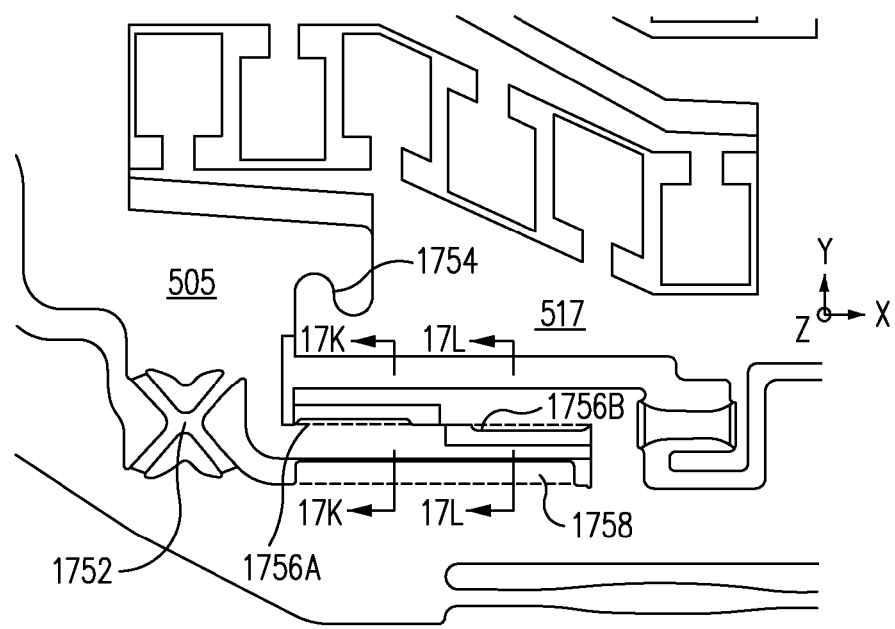
FIG. 17E illustrates an enlarged top view of the actuator device, in accordance with an embodiment.
Figure 17F:
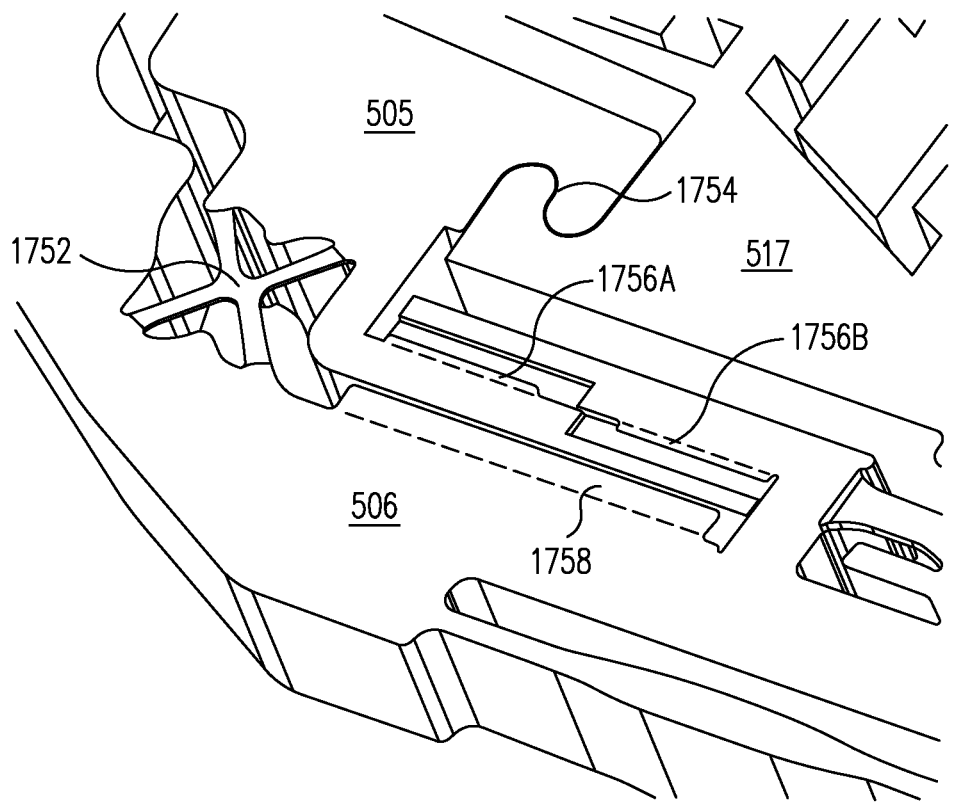
FIG. 17F illustrates an outer hinge flexure, a lateral snubber assembly, a single snubber flap and an interlocking snubber flaps feature of the actuator device, in accordance with an embodiment.
Figure 17G:
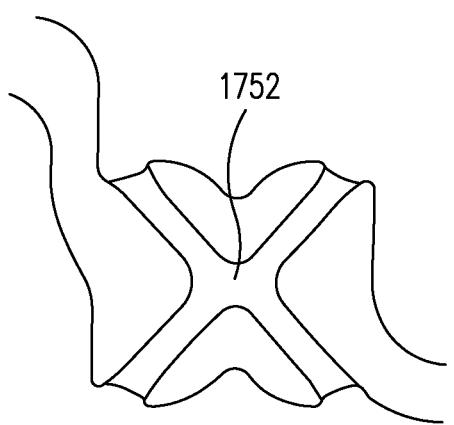
FIGS. 17G and 17H illustrate the outer hinge flexure, in accordance with an embodiment.
Figure 17H:
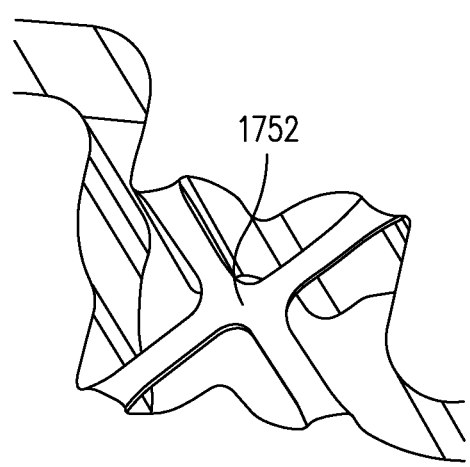

As illustrated in FIG. 17F, the interlocking snubber flaps feature 1756 includes the formation of a pair of flaps 1756A and 1756B respectively extending from moveable and fixed components 505 and 506 and over a corresponding shoulder 1762 formed on the other, opposing component. The flap 1756A on the moveable component 505 limits motion of the moveable component 505 in the −Z direction, and the flap 1756B on the fixed component 506 limits motion of the moveable component 505 in the +Z direction. Additionally, as illustrated in FIGS. 17K, 17L and 17N, the gap 1760 between the two components 505 and 506, which may be formed as discussed below in connection with FIGS. 49A-49F, may limit motion of the moveable component 505 in the ±X and/or ±Y directions.

As illustrated in FIG. 17M, the respective front ends of the flaps 1756A and 1756B may define corners at the opposite ends thereof, and one or more of the corners may incorporate elliptical fillets 1766.

As illustrated in FIGS. 17D-17L and FIGS. 17K-17N, a single snubber flap 1758 may be provided for constraining lateral movement of a component, e.g., moveable component 505, in an actuator device 1750. For example, the snubber flap 1758, which in some embodiments may comprise polysilicon, may extend from a fixed component, e.g., component 506, and toward but not over, the moveable component 505 to limit motion of the moveable component 505 in the lateral, i.e., in the in the ±X and/or ±Y directions. As illustrated in FIGS. 17K, 17L and 17N, the gap 1764 between the fixed and moveable components 505 and 506 can be made relatively larger than the gap 1768 between the snubber flap 1758 and the moveable component 505, such that the snubber flap 1758 does not interfere with normal rotational motion of the movable component 505, but does function to prevent unwanted lateral motion thereof.

Figure 18:
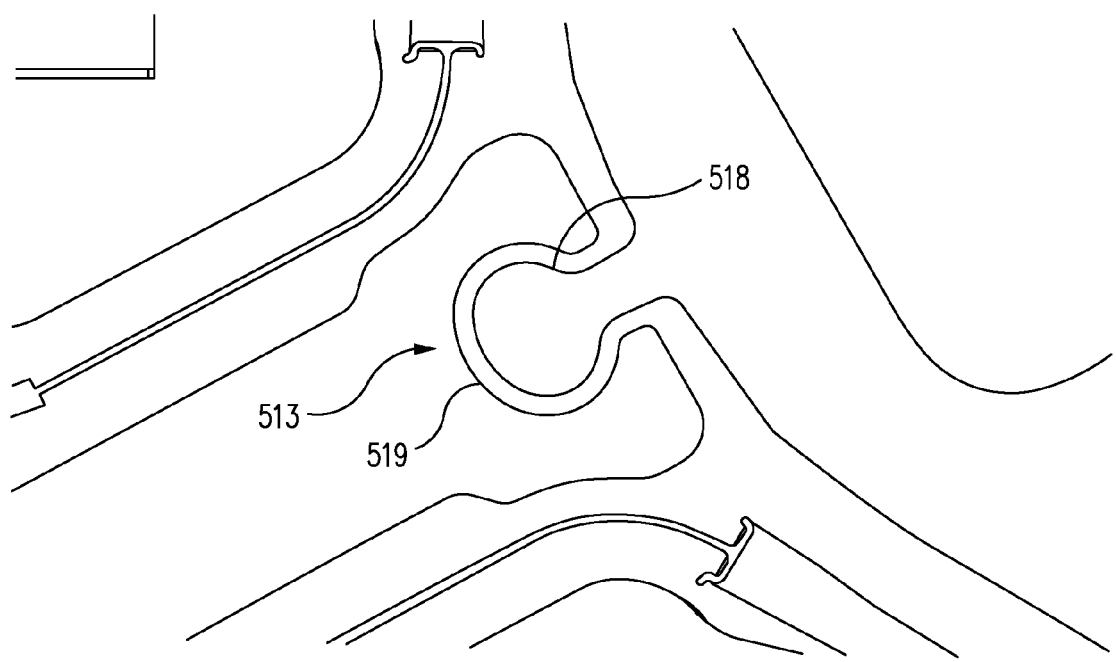
FIG. 18 illustrates a ball-in-socket snubber, in accordance with an embodiment.

FIG. 18 illustrates a ball-in-socket snubber 513, in accordance with an embodiment. The ball-in-socket snubber 513 may have a substantially cylindrical ball 518 that is slidably disposed within a substantially complementary cylindrical socket 519. The ball-in-socket snubber 513 permits desired movement of the platform 520 with respect to the outer frame 506 and limits other movement.

Figure 19:
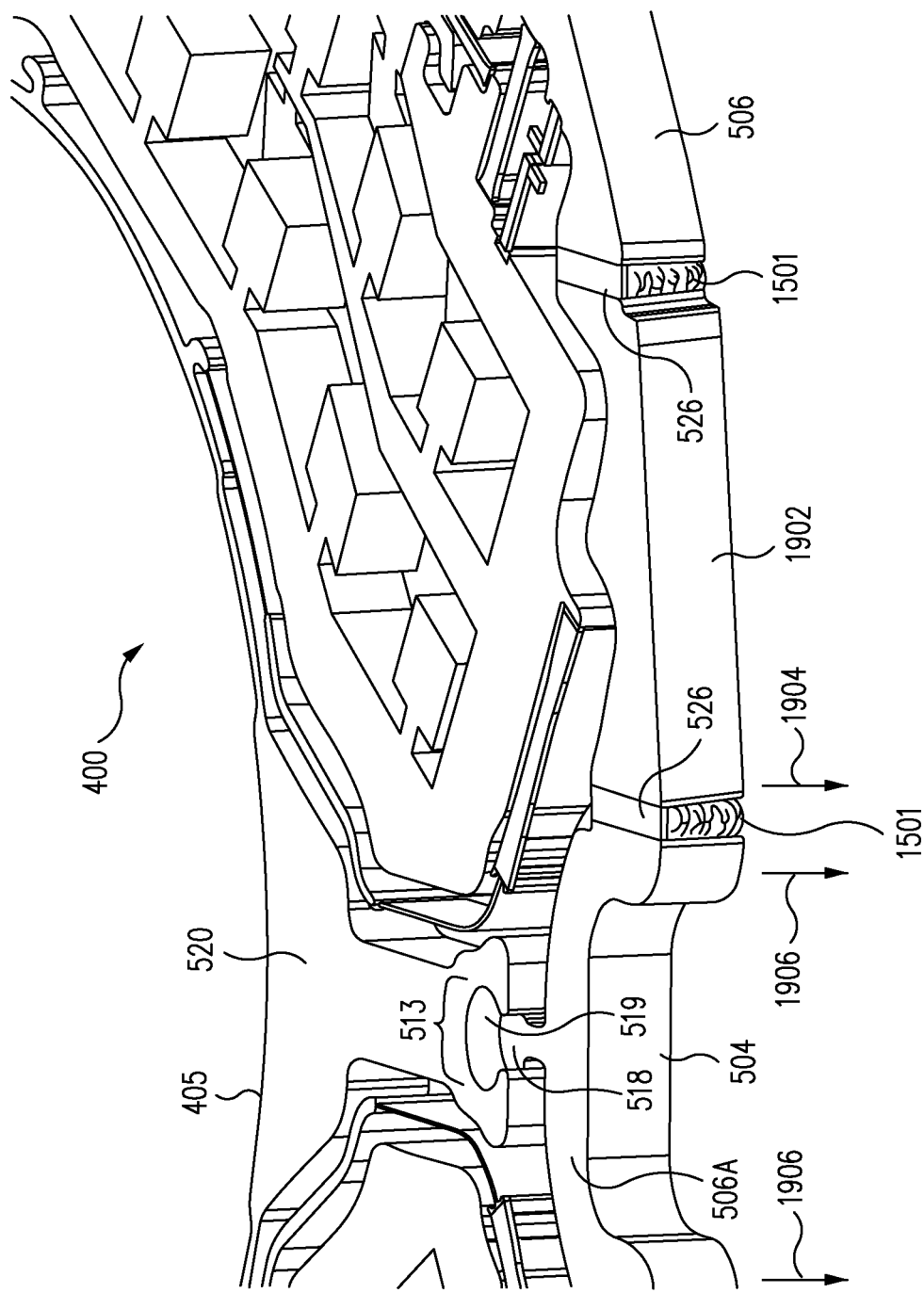
FIG. 19 illustrates the ball-in-socket snubber and two frame hinges, in accordance with an embodiment.

FIG. 19 illustrates a perspective view of the ball-in-socket 513 and two frame hinges 526, in accordance with an embodiment. The frame hinges 526 may be hinge flexures in the otherwise substantially rigid outer frame 506. The frame hinges 526 permit the outer frame 506 to deform out-of-plane while maintained desired rigidity in-plane.

Figure 20:
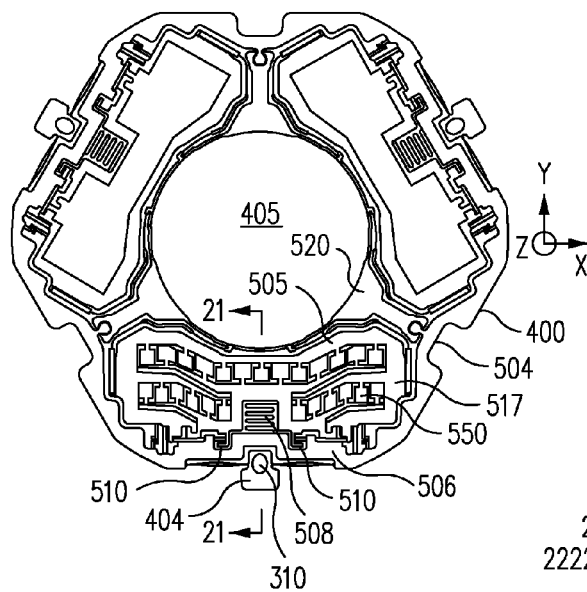
FIG. 20 illustrates an actuator device, in accordance with an embodiment.
Figure 21A:
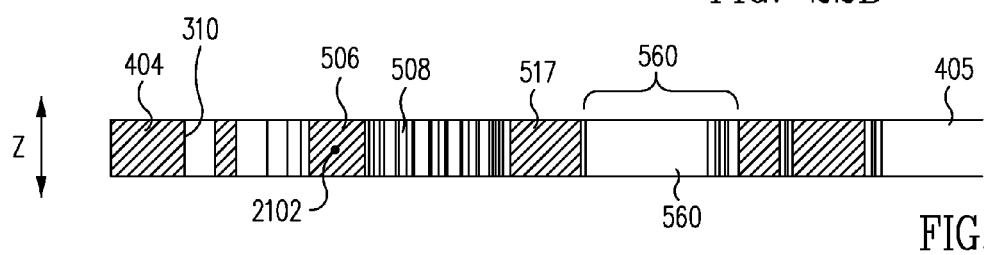
FIG. 21A illustrates the actuator device in an un-deployed state, in accordance with an embodiment.

FIG. 20 is a top plan view of an actuator device 400 in accordance with an embodiment, wherein cross-sectional views 21-21 are taken along lines 21-21. FIG. 21A is a partial cross-sectional view of the actuator device 400 of FIG. 20, as seen along the lines 21-21, showing the actuator device 400 in an un-deployed state, and FIG. 21B is a partial cross-sectional view of the actuator device 400 of FIG. 20, as seen along the lines 21-21, showing the actuator device 400 in a deployed state.

Figure 21B:
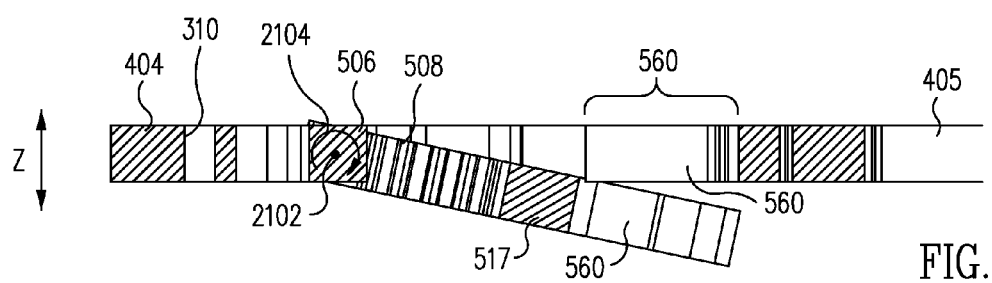
FIG. 21B illustrates the actuator device in a deployed state, in accordance with an embodiment.

As seen in FIGS. 20-21B, and as discussed in more detail above, the actuator device 400 may be substantially planar when initially formed, and may include recesses 504, electrical contacts or tabs 404 having alignment apertures 310, an outer frame 506, a fixed frame 517 coupled to the outer frame 506 for rotational movement relative thereto, a moveable frame 505 coup pled to the outer frame 506 for rotational movement relative thereto, and an actuator, which, in one embodiment, may comprise an electrostatic, rotationally acting actuator 550 incorporating a plurality of interdigitated teeth 560, a fixed portion of which is attached to the fixed frame 517 and a moving portion of which is attached to the moveable frame 505.

In one embodiment, the actuator device 400 may comprise an electrically conductive material, e.g., a semiconductor, such as polycrystalline silicon or monocrystalline silicon, and may be formed using photolithography techniques, such as etching or micromachining. The etching may include deep reactive ion etching (DRIE). The micromachining may comprises one or more of ion milling, laser ablation, chemical mechanical polishing (CMP), microelectrical discharge forming and/or or micro-forging.

With reference to FIG. 21A, it may be seen that the interdigitated teeth 560 of the actuator 550 are, like the other components of the actuator device 400, initially disposed coplanar with each other. Accordingly, the application of a voltage differential to the teeth 560 cannot result in any out-of-plane rotational movement of the moveable frame 505 relative to the fixed frame 517, and hence, any corresponding movement of the platform 520 in the Z direction. Accordingly, to effect the latter type of movement, the actuator device 400 may first be deployed into a configuration that enables this type of actuation.

As illustrated in FIG. 21B, in one embodiment, this deployment may be effected by rotating the fixed frame 517 relative to the outer frame 506, viz., about a rotational axis 2102 and in the direction indicated by the arrow 2104 such that the fixed portion of the actuator teeth 560 are disposed at a selected angle relative to the moving portion of the actuator teeth 560, and then fixing the angular position of the fixed frame 517 relative to the outer frame 506 at that selected angle. When thus deployed, the application of a voltage differential to the interdigitated teeth 560 of the actuator 550 will result in a rotational movement of the moveable frame 505 toward the fixed frame 517, and hence, movement of the platform 520 in the Z direction.

The rotation of the fixed frame 517 to the deployed position relative to the outer frame 506 and the fixing of its angular position relative to the latter can be effected in a variety of ways. As discussed above in connection with FIGS. 14-16, in one embodiment, a deployment stop 510 may be provided to limit the out-of-plane rotational movement of the fixed frame 517 to, and fix it at the deployed position, i.e., at the selected angle, in the following manner.

Figure 22A:
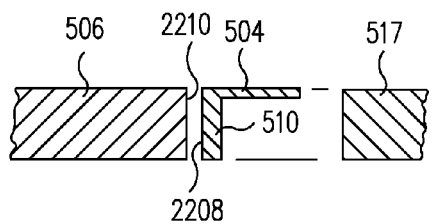
FIG. 22A illustrates a deployment stop of the actuator device in an un-deployed state, in accordance with an embodiment.
Figure 22B:
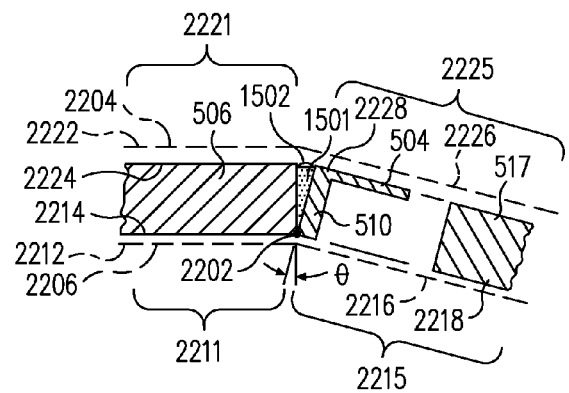
FIG. 22B illustrates the deployment stop in a deployed state, in accordance with an embodiment.

FIGS. 22A and 22B are partial cross-sectional views taken along the lines 22-22 through the deployment stop 510 in FIG. 15 illustrating the deployment stop 510 disposed in the undeployed state and in the deployed state, respectively. As illustrated in FIG. 22A, the deployment stop 510 is attached to the fixed frame 517 and has a side wall 2208 disposed parallel to and in spaced opposition to a side wall 2210 of the outer frame 506. During deployment, the fixed frame 517 is rotated relative to the outer frame 506 through the selected angle θ until a lower end 2202 of the opposing side wall 2208 of the deployment stop 510 is disposed in abutment with the opposing side wall 2210 of the outer frame 506.

The rotating of the fixed frame 517 relative to the outer frame 506 can be effected in a number of ways including, for example, by pressing on an upper surface of the fixed frame 517 or by pulling on a lower surface of the fixed frame 517, e.g., with a vacuum, until the fixed portion of the actuator teeth 560 are disposed at the selected angle θ relative to the moving portion of the actuator teeth 560.

Additionally or alternatively, as illustrated in FIG. 22B, the rotating of the fixed frame 517 relative to the outer frame 506 can be effected or assisted with the use of one or more molds or fixtures 2204 and/or 2206. For example, in one embodiment, a fixture 2206 having an outer ledge 2211 with an upper surface 2212 corresponding to a lower surface 2214 of the outer frame 506 and a central recess 2215 with an upper surface 2216 corresponding to a lower surface 2218 of the fixed frame 517 when it has been rotated to the deployed position, i.e., such that the fixed portion of the actuator teeth 560 is disposed at the selected angle θ relative to the moving portion of the actuator teeth. The actuator device 400 is placed on the fixture 2206 and the fixed frame 517 is then pressed or pulled downward as above until the lower surface 2218 of the fixed frame 517 contacts the upper surface 2216 of the central recess 2215 of the fixture 2206.

In another embodiment, two fixtures may be used, e.g., the first fixture 2206 above, and a second fixture 2204 having an outer ledge 2221 with a lower surface 2222 corresponding to an upper surface 2224 of the outer frame 506, and a central protrusion 2225 with a lower surface 2226 corresponding to an upper surface 2228 of the fixed frame 517 when it has been rotated to the deployed position relative to the outer frame 506, i.e., such that that the fixed portion of the actuator teeth 506 is disposed at the selected angle θ relative to the moving portion of the actuator teeth. As illustrated in FIG. 22B, in this embodiment, the actuator device 400 is placed between the first and second fixtures 2206 and 2204, and the first and second fixtures 2206 and 2204 are then urged toward each other until the fixed portion of the actuator teeth 560 is disposed at the selected angle θ relative to the moving portion of the actuator teeth 560.

In some embodiments, one, the other, or both of the fixtures 2204 and 2206 may incorporate small openings (not illustrated) suitably located to enable the fixed frame 517 to be fixed in the deployed position by, for example, one or more of the methods described in more detail below. Additionally, the molds 2204 and 2206 may be fabricated with a number of associated sets of the outer ledges 2211 and 2221 and the central recesses 2215 and protrusions 2225 so that a number of actuator devices 400 can be deployed and then fixed in the deployed position simultaneously.

As those of some skill in this art will appreciate, there are other ways of rotating the fixed frame 517 to a selected angular position relative to the outer frame 506, and accordingly, the forgoing methods should be considered as merely exemplary and not as limiting.

As illustrated in FIGS. 15, 16 and 22B, the angular position of the fixed frame 517 relative to the outer frame 506 can be fixed in the deployed state or angular position, i.e., at the selected angle θ, in several different ways. For example, in one embodiment, the lower end 2201 of the opposing side wall of the deployment stop 510 can be bonded to the opposing side wall of the outer frame 506 with an adhesive.

In another embodiment, the lower end 2202 of the opposing side wall 2208 of the deployment stop 510 can be welded to the opposing side wall 2210 of the outer frame 506 in a weldment using, e.g., a laser or electron beam welder. In another embodiment, the opposing side wall 2208 of the deployment stop 510 can be bonded to the opposing side wall 2210 of the outer frame 506 with a fillet 1501 of an adhesive.

In another embodiment, a wedge 1502 incorporating the selected angle θ can be bonded between the opposing side wall of the deployment stop 510 and the opposing side wall of the outer frame 506 with an adhesive in place of or in addition to the fillet 1501 of adhesive.

As those of some skill in this art will appreciate, there are other ways in which the fixed frame 517 may be fixed in the deployed position, and accordingly, the forgoing should be considered as merely exemplary and not as limiting.

Figure 23:
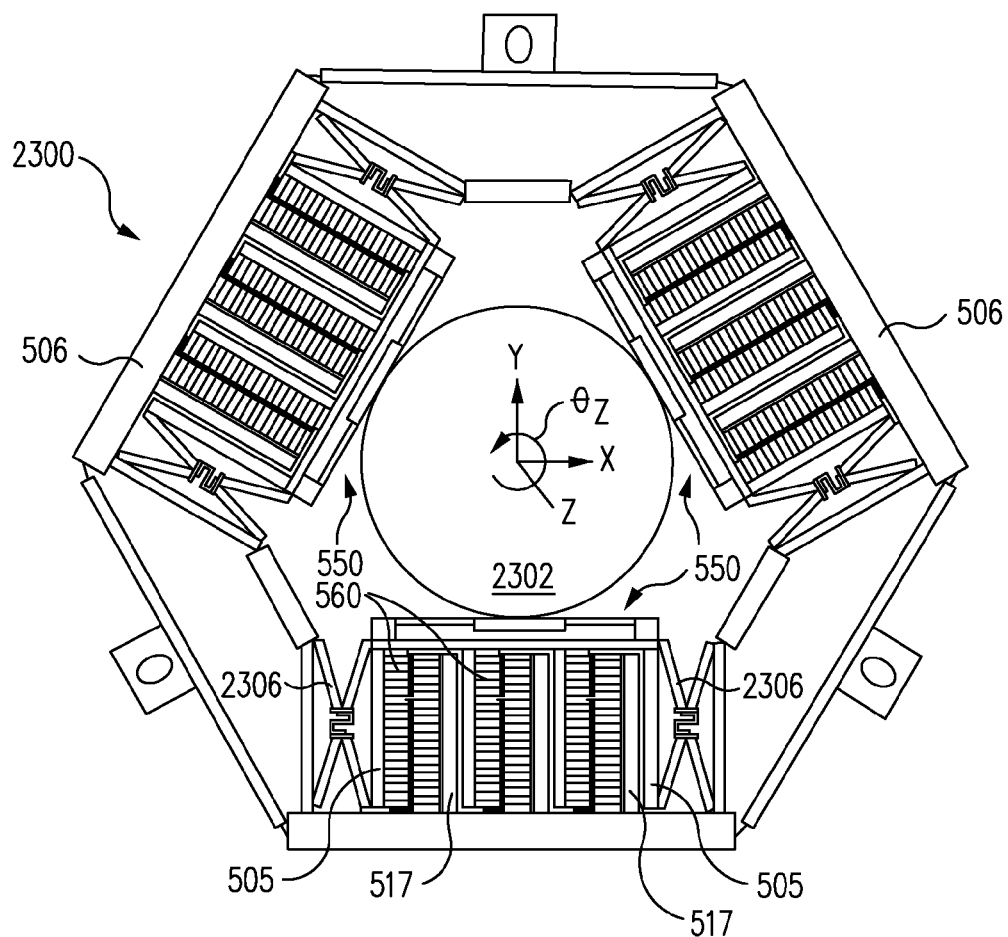
FIG. 23 illustrates an actuator device, in accordance with an embodiment.

FIG. 23 is top plan view of another embodiment of an actuator device 2300 that, unlike the actuator device 400 above, is operable to move an element 2302, such as a lens, a stage or the like, in the plane of the device, i.e., rectilinearly in the X, Y directions, and rotationally about the Z direction (θZ).

As may be seen in FIG. 23, the substantially planar actuator device 2300 includes many of the same features found in the actuator device 400 discussed above, as well as other features that are different, given the difference in the nature of its actuation. The actuator device 2300 comprises an outer frame 506, a plurality of fixed frames 517 attached to the outer frame 506, a plurality of moveable frames 505 disposed parallel to the fixed frames 517, a plurality of motion control flexures 2306 respectively coupling the moveable frames 505 to the fixed frames 517 for respective coplanar, rectilinear movement perpendicularly to the fixed frames 517, and a plurality of actuators 550, each incorporating a plurality of interdigitated teeth 560, a fixed portion of which is attached to the fixed frames 517 and a moving portion of which is attached to the moveable frames 505.

The example actuator device 2300 illustrated in FIG. 23 includes three actuators 550, arranged radially symmetrical about a central axis of the device, each including three comb drives, or banks of interdigitated teeth 560. However, it should be understood that the number and arrangement of the actuators 550, as well as the number and arrangement of their teeth 560, can vary from that of the particular example actuator device 2300 illustrated.

It may be noted in FIG. 23 that the interdigitated teeth 560 of the actuators 550 of the actuator device 2300 extend in a direction that is perpendicular to the direction in which the teeth 560 of the actuators 550 of the actuator device 400 of, e.g., FIG. 5A, extend.

Figure 24:
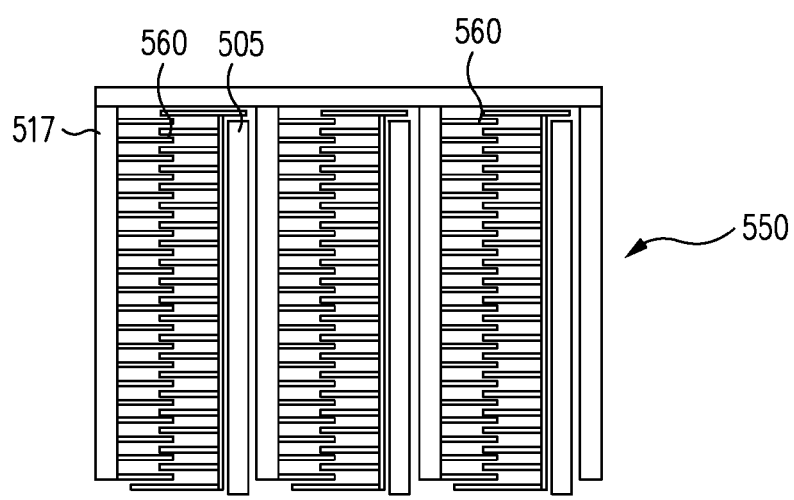
FIG. 24 illustrates an actuator, in accordance with an embodiment.
Figure 25:
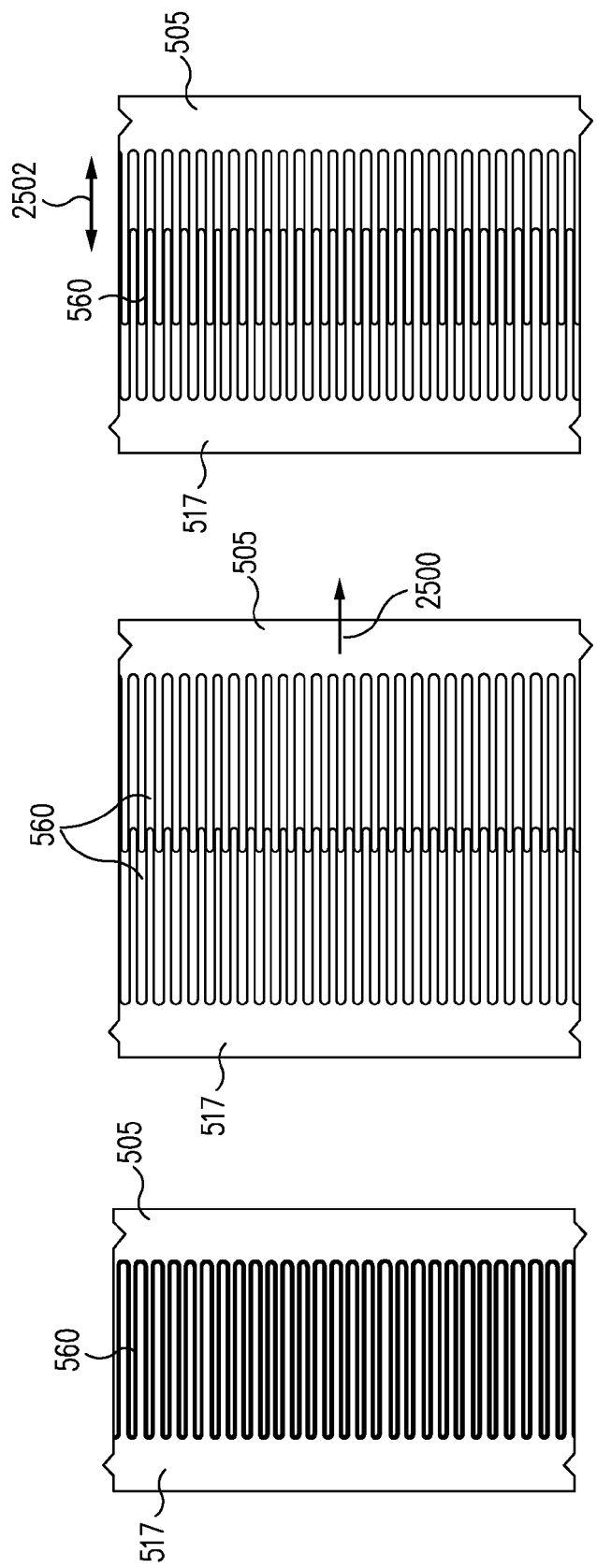
FIG. 25A-25C illustrate a method for deploying the actuator device, in accordance with an embodiment.

Additionally, as illustrated in the enlarged partial top plan view of an actuator 550 of FIG. 24, it should be understood that the interdigitated teeth 560 of the actuators 550 of FIG. 23 are shown in a deployed position, i.e., spread apart from one another, for substantially rectilinear movement relative to each other. However, as illustrated in FIG. 25A, it may be seen that the interdigitated teeth 560 of the actuator 550 are initially disposed such that the associated fixed and moveable frames 517 and 505 are spaced apart by about the length of the teeth 560. Accordingly, the application of a voltage differential to the teeth 560 cannot result in any in-plane rectilinear movement of the moveable frame 505 relative to the fixed frame 517, and hence, any corresponding X, Y or θZ movement of an element 2302 coupled to the former. Accordingly, to effect the latter type of movement, it is desirable to deploy the actuator device 2300 into a configuration that enables this type of actuation.

As illustrated in FIG. 25B, in one embodiment, this deployment can be effected by moving the associated moveable frame 505 in the direction of the arrow 2500 to a deployed position that is coplanar with, parallel to and spaced at a selected distance apart from the associated fixed frame 517, and then fixing the moveable frame 505 in the deployed position for substantially coplanar, rectilinear movement perpendicularly to the associated fixed frame 517. As illustrated in FIG. 25C, when thus deployed, the application and removal of a suitable voltage differential to the interdigitated teeth 560 of the actuator 550 will result in a substantially rectilinear, perpendicular movement of the resiliently supported moveable frame 505 toward and away from the fixed frame 517, as indicated by the double-headed arrow 2502, and hence, a corresponding X, Y and/or θZ movement of an element 2302 coupled to the moveable frame 505.

There are several different methods and apparatus for moving the moveable frame 505, and hence, the associated moving portion of the teeth 560, of an actuator 550 to the deployed position, as well as for locking or fixing it in the deployed position.

Figure 26:
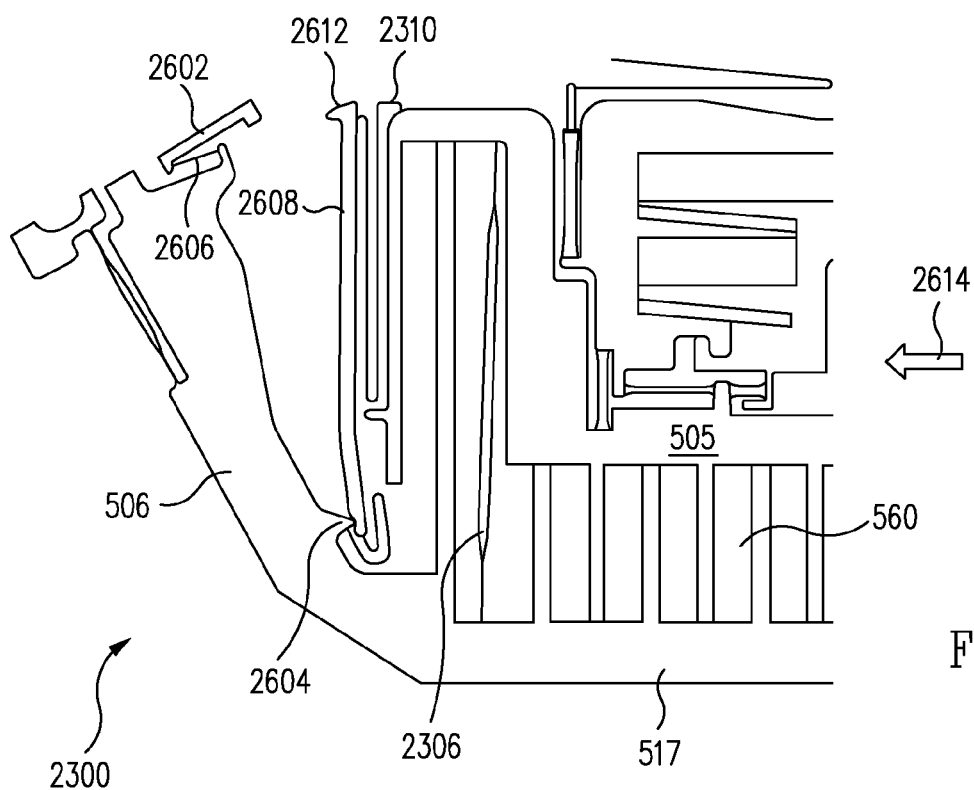
FIG. 26 illustrates a method for deploying the actuator device, in accordance with an embodiment.

An example embodiment of one such method and apparatus is illustrated in the enlarged partial top plan view of the actuator 2300 in FIG. 26. In the embodiment of FIG. 26, the deployment method includes forming a coplanar over-center latch 2602 and a fulcrum 2604 on the outer frame 506. The latch 2602 is coupled to the outer frame 506 with a spring 2606. A coplanar deployment lever 2608 is coupled to the moveable frame 505 with a deployment flexure 2310. The deployment lever 2608 has a surface 2612 disposed at an upper end of the lever that is configured as an inclined plane for a camming actuation of and a latching engagement with the latch 2608, and a notch at a lower end of the lever that is engaged with the fulcrum 2604 for rotational movement of the lever thereabout.

In an example deployment, an acceleration pulse is applied to the actuator device 2300 in the direction of the arrow 2614 while holding the outer frame 506 fixed. This causes the deployment lever 2608 to rotate about the fulcrum 2604 and toward the outer frame 506. The rotation of the deployment lever 2608 about the fulcrum 2604 causes the deployment flexure 2310 to urge the moveable frame 505 rectilinearly and perpendicularly upward from the fixed frame 517 and to the deployed position, where the camming surface 2612 at the upper end of the deployment lever 2608 actuates and is engaged by the latch 2602 so as to fix the moveable frame 505 in the deployed position, as illustrated in, e.g., FIG. 25B.

Figure 27:
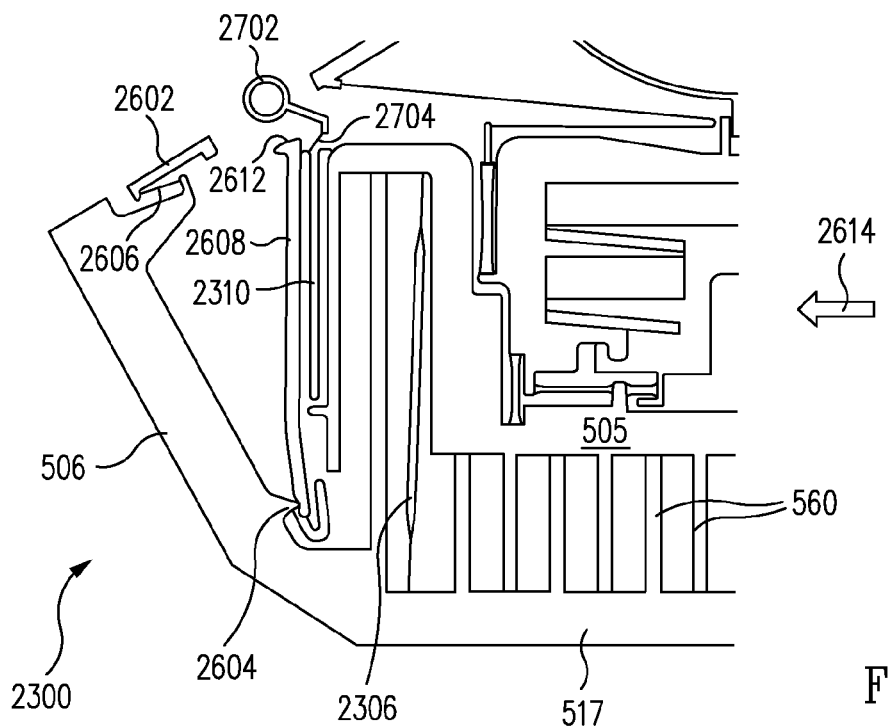
FIG. 27 illustrates a method for deploying the actuator device, in accordance with an embodiment.

FIG. 27 illustrates another embodiment of method and apparatus for deploying and latching the actuator device 2300 that is similar to those of the embodiment of FIG. 26. In this embodiment, the method further includes forming a pull ring 2702 attached to the deployment flexure 2310 by a spring 2704 adjacent to the upper end of the deployment lever 2608, and then using the pull ring 2702 to rotate the deployment lever 2608 about the fulcrum 2604 directly using, e.g., a small needle or another MEMS device inserted into the pull ring 2702.

Figure 28:
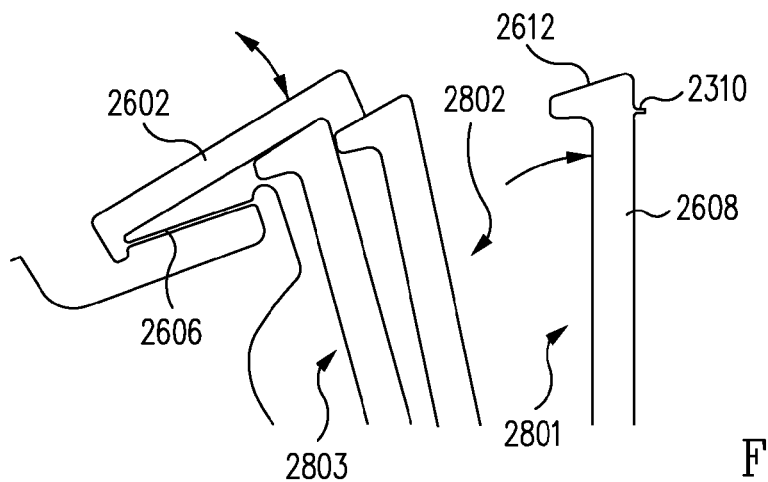
FIG. 28 illustrates an over-center latch useful for locking the actuator device in the deployed position, in accordance with an embodiment.

FIG. 28 is an enlarged partial plan view of the over-center latch 2602 and deployment lever 2608 of the embodiments of FIGS. 26 and 27, showing the lever 2608 disposed in its original or pre-deployment position 2801, in an intermediate position 2802 in which the camming surface 2612 at the upper end of the lever 2608 has engaged the latch 2602 and forced it to rotate upward about the spring 2606, and in a final or latched position 2803, in which the latch 2602 has been returned to its original position by the spring 2602 and engaged over the upper end of the deployment lever 2608, thereby latching it, and hence, the moveable frame 505 and associated moving actuator teeth 560, in the deployed position.

In one embodiment, an adhesive can be applied to the junction of the latch 2602 and the upper end of the deployment lever 2608 to prevent them from disengaging from one another as a result of, for example, shock or vibration.

Figure 29:
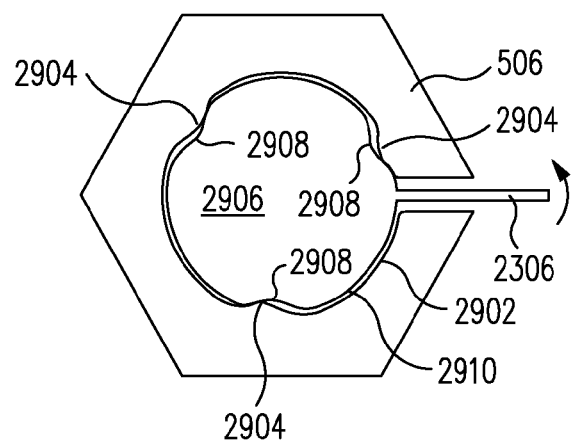
FIG. 29 illustrates a ball and socket useful in the method for deploying the actuator device, in accordance with an embodiment.

FIG. 29 illustrates another actuator device 2300 deployment method and apparatus, which include forming a socket 2902 in the outer frame 506, the socket including a plurality of radial protrusions 2904 on an inner surface thereof. A complementary ball 2906 is formed concentrically within the socket 2902. The ball 2906 is coupled to the motion control flexure 2306 through a slot in a side wall of the socket 2902 and includes a plurality of indentations 2908 that are respectively complementary in configuration to the radial protrusions 2904 on the socket 2902. The ball 2906 and socket 2902 can be used during deployment of the actuator device 2300 to reduce the force required to move the moveable frame 505 (not seen in FIG. 29) to the deployed position, and such that the moveable frame 505 moves substantially rectilinearly and in a direction substantially perpendicular to the fixed frame 517.

In particular, in a pre-deployment configuration, the ball 2906 and socket 2902 define a uniform gap 2910 between the two features. However, during deployment of the moving frame 505, a torque, indicated by the arrow, may be applied to the motion control flexure 2306, which is coupled to the moving frame 505, and cause both it and the moving frame 505 to rotate undesirably. However, as illustrated in FIG. 29, when the ball 2906 begins to rotate in the socket 2902, the protrusions 2904 of the socket 2902 immediately engage the indentations 2908 of the ball 2906 and lock to prevent any further rotation of the motion control flexure 2306 and moving frame 505. As a result, the force required to move the moveable frame 505 to the deployed position is reduced, and during deployment, the moveable frame 505 moves substantially rectilinearly and in a direction substantially perpendicular to the fixed frame 517.

Figure 30:
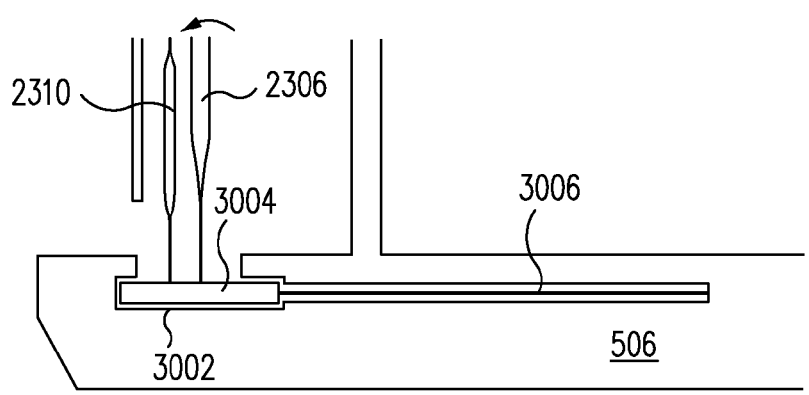
FIG. 30 illustrates another ball and socket useful in the method for deploying the actuator device, in accordance with an embodiment.

FIG. 30 illustrates another ball-and-socket method and apparatus useful in the deployment of the actuator device 2300. In the embodiment of FIG. 30, a rectangular socket 3002 is formed in the outer frame 506, and a complementary rectangular ball 3004 is formed concentrically within the socket 3002. The ball 3004 is connected to the outer frame 506 by a ball spring 3006 and to the moveable frame 505 (not seen in FIG. 30) by the motion control flexure 2306. As in the embodiment discussed in connection with FIG. 29 above, the ball 3004 and socket 3002 can be used when moving the moveable frame 505 to the deployed position such that the moveable frame 505 moves substantially rectilinearly and in a direction substantially perpendicular to the fixed frame 517.

In particular, during deployment of the moving frame 505, a torque, indicated by the arrow, may be applied to the motion control flexure 2306, which is coupled to the moving frame 505, and cause both it and the moving frame 505 to rotate undesirably. However, as illustrated in FIG. 30, when the rectangular ball 3004 begins to rotate in the rectangular socket 3002, the ball 3004 is locked against further rotation by the top and bottom boundaries of the socket 3002, thereby preventing any further rotation of the motion control flexure 2306 and moving frame 505. As a result, the moveable frame 505 moves substantially rectilinearly and in a direction perpendicular to the fixed frame 517.

Figure 31:
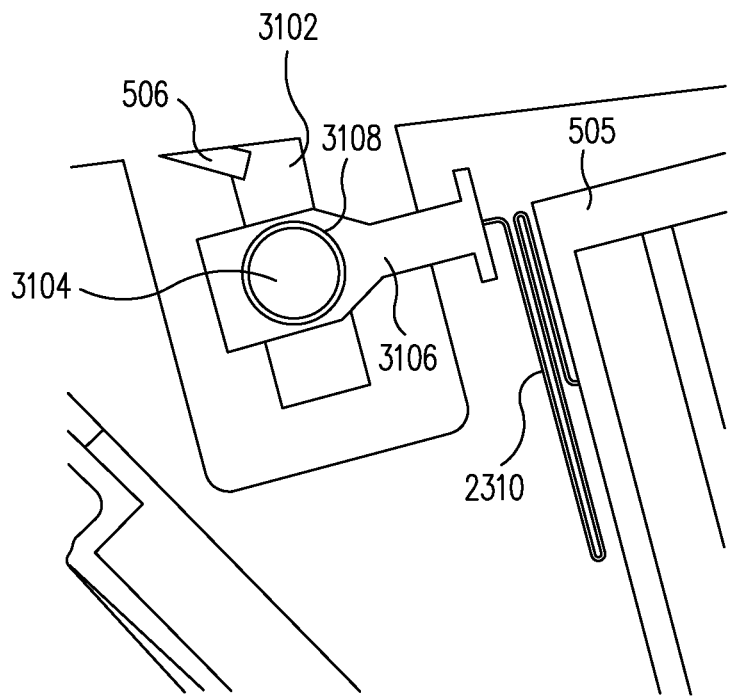
FIG. 31 illustrate a tab and post useful in the method for deploying the actuator device and for locking it in the deployed position, in accordance with an embodiment.
Figure 32:
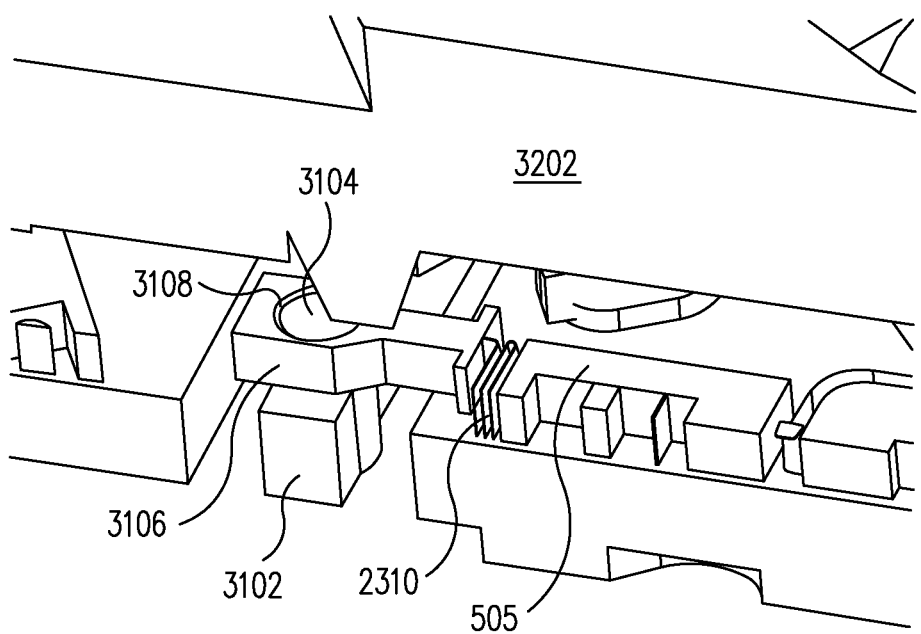
FIG. 32 illustrates the tab and post being used in the method for deploying the actuator device and for locking it in the deployed position, in accordance with an embodiment.

Another embodiment of a method and apparatus for deploying the actuator device 2300 is illustrated in FIGS. 31 and 32. In FIG. 31, the method includes forming a resilient cantilever 3102 on the outer frame 506, the cantilever 3102 having an upstanding post 3104, e.g., a plastic post, disposed thereon. A pad 3106 coupled to the moveable frame 505 by a deployment flexure 2310 is also formed. The pad 3106 has an opening 3108 extending therethrough that corresponds in size to the circumferential periphery of the post 3104, and a lower surface disposed below an upper surface of the post 3104.

As illustrated in FIG. 32, a downward force may be applied to the cantilever 3102 by, e.g., a moveable chamfered plastic snub 3202, such that the upper surface of the post 3104 is depressed below the lower surface of the pad 3106. The pad 3106 is then urged toward the post 3104, e.g., using the chamfered snub 3202, such that the pad 3106 causes the deployment flexure 2310 to urge the moveable frame 505 to the deployed position and the opening 3108 in the pad 3104 is centered over the post 3104. The downward force on the cantilever 3102 is then released, e.g., using the chamfered snub 3202, such that the post 3104 slides up into the opening 3108 in the pad 3106 and fixes the moveable frame 505 in the deployed position. As in the latching embodiments discussed above in connection with FIGS. 26-28, it may be desirable in some embodiments to fix the post 3104 in the opening 3108 of the pad 3106 with, e.g., an adhesive.

Figure 33:
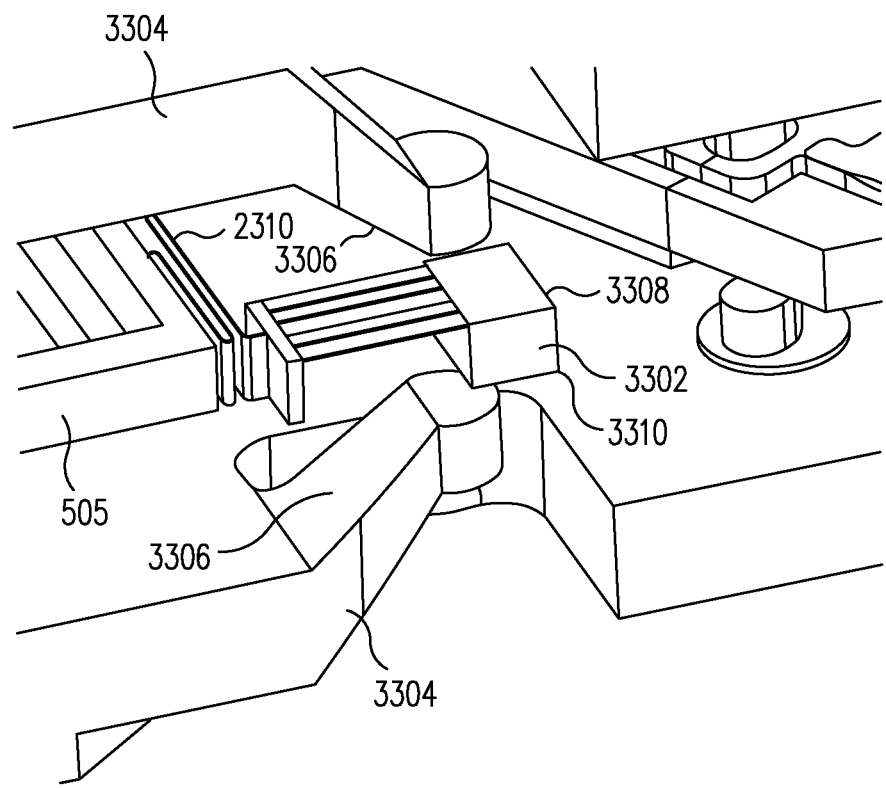
FIG. 33 illustrates a method for deploying the actuator device, in accordance with an embodiment.

Another embodiment of a method and apparatus for deploying the actuator device 2300 using snubs is illustrated in FIG. 33. The method of FIG. 33 includes forming an engagement pad 3302 coupled to the moveable frame 505 by a deployment flexure 2310. The method further includes providing a pair of moveable snubs 3304, e.g., soft, plastic snubs, disposed in spaced opposition to each other. Each snub 3304 has a ramp 3306 disposed bilaterally symmetrical with respect to the ramp of the other snub. The engagement pad 3302 is disposed between the two ramps 3306 of the snubs 3304, and the snubs are then urged toward each other such that upper and lower edges 3308 and 3310 of the engagement pad 3302 respectively engage a corresponding one of the ramps 3306 and cause the engagement pad 3302 to move laterally and thereby cause the deployment flexure 2310 to urge the moveable frame 505 to the deployed position.

Figure 34:
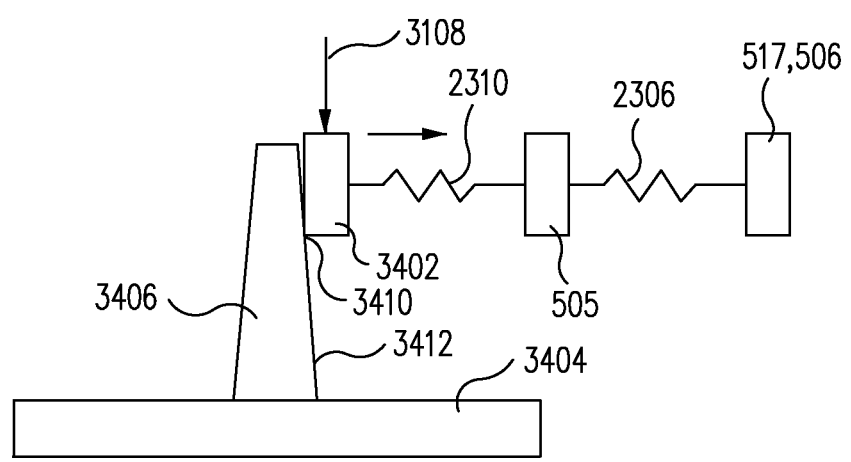
FIG. 34 illustrates a method for deploying the actuator device, in accordance with an embodiment.

Another embodiment of a method and apparatus for deploying the actuator device 2300 is illustrated schematically in FIG. 34. In the embodiment of FIG. 34, the method includes forming a deployment pad 3402 coupled to the moveable frame 505 by a deployment flexure 2310. The moveable frame 505 is coupled to the stationary fixed frame 517 and/or outer frame 506 by the motion control flexure 2306. The method further includes providing a stationary fixture 3404. The fixture 3404 has a chamfered pillar 3406 upstanding therefrom. The actuator device 2300 is urged downward toward the fixture 3404, indicated by the arrow 3108, such that an edge 3410 of the deployment pad 3402 contacts a chamfered surface 3412 of the pillar 3406 and causes the deployment flexure 2310 to move laterally and thereby urge the moveable frame 505 to the deployed position.

Figure 35:
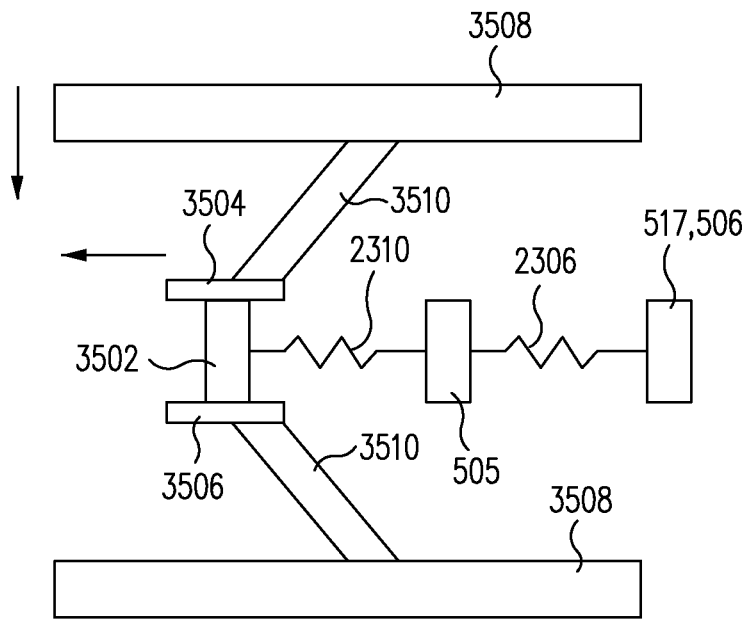
FIG. 35 illustrates a method for deploying the actuator device, in accordance with an embodiment.

Another embodiment of a method and apparatus for deploying the actuator device 2300 using snubs is illustrated schematically in FIG. 35. In the embodiment of FIG. 35, the method includes forming a deployment stage 3502 coupled to the moveable frame 505 by a deployment flexure 2310, the stage 3502 having opposite upper and lower surfaces 3504 and 3506. The method further includes providing a pair of snubs 3508 disposed in spaced opposition to each other. Each snub 3508 has a resilient inclined motion converter 3510 disposed bilaterally symmetrical with respect to the motion converter of the other snub. The lower surface 3506 of the deployment stage 3502 is placed on an upper end of the motion converter 3510 of a lower one of the snubs 3508, and a lower end of the motion converter 3510 of the upper one of the snubs 3508 is urged into contact with the upper surface 3504 of the deployment stage 3502 such that the deployment stage 3502 moves laterally and thereby causes the deployment flexure 2310 to urge the moveable frame 505 to the deployed position.

Figure 36:
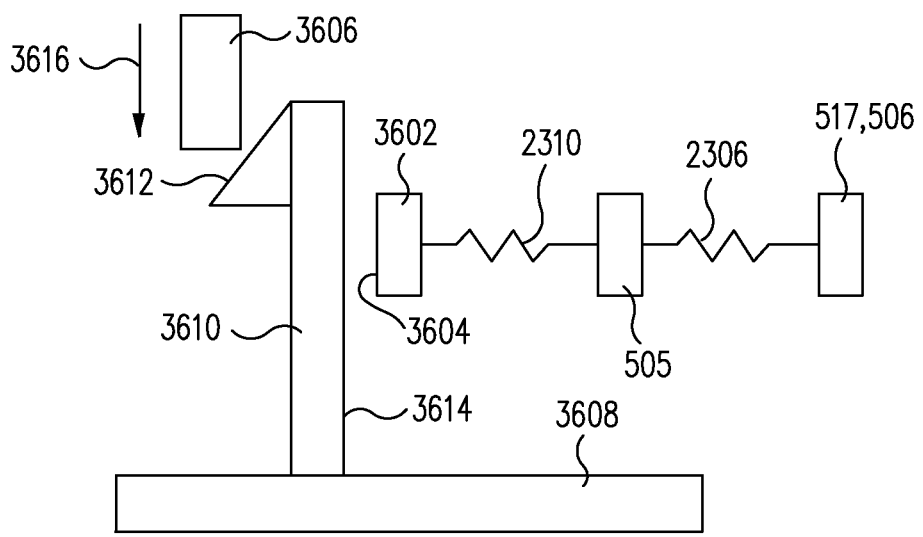
FIG. 36 illustrates a method for deploying the actuator device, in accordance with an embodiment.

Another embodiment of a method and apparatus for deploying the actuator device 2300 using snubs is illustrated schematically in FIG. 36. In the embodiment of FIG. 36, the method includes forming a deployment stage 3602 coupled to the moveable frame 505 by a deployment flexure 2310, the stage 3602 having a lateral surface 3604. The method further includes providing top and bottom snubs 3606 and 3608. The bottom snub 3608 has a pillar 3610 upstanding therefrom. The pillar 3610 has a chamfered surface 3612 disposed at an upper end and a lateral surface 3614. The actuator device 2300 is placed on an upper surface of the bottom snub 3608 such that the lateral surface 3604 of the deployment stage 3602 is disposed in opposition with the lateral surface 3614 of the pillar 3610. The top snub 3606 is then urged downward, indicated by the arrow 3616, and into contact with the chamfered surface 3612 of the pillar 3610 such that the bottom snub 3608 moves laterally, causing the lateral surface 3614 of the pillar 3610 to contact the opposing lateral surface 3604 of the deployment stage 3602 and to urge the deployment stage 3602 laterally, thereby causing the deployment flexure 2310 to urge the moveable frame 505 to the deployed position.

Figure 37:
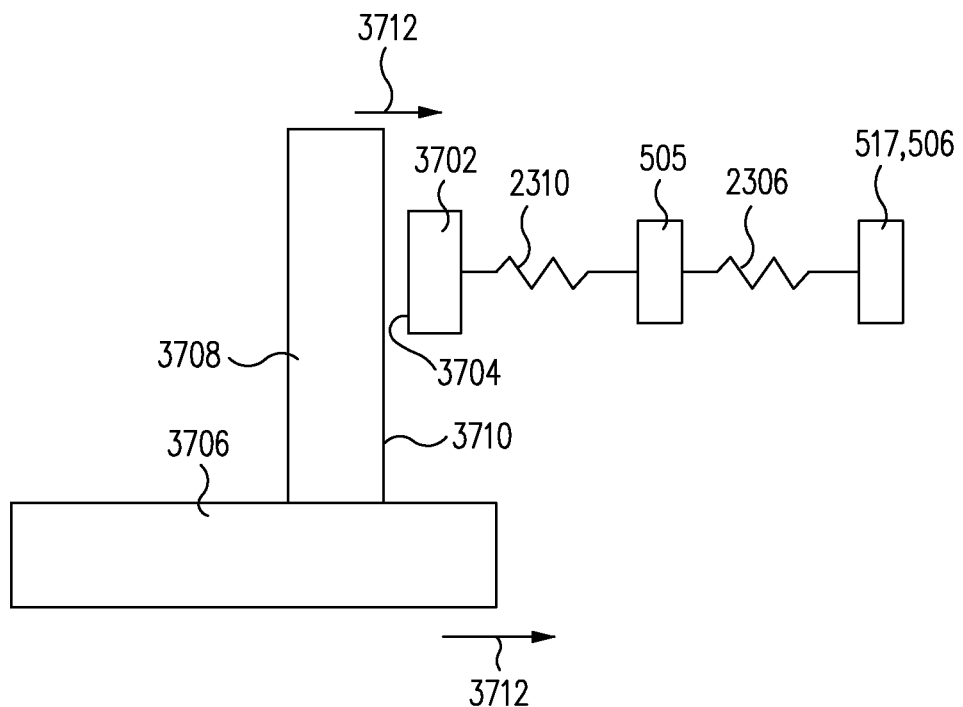
FIG. 37 illustrates a method for deploying the actuator device, in accordance with an embodiment.

Another embodiment of a method and apparatus for deploying the actuator device 2300 using a MEMS device is illustrated schematically in FIG. 37. In the embodiment of FIG. 37, the method includes forming a deployment pad 3702 coupled to the moveable frame 505 by a deployment flexure 2310, the pad 3702 having a lateral surface 3704. The method further includes providing a MEMS device having a laterally moveable stage 3706 with an upstanding deployment peg 3708 disposed thereon. The deployment peg 3708 has a lateral surface 3710 disposed in opposition to the lateral surface 3704 of the deployment pad 3702. The MEMS device is actuated such that the stage 3706 and deployment peg 3708 move laterally, indicated by the arrows 3712, and cause the lateral surface 3710 of the deployment peg 3708 to contact the opposing lateral surface 3704 of the deployment pad 3702 and to urge the deployment pad 3702 laterally, thereby causing the deployment flexure 2310 to urge the moveable frame 505 to the deployed position.

Figure 38:
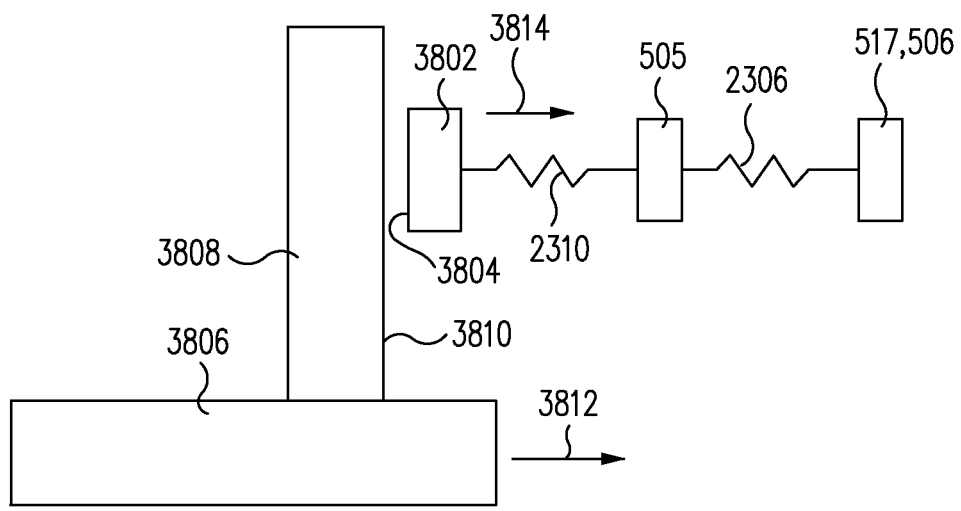
FIG. 38 illustrates a method for deploying the actuator device, in accordance with an embodiment.

Another embodiment of a method and apparatus for deploying the actuator device 2300 using thermal expansion is illustrated schematically in FIG. 38. In the embodiment of FIG. 38, the method includes forming a deployment pad 3802 coupled to the moveable frame 505 by a deployment flexure 2310, the pad 3802 having a lateral surface 3804. The method further includes providing a fixture 3806 having a positive coefficient of thermal expansion and an upstanding deployment peg 3808 disposed thereon. The deployment peg 3808 has a lateral surface 3810 disposed in opposition to the lateral surface 3804 of the deployment pad 3802. The fixture 3806 is heated such that the fixture 3806 and the deployment peg 3808 expand laterally, indicated by the arrow 3812, causing the lateral surface 3810 of the deployment peg 3808 to contact the opposing lateral surface 3804 of the deployment pad 3802 and to urge the deployment pad laterally, indicated by the arrow 3814, thereby causing the deployment flexure 2310 to urge the moveable frame 505 to the deployed position.

Figure 39:
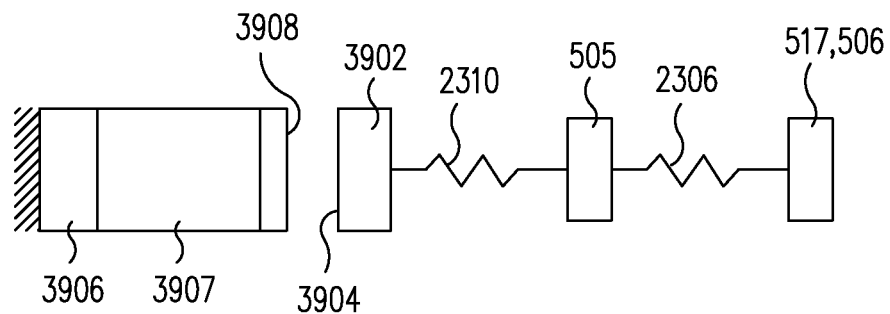
FIG. 39 illustrates a method for deploying the actuator device, in accordance with an embodiment.

Another embodiment of a method and apparatus for deploying the actuator device 2300 using thermal expansion is illustrated schematically in FIG. 39. In the embodiment of FIG. 39, the method includes forming a deployment pad 3902 coupled to the moveable frame by a deployment flexure 2310, the pad 3902 having a lateral surface 3904. The method further includes forming a fixed frame 3906 in the actuator device 2300 that has a positive coefficient of thermal expansion or that includes a component 3907 having a positive coefficient of thermal expansion, and a lateral surface 3908 disposed in opposition to the lateral surface 3904 of the deployment pad 3902. The frame 3906 is heated, e.g., during a thermal cure of the component 3907, such that the frame 3906 expands laterally, causing the lateral surface 3908 of the frame 3906 to contact the opposing lateral surface 3904 of the deployment pad 3902 and to urge the deployment pad 3902 laterally, thereby causing the deployment flexure 2310 to urge the moveable frame 505 to the deployed position.

Figure 40:
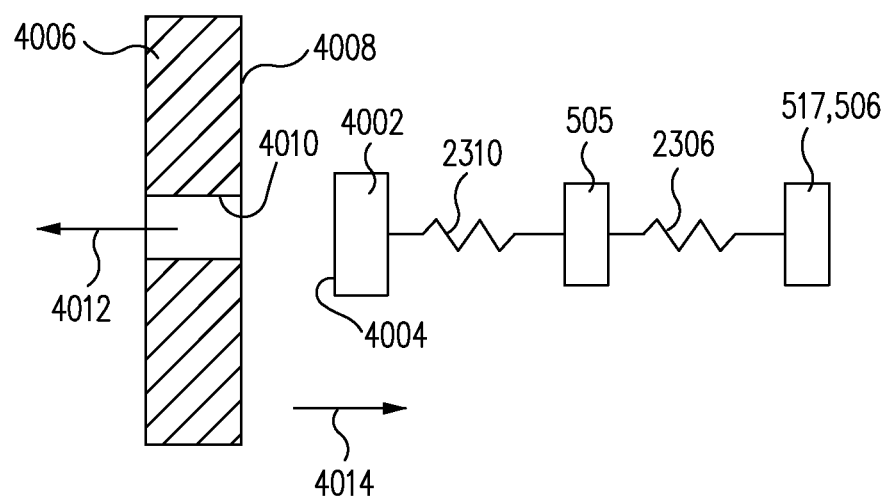
FIG. 40 illustrates a method for deploying the actuator device, in accordance with an embodiment.

Another embodiment of a method and apparatus for deploying the actuator device 2300 using a vacuum is illustrated schematically in FIG. 40. In the embodiment of FIG. 40, the method includes forming a deployment pad 4002 coupled to the moveable frame 505 by a deployment flexure 2310, the pad 4002 having a lateral surface 4004. The method further includes providing a fixture 4006 having a lateral surface 4008 disposed in opposition to the lateral surface 4004 of the deployment pad 4002 and an orifice 4010 extending laterally therethrough. A vacuum, indicated by the arrow 4012, is applied to the orifice 4010 in the fixture 4006 such that the lateral surface 4008 of the fixture 4006 is pulled laterally by the vacuum 4012 against the lateral surface 4004 of the deployment pad 4002, causing the deployment pad 4002 to move laterally, indicated by the arrow 4014, and the deployment flexure 2310 to urge the moveable frame 505 to the deployed position.

Figure 41:
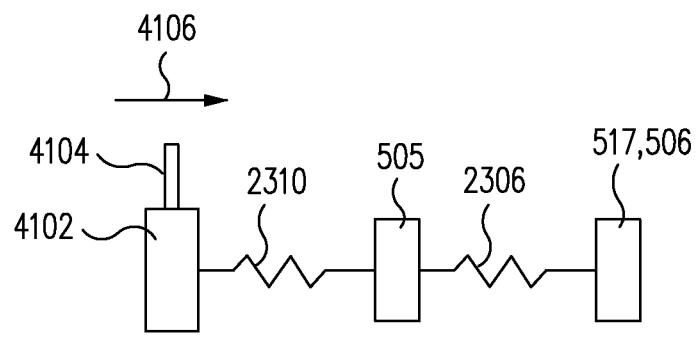
FIG. 41 illustrates a method for deploying the actuator device, in accordance with an embodiment.

Another embodiment of a method and apparatus for deploying the actuator device 2300 using a magnetic field is illustrated schematically in FIG. 41. In the embodiment of FIG. 41, the method includes forming a deployment pad 4102 coupled to the moveable frame 505 by a deployment flexure 2310, the pad 4102 having a magnet 4104 disposed thereon. The method further includes moving a magnetic field, indicated by the arrow 4106, over the magnet 4104 on the deployment pad 4102 such that the deployment pad 4102 moves laterally in the direction indicated by the arrow 4106, thereby causing the deployment flexure 2310 to urge the moveable frame 505 to the deployed position.

Figure 42:
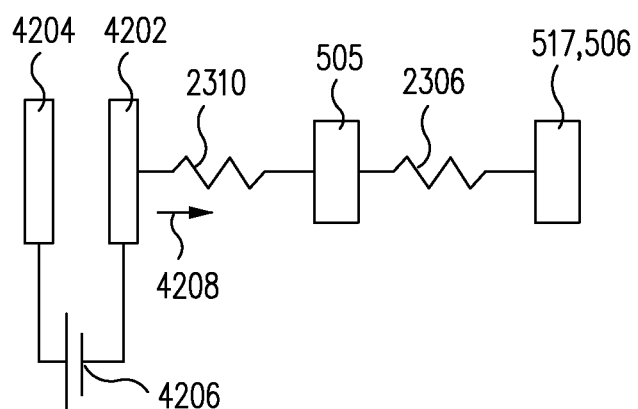
FIG. 42 illustrates a method for deploying the actuator device, in accordance with an embodiment.

Another embodiment of a method and apparatus for deploying the actuator device 2300 using electrostatic forces is illustrated schematically in FIG. 42. In the embodiment of FIG. 42, the method includes forming a deployment stage 4202 coupled to the moveable frame 505 by a deployment flexure 2310. The method further includes providing a stationary stage 4204 disposed adjacent to and spaced apart from the deployment stage 4204. A voltage differential 4206 is applied to the deployment and stationary stages 4202 and 4204 such that the deployment stage 4202 moves laterally in the direction indicated by the arrow 4208 relative to the stationary stage 4204 and causes the deployment flexure 2310 to urge the moveable frame 505 to the deployed position.

In addition to the several methods and apparatus described above for deploying the actuator device 2300 using mechanical, thermal expansion, vacuum, magnetic and electrostatic forces, additional methods exist for doing so using capillary forces.

Figure 43A:
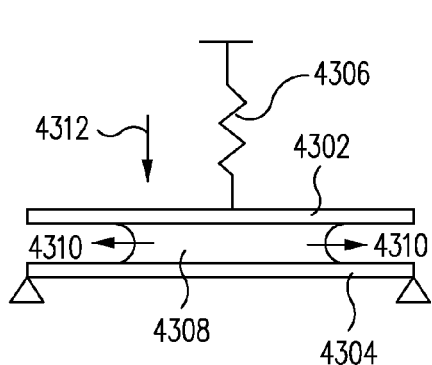
FIGS. 43A and 43 B illustrate methods for deploying the actuator device, in accordance with an embodiment.
Figure 43B:
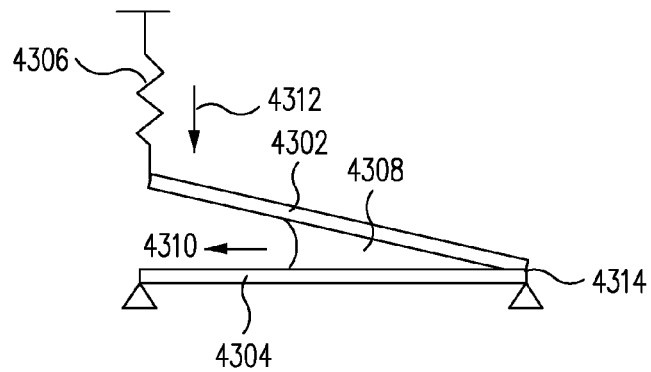

FIGS. 43A and 43B schematically illustrate how capillary forces exhibited by a liquid adhesive can be used to effect or assist deployment of the actuator device 2300 and to fix the moveable frame 505 in the deployed position. In FIG. 43A, a hydrophilic moving plate 4302 is disposed over a hydrophilic stationary plate 4304 by a spring 4306, which may comprise a deployment flexure 2310 or a motion control flexure 2306. If a liquid such as water or a liquid adhesive 4308 having suitable physical properties is disposed between the two plates 4302 and 4304, it will wet the opposing surfaces of the two plates to form a meniscus, indicated by the arrows 4310, and thereby generate a pressure difference between the adhesive 4308 and the ambient that acts to pull the moving plate 4302 in translation toward the stationary plate 4304 and against the bias of the spring 4306 in the direction of the arrow 4312. Curing of the adhesive 4308 effectively fixes the final relative position of the two plates 4302 and 4304.

A similar arrangement is illustrated in FIG. 43B, except that the moving plate 4302 is rotatably coupled to the stationary plate 4304 by a hinge 4314 at an edge thereof. Hence, in the embodiment of FIG. 43B, the pressure difference between the adhesive 4308 and the ambient acts to pull the moving plate 4302 rotationally about the hinge 4314 and toward the stationary plate 4304 in the direction of the arrow 4312.

As those of some skill in this art will appreciate, the same capillary forces acting in the translational and rotational embodiments of FIGS. 43A and 43B above can be harnessed to deploy the actuator device 2300 prior to use.

Figure 44:
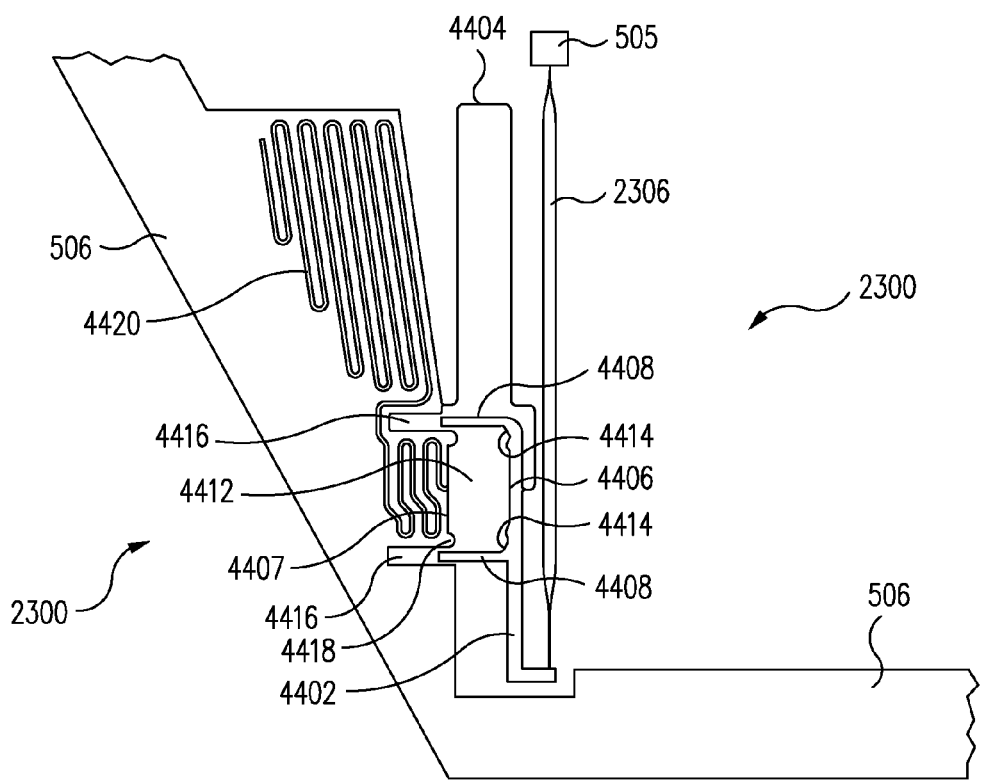
FIG. 44 illustrates a method for deploying the actuator device and for fixing it in the deployed position, in accordance with an embodiment.

An example embodiment of a method and apparatus for deploying the actuator device 2300 using capillary forces is illustrated in the partial top plan view of FIG. 44. In the embodiment of FIG. 44, the method includes forming a moving plate 4402 having an upper portion coupled to the outer frame 506 by an attachment spring 4404, a lower end coupled to the motion control flexure 2306 (which is coupled at its upper end to the moveable frame 505), a side wall 4406 disposed adjacent to and spaced apart from a side wall 4407 of the outer frame 506, a pair of arms 4410 extending toward and defining a gap 4412 between the adjacent side walls 4406 and 4407 of the moving plate 4402 and the outer frame 506, and a pair of registration locks 4414 disposed in the gap 4412.

The method further comprises forming a pair of parallel slots 4416 and a pair of parallel registration keys 4418 in the adjacent side wall 4407 of the outer frame 506. Each slot 4416 is configured to receive a respective one of the arms 4408 of the moving plate 4402, and each registration key 4418 is configured to engage in a respective one of the registration locks 4414 thereof. The method further includes forming a serpentine reservoir 4420 for a liquid adhesive in the outer frame 506 and disposed in communication with the gap 4412 between the adjacent side walls 4406 and 4407 of the moving plate 4402 and the outer frame 506.

To effect deployment, a suitable liquid adhesive is disposed in the gap 4412 such that the adhesive is wicked into the serpentine reservoir 4420 in the outer plate 506 and which creates a capillary force between the adjacent side walls 4406 and 4407 of the moving plate 4402 and the outer frame 506 that draws the adjacent side wall 4406 of the moving plate 4402 laterally toward the adjacent side wall 4407 of the outer frame 506, thereby causing the respective arms 4408, slots 4416, registration locks 4414 and keys 4418 of the moving plate 4402 and the outer frame 506 to move into engagement with each other, thereby causing the motion control flexure 2306 to urge the moveable frame 505 to the deployed position.

During deployment, the reservoir 4420 serves to store surplus adhesive while the moving plate 4402 moves, and the engagement of the complementary registration features 4408, 4416, 4414 and 4418 serves to confine movement of the moving plate 4402 to substantially lateral translational movement.

In some embodiments, the liquid adhesive may be cured or allowed to auto-cure to fix the moveable frame 505 and the associated moving teeth 560 (not seen in FIG. 44) in the deployed position, i.e., for substantially coplanar, rectilinear movement perpendicularly to the fixed frame 517.

Figure 45:
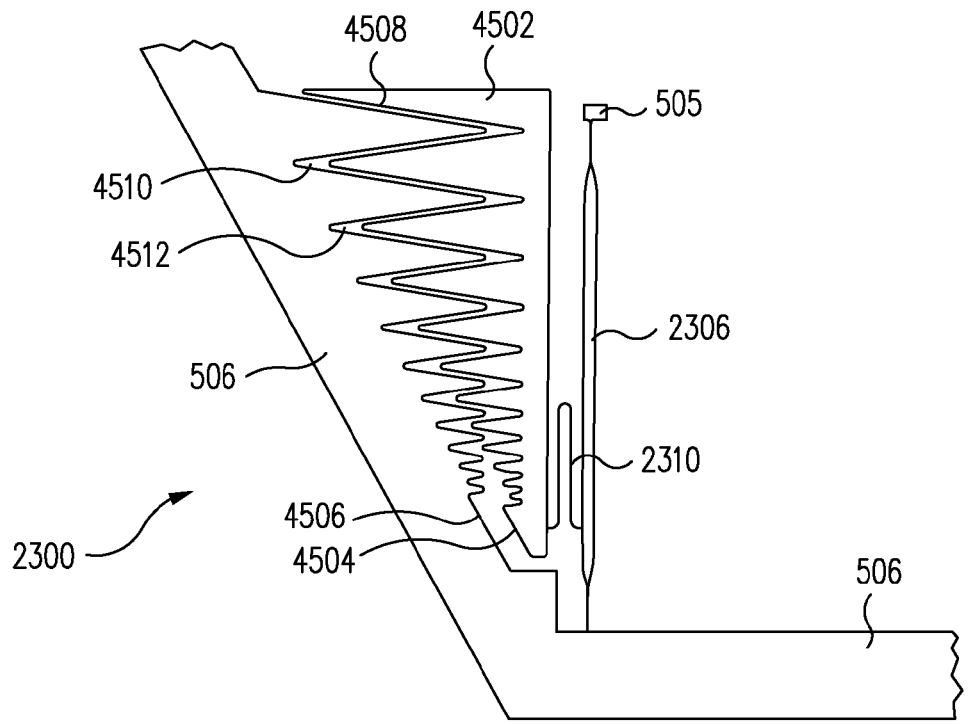
FIG. 45 illustrates a method for deploying the actuator device and for fixing it in the deployed position, in accordance with an embodiment.

Another example embodiment of a method and apparatus for deploying the actuator device 2300 using capillary forces is illustrated in the partial top plan view of FIG. 45. In the embodiment of FIG. 45, the method includes forming a moving plate 4502 coupled to the motion control flexure 2306 by a deployment flexure 2310 and having a side wall 4504 disposed adjacent to a side wall 4506 of the outer frame 506. The adjacent side walls 4504 and 4506 of the moving plate 4502 and the outer frame 506 are formed to respectively contain complementary zigzag patterns 4508 and 4510 that define a zigzag gap 4512 between the adjacent side walls 4504 and 4506 of the moving plate 4502 and the outer frame 506.

To effect deployment, a liquid adhesive is disposed in the zigzag gap 4512 such that the liquid adhesive creates a capillary force between the adjacent side walls 4504 and 4506 of the moving plate 4502 and the outer frame 506 which draws the moving plate 4502 and the deployment flexure 2310 laterally toward the outer plate 506, thereby causing the motion control flexure 2306 to urge the moveable frame 505 to the deployed position. In this embodiment, the length, shape and width of the zigzag gap 4512 are configured to increase the distance that the moving plate 4502 moves laterally during deployment while maintaining an adequate deployment force, and to obviate the need for a reservoir, as in the embodiment of FIG. 44 above, for storage of surplus adhesive.

As discussed above, in some embodiments, the liquid adhesive may be cured or allowed to auto-cure to fix the moveable frame 505 and the associated moving teeth 560 (not seen in FIG. 45) in the deployed position.

Figure 46:
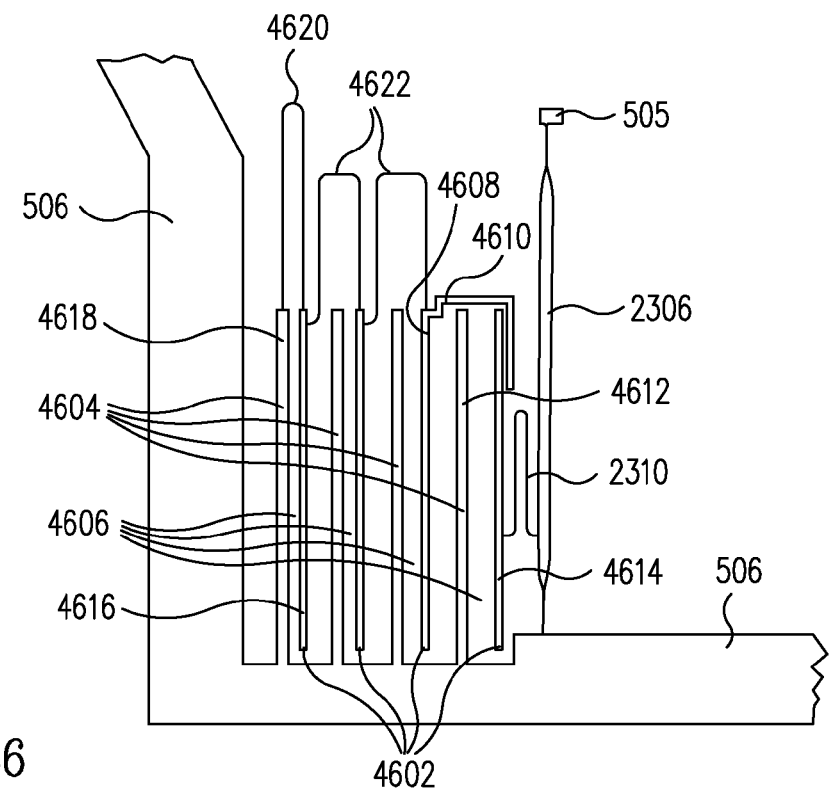
FIG. 46 illustrates a method for deploying the actuator device and for fixing it in the deployed position, in accordance with an embodiment.

Another example embodiment of a method and apparatus for deploying the actuator device 2300 using capillary forces is illustrated in the partial top plan view of FIG. 46. In the embodiment of FIG. 46, the method includes forming a plurality of moving plates 4602 respectively interleaved between a corresponding plurality of stationary plates 4604 attached to the outer frame 506 and defining a corresponding plurality of gaps 4606 between respective outer sidewalls of the moving plates 4602 and respective inner sidewalls of the stationary plates 4604. The penultimately innermost one 4408 of the moving plates 4402 is formed to include an L-shaped arm 4610 that overarches the innermost one 4612 of the stationary plates 4604 and extends downwardly and adjacent to an upper end of an inner side wall of the innermost one 4614 of the moving plates 4602.

As illustrated in FIG. 46, the outermost one 4616 of the moving plates 4602 is coupled to the outermost one 4618 of the stationary plates 4604 with an attachment spring 4620. Adjacent ones of the moving plates 4602 intermediate of the outermost and innermost ones 4618 and 4612 of the stationary plates 4604 are respectively coupled to each other with a plurality of attachment springs 4622. The innermost one 4614 of the moving plates 4602 is coupled to the motion control flexure 2306 with a deployment flexure 2310.

To effect deployment, a liquid adhesive is disposed in the gaps 4606 such that the liquid adhesive creates a capillary force between the adjacent side walls of the moving plates 4602 and the stationary plates 4604 that draws the moving plates 4602 and the deployment flexure 2310 laterally, thereby causing the motion control flexure 2306 to urge the moveable frame 505 to the deployed position.

In one embodiment, the liquid adhesive can be disposed in the gaps 4606 sequentially, beginning with an outermost one of the gaps 4606 and proceeding inwardly. This enables each succeeding gap 4606 to be made progressively smaller so that the selected deployment distance is made larger while the force required for deployment is maintained relatively constant.

As above, in some embodiments, the liquid adhesive may be cured or allowed to auto-cure to fix the moveable frame 505 and the associated moving teeth 560 (not seen in FIG. 46) in the deployed position.

Figure 47:
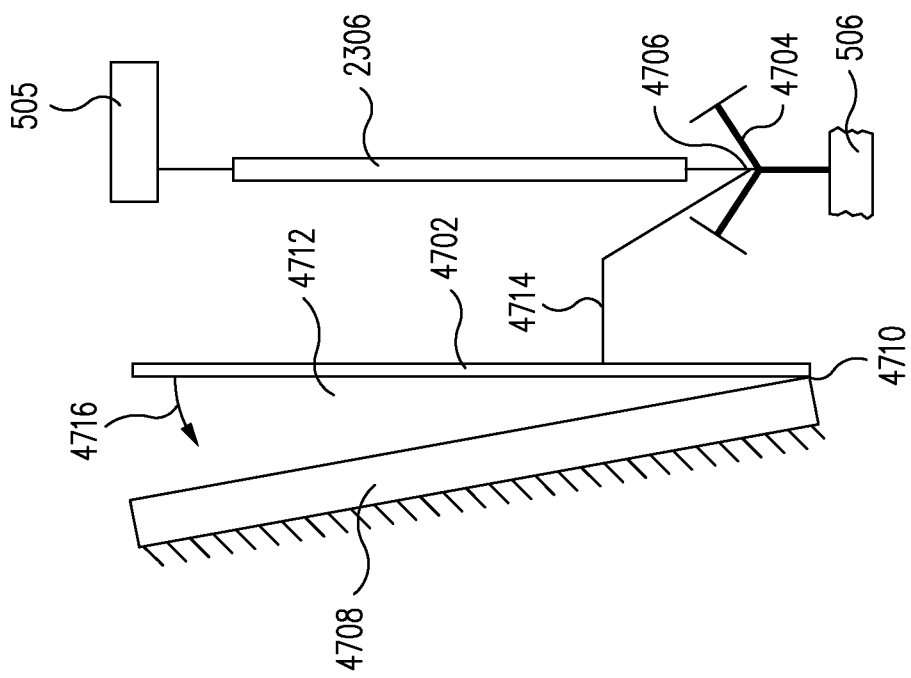
FIG. 47 illustrates a method for deploying the actuator device and for fixing it in the deployed position, in accordance with an embodiment.

Another example embodiment of a method and apparatus for deploying the actuator device 2300 using capillary forces is illustrated schematically in FIG. 47. In the embodiment of FIG. 47, the outer end of the motion control flexure 2306 is coupled to the outer frame 506 by a plurality of attachment springs 4704 coupled to each other and to the motion control flexure 2306 at a nexus 4706. An inner end of the motion control flexures 2306 is coupled to the moving frame 505.

In the embodiment of FIG. 47, the method includes forming a moving plate 4702 rotatably attached to a stationary plate 4708, e.g., the outer frame 505, by a hinge 4710 at a lower end thereof and defining an angular gap 4712 between adjacent sidewalls of the moving plate 4702 and the stationary plate 4708. The method further includes forming a connection beam 4714 coupling the moving plate 4702 to the nexus 4706.

To effect deployment, a liquid adhesive is disposed in the angular gap 4712 such that the liquid adhesive creates a capillary force between the adjacent side walls of the moving plate 4702 and the stationary plate 4708 that rotates the moving plate 4702 and connection beam 4714 laterally about the hinge 4710 and toward the stationary plate 4708, indicated by the arrow 4716, thereby causing the motion control flexure 2306 to urge the moveable frame 505 to the deployed position.

As above, in some embodiments, the liquid adhesive may be cured or allowed to auto-cure to lock the moveable frame 505 and the associated moving teeth 560 (not seen in FIG. 47) in the deployed position.

Figure 48:
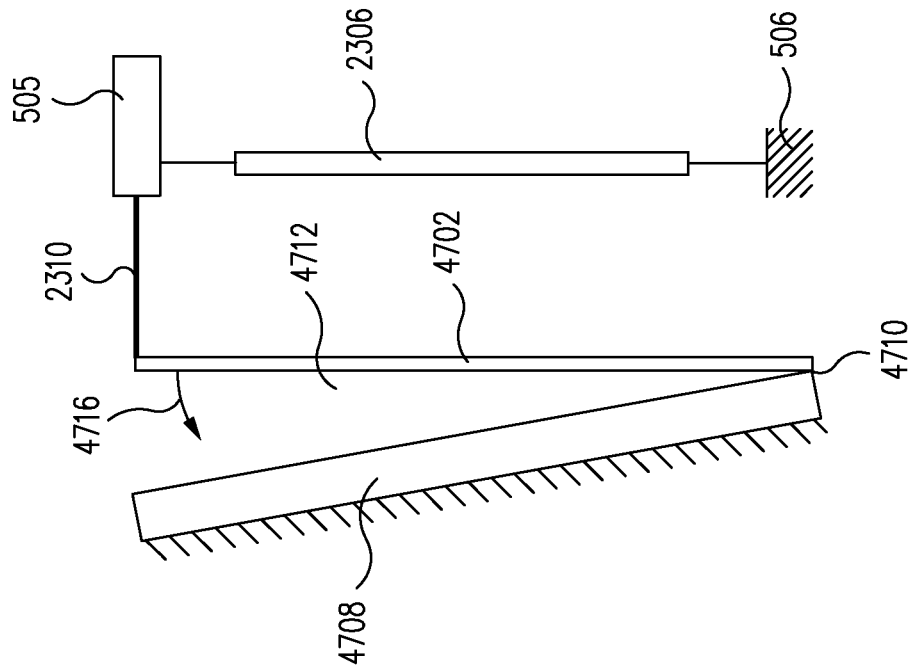
FIG. 48 illustrates a method for deploying the actuator device and for fixing it in the deployed position, in accordance with an embodiment.

Another example embodiment of a method and apparatus for deploying the actuator device 2300 using capillary forces is illustrated schematically in FIG. 48. As may be seen in a comparison of FIGS. 47 and 48, the latter embodiment is substantially similar to the former, with the following differences: The outer end of the motion control flexure 2306 is coupled directly to the outer frame 506, the connection beam 4714 is eliminated, and the moving plate 4702 is instead coupled directly to the moveable frame 505 by a deployment flexure 2310.

In the embodiment of FIG. 48, as in that of FIG. 47, deployment is effected by disposing a liquid adhesive in the angular gap 4712 such that the liquid adhesive creates a capillary force between the adjacent side walls of the moving plate 4702 and the stationary plate 4708 that rotates the moving plate 4702 and deployment flexure 2310 laterally about the hinge 4710 and toward the stationary plate 4708, thereby causing the moveable frame 505 to move to the deployed position.

As above, in some embodiments, the liquid adhesive may be cured or allowed to auto-cure to lock the moveable frame 505 and the associated moving teeth 560 (not seen in FIG. 48) in the deployed position.

As discussed above in connection with FIG. 14, in some embodiments, the serpentine contact flexure 508 may be utilized to provide an electrically conductive path between a fixed or stationary section of the actuator device 400, e.g., the outer frame 506 or the fixed frame 517, and a moveable section, such as the moveable frame 505 or the platform 520, or alternatively, between two sections that are electrically isolated from each other by, for example, poorly conductive polysilicon hinges. In this regard, the serpentine contact flexure 508 may be one or more of fabricated of an electrically conductive material, e.g., monocrystalline silicon, and/or plated with an electrically conductive material, e.g., gold.

As discussed above in connection with FIGS. 18 and 19, in some embodiments, the ball 518 of the ball-in-socket snubber 513 may be connected to the outer frame 506 through a slot in the complementary socket 519, and the socket 519 may be formed in the platform 520. In these embodiments, the ball-in-socket snubber 513 functions during a shock event to substantially limit motion of the platform 520 relative to the outer frame 506 and thereby substantially mitigate shock loads acting on the motion control flexures 515.

As illustrated in FIG. 19, to ensure that the ball 518 remains concentrically disposed within the complementary socket 519 at all actuated positions of the platform 520, in some embodiments, it may be desirable to provide the outer frame 506 with two portions 1902 respectively disposed on opposite sides of a third, central portion 1904 to which the ball 518 of the ball-in-socket snubber 513 is connected, such that the three portions 1902 and 1904, and hence the ball 518, can be deployed, i.e., displaced downwardly with respect to the rest of the outer frame 506, and then fixed at that out-of-plane position.

To effect this folding, in some embodiments, the outer frame 506 may be provided with a pair of folding frame hinges 526 respectively formed at opposite ends of each folding frame portion 1902. As illustrated in FIG. 19, the distally opposite folding frame hinges 526 respectively couple the outer ends of the folding portions 1902 to the outer frame 506, and the proximally opposite hinges 526 respectively couple the inner ends of the folding portions 1902 to the central portion 1904. In this arrangement, when a deployment force is exerted downward on the central portion 1904, the folding portions 1902 rotate downwardly about their outer ends, whereas, the central portion 1904, including the ball 518, moves downward with substantially rectilinear motion. To effect the fixing of the folding frame portions 1902 and the central frame portion 1904 in their respective downwardly deployed positions, a fillet 1501 of an adhesive may be disposed in one or both of the folding frame hinges 526, as described above in connection with the fixing of the fixed frame 517 in the deployed position.

As discussed above in connection with FIG. 10, in some embodiments, the lateral snubber assembly 1001 may comprise a first snubber member 1002 formed on the fixed frame 517 and a bilaterally symmetrical second snubber member 1003 formed on the moveable frame 505, which cooperate with each other to inhibit undesirable lateral motion of the movable frame 505 with respect to the fixed frame 517, and hence, with respect to the outer frame 506, as well, during shocks or large accelerations. An alternative embodiment of the lateral snubber assembly 1754 is illustrated in FIGS. 17D-17J, the latter differing from the former primarily in the shape of the ends of the snubber members which, in some embodiments, may each be semi-cylindrical in shape, i.e., may each comprise a full radius.

In either of these embodiments, it may be desirable to make the gap "D" between the first snubber member 1002 and the second snubber member 1003 very narrow, e.g., about 2-3 micrometers, to limit such undesirable lateral or in-plane motion. As those of skill in this art will appreciate, the direct fabrication of such a narrow spacing between two adjacent members on a substrate, even using photolithographic techniques, such as DRIE, can be difficult. However, as illustrated in FIGS. 49A-49F, in one embodiment, the gap D can be made at least this narrow using the "indirect" photolithographic technique described below.

Figure 49A:
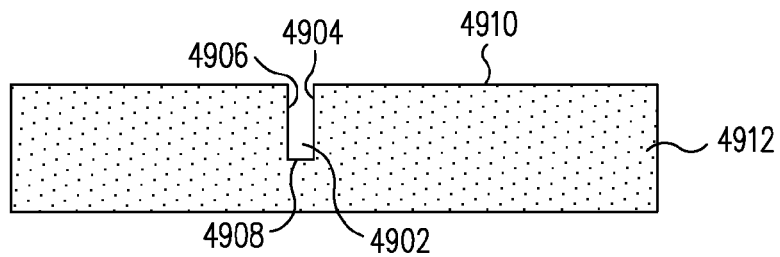
FIGS. 49A-49F illustrate a method for making a gap between two sections of the actuator device, in accordance with an embodiment.

FIGS. 49A-49F illustrate successive steps in an example embodiment of a photolithographic process that may be used to fabricate the gap D. As illustrated in FIG. 49A, a trench 4902 having side walls 4904 and 4906 and a bottom end 4908 is formed, e.g., by DRIE, in an upper surface 4910 of a substrate 4912, e.g., a silicon substrate.

Figure 49B:
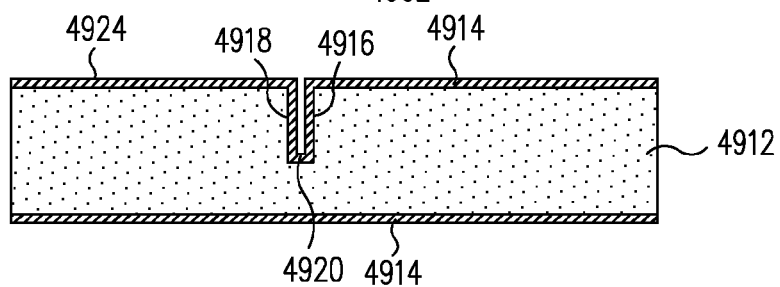

As illustrated in FIG. 49B, a layer of oxide 4914, e.g., silicon oxide, is formed, e.g., by chemical vapor deposition (CVD) techniques, on at least the upper surface 4910 of the substrate 4912 such that the oxide forms liners 4916 and 4918 on the corresponding side walls 4904 and 4906 of the trench 4902, and a liner 4920 on the bottom end 4908 of the trench 4902. The oxide wall and bottom end liners 4916, 4918 and 4920 may have a thickness of, for example, about 2-3 micrometers.

Figure 49C:
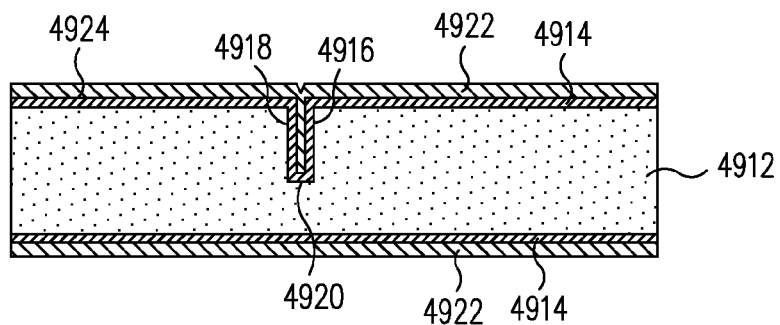

As illustrated in FIG. 49C, a layer of polycrystalline silicon (polysilicon) is then deposited, e.g., using CVD techniques, on at least an upper surface 4924 of the layer of oxide 4914 on the upper surface 4910 of the substrate 4912 and the liners of oxide 4916, 4918 and 4920 in the trench 4902.

Figure 49D:
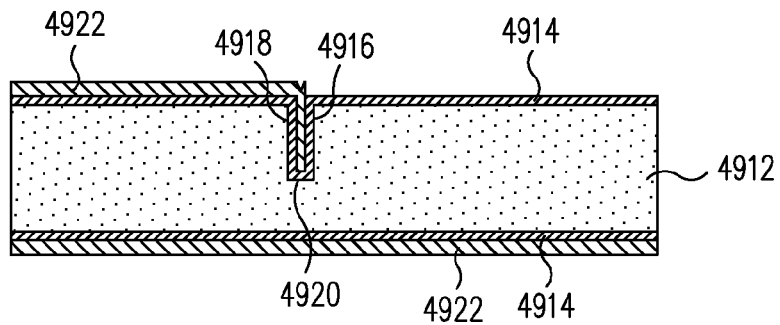

As illustrated in FIG. 49D, a portion of the layer of polysilicon 4922 is then removed, e.g., by masking and etching techniques, from the upper surface 4924 of the layer of oxide 4914 on the upper surface 4910 of the substrate 4912 in an area adjacent to a side wall 4904 of the trench 4902 and above the corresponding liner of oxide 4916 disposed thereon.

Figure 49E:
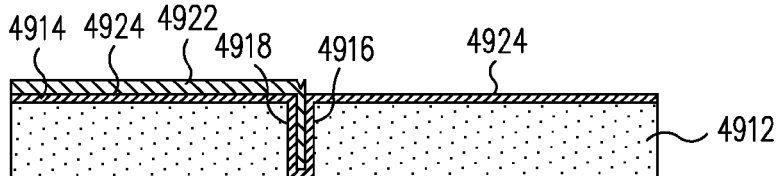

As illustrated in FIG. 49E, a lower portion of the substrate 4912, including the bottom end 4908 of the trench 4902, is then removed, e.g., using chemical mechanical planarization (CMP) techniques, such that the liner of oxide 4920 at the bottom end 4908 of the trench 4902 is exposed through a lower surface 4924 of the substrate 4912.

Figure 49F:
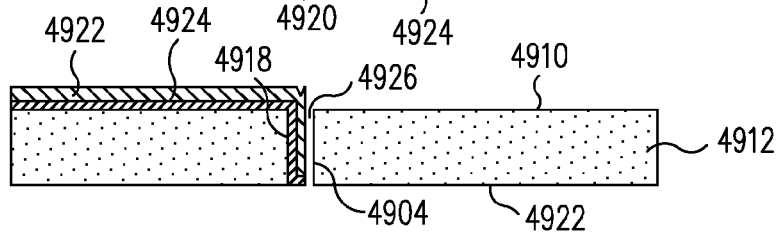
Figure 50:
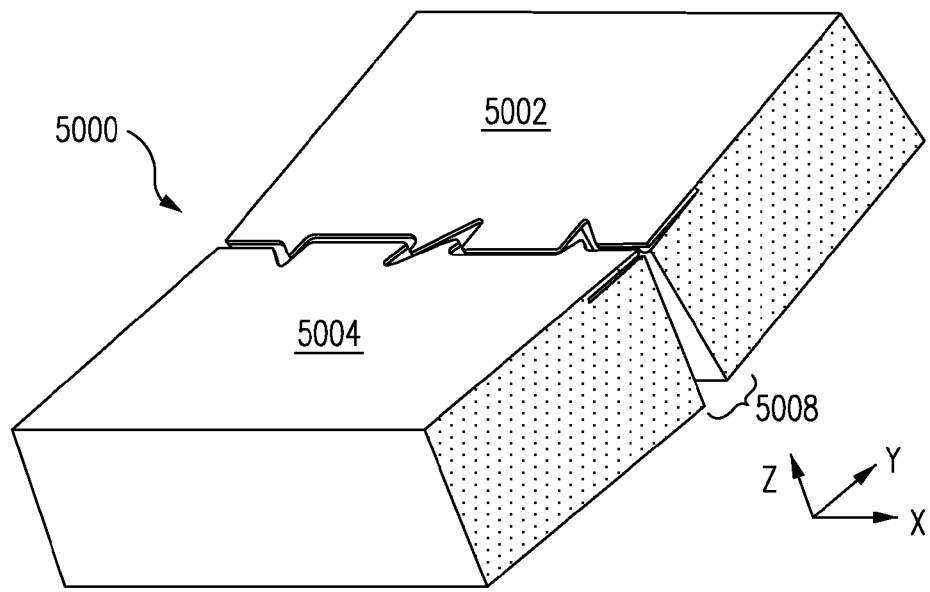
FIG. 50 illustrates an interlocking flap damper, in accordance with an embodiment.

As illustrated in FIG. 49F, the liner of oxide 4916 on the corresponding side wall 4904 of the trench 4902, at least a portion of the liner of oxide 4920 exposed at the bottom end 4908 of the trench 4902, and the layer of oxide 4914 on the upper surface 4910 of the substrate 4912 adjacent to the side wall 4904 of the trench 4902 is then removed, e.g., using masking and etching techniques, thereby resulting in a gap 4926 having a width equal to the liner of oxide 4916 that was removed from the corresponding side wall 4904 of the trench, viz., about 2-3 micrometers.

As illustrated in FIGS. 50-53, in one embodiment, the foregoing photolithography method can be used advantageously to form an interlocking flap feature 5000 similar to the interlocking snubber flaps feature 1756 discussed above in connection with FIGS. 17D-17N and useful for controlling out-of-plane Z deflection of a moveable component 5002, e.g., a moveable frame 505, relative to a fixed component 5004, e.g., a fixed frame 517, to which the moveable component 5002 is rotatably coupled, e.g., with hinges or flexures (not seen in FIGS. 50-53). The interlocking flaps feature 5000 functions to substantially prevent excessive motion of the moveable component 5002 in the ±Z directions about a hinge line 5006, thereby protecting the hinging elements (not seen) from excessive out-of-plane or Z deflection. The restraint provided by the interlocking flap feature 5000 has a relatively low stiffness so as to prevent high contact decelerations, and hence, forces acting on the hinging elements (not seen), yet allows intended rotations of the moveable component 5002 to occur about the hinge line 5006 during operation, i.e., actuation, of the actuator device 400.

In the example embodiment of FIGS. 50-53, as in the method described above in connection with FIGS. 49A-49F, an example method for forming the interlocking flap feature 5000 begins with the formation of a trench 5008, e.g., using DRIE, between the moveable and fixed components 5002 and 5004, which may be comprised of a semiconductor, e.g., monocrystalline silicon. FIGS. 52A and 52B are enlarged partial top and bottom plan views, respectively, of the interlocking flap feature 5000. As may be best visualized in the bottom plan view of FIG. 52B, the trench 5008 describes an alternating, sinuous path between the two components 5002 and 5004 that can be radially symmetrical about a Z axis extending through the center thereof. As in the above method, a liner 5010 of an oxide, e.g., SiO2, is then deposited on the walls of the trench 5008 and at least the upper surface of the two components 5002 and 5004, as illustrated in FIGS. 53A and 53B, followed by the deposition of a layer 5012 of, e.g., polysilicon, on the oxide liner 5010.

As illustrated in the top plan view of FIG. 52A, the oxide liner 5010 and polysilicon layer 5012 are then etched away from selected areas of the walls of the trench 5008 and upper surfaces of the two components 5002 and 5004 using, e.g., isotropic and anisotropic etching techniques, to define two oppositely directed, rectangular, polysilicon flaps 5014A and 5014B that are respectively disposed on the fixed and moveable components 5004 and 5002, and that respectively overhang the opposing component. In particular, the oxide liner in the areas underlying the two polysilicon flaps 5014A and 5014B can be partially or completely removed, e.g., by an isotropic etching technique, such that the two flaps 5016A and 5016B are respectively disposed over and spaced apart from corresponding silicon shoulders 5016A and 5016B respectively disposed on the opposing moveable and fixed components 5002 and 5004. Thus, the oxide liner 5010 disposed between the two flaps 5016A and 5016B and the respectively corresponding shoulders 5016A and 5016B is removed.

Figure 51:
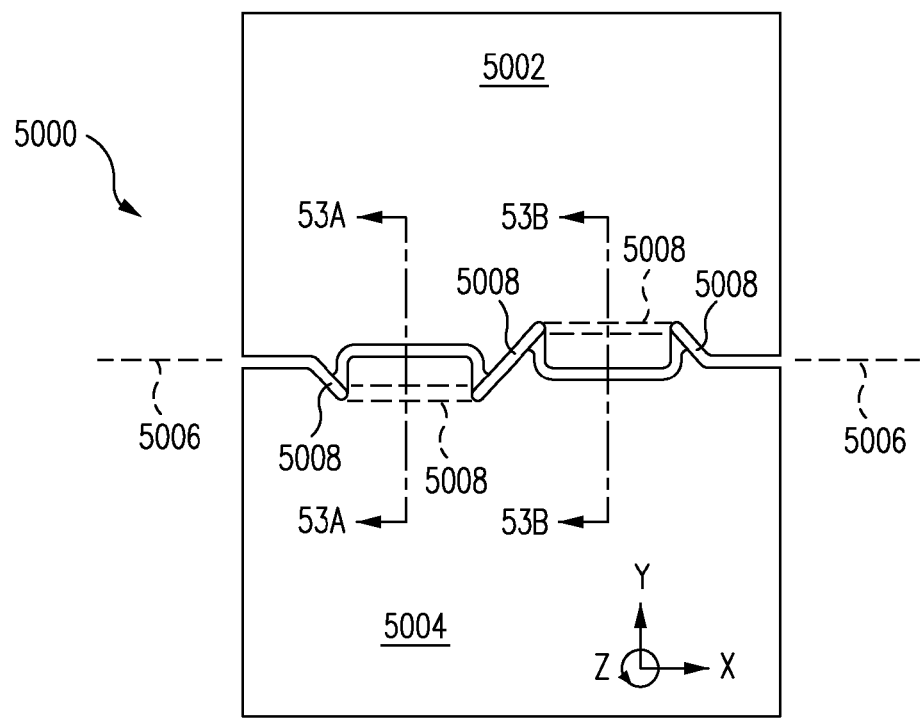
FIG. 51 illustrates features of the interlocking flap damper, in accordance with an embodiment.
Figure 53B:
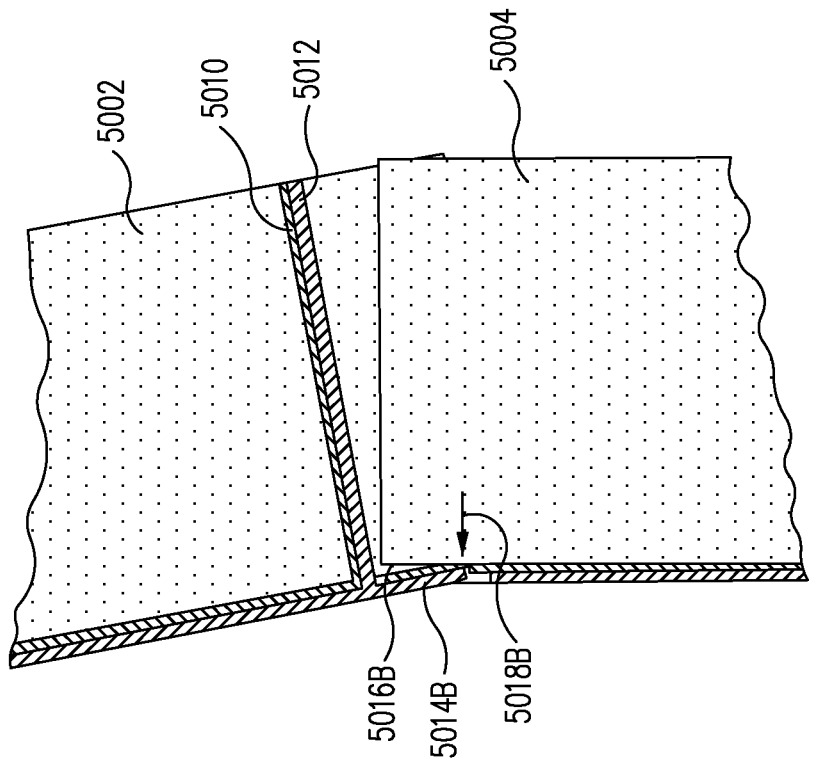
FIGS. 53A-53B illustrate other features of the interlocking flap damper, in accordance with an embodiment.
Figure 53A:
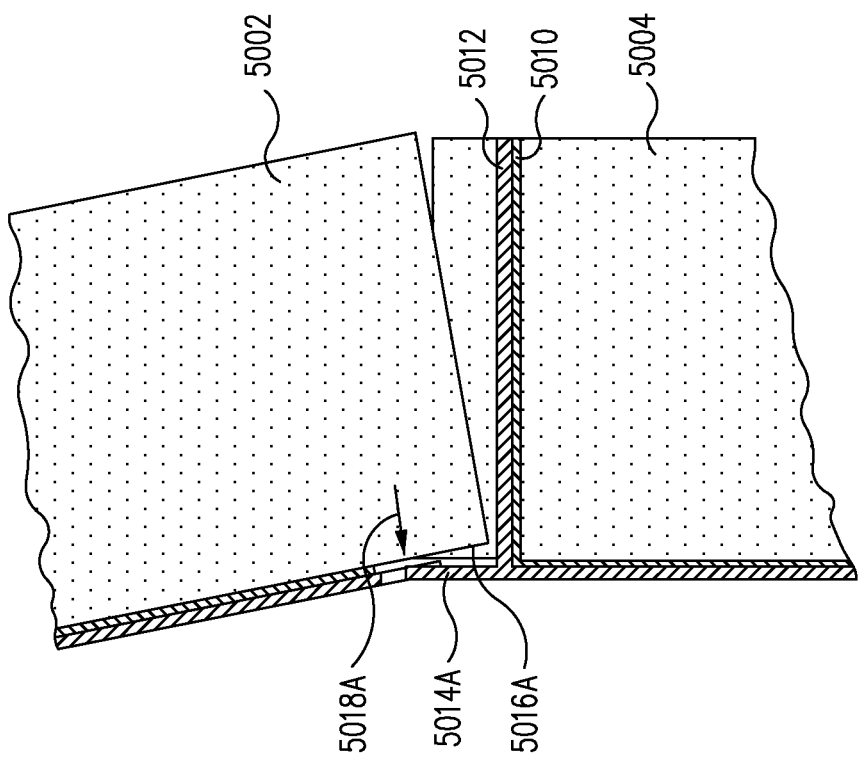

FIGS. 53A and 53B are enlarged partial cross-sectional views through the flaps 5014A and 5014B, respectively, as seen along the corresponding lines of the sections 53A-53A and 53B-53B taken in FIG. 51, showing the operation of the interlocking flaps feature 5000 to restrain motion of the moveable component 5002 in the +Z and −Z directions, respectively. As illustrated in FIG. 53A, the flap 5014A functions by making a restraining contact with a line 5018A on the underlying shoulder 5016A on the moving part 5002 when the latter is moved in the +Z direction. As illustrated in FIG. 53B, the flap 5014B functions by making a restraining contact with a line 5018B on the underlying shoulder 5016B on the fixed component 5002 when the moving portion 5002 is moved in the −Z direction.

FIGS. 17D-17F illustrate an alternative embodiment of an interlocking snubber flaps feature 1756 useful for constraining both vertical movement of a component, e.g., moveable component 505, in the ±Z directions, as well as lateral movement thereof, i.e., in the ±X and/or ±Y directions, as discussed above.

As illustrated in FIG. 17F, this interlocking flaps feature includes the formation of a pair of flaps 1756A and 1756B respectively extending from moveable and fixed components 505 and 506 and over a corresponding shoulder 1762 formed on the other, opposing component, as discussed above.

As illustrated in FIG. 17M, the respective front ends of the flaps 1756A and 1756B may define corners at the opposite ends thereof, and one or more of the corners may incorporate elliptical fillets 1766, as discussed above.

As illustrated in FIGS. 17D-17L and FIGS. 17K-17N, a single snubber flap 1758 may be provided for constraining lateral movement of a component, e.g., moveable component 505, in an actuator device 1750. For example, the snubber flap 1758, which in some embodiments may comprise polysilicon, may extend from a fixed component, e.g., component 506, and toward but not over, the moveable component 505 to limit motion of the moveable component 505 in the lateral, i.e., in the in the ±X and/or ±Y directions, as discussed above. As illustrated in FIGS. 17K, 17L and 17N, the gap 1764 between the fixed and moveable components 505 and 506 can be made relatively larger than the gap 1768 between the snubber flap 1758 and the moveable component 505, such that the snubber flap 1758 does not interfere with normal rotational motion of the movable component 505, but does function to prevent unwanted lateral motion thereof, as discussed above.

Although the actuator disclosed herein is described as a MEMS actuator, such description is by way of example only and not by way of limitation. Various embodiments may include non-MEMS actuators, components of non-MEMS actuators, and/or features of non-MEMS actuators.

Thus, an actuator suitable for use in a wide variety of different electronic devices may be provided. Motion control of the actuator and/or items moved by the actuator may also be provided. As such, an enhanced miniature camera for use in electronic devices may be provided.

According to various embodiments, smaller size and enhanced shock resistance for miniature cameras are provided. Enhanced fabrication techniques may be used to provide these and other advantages. Thus, such fabrication techniques may additionally enhance the overall quality and reliability of miniature cameras while also substantially reducing the cost thereof.

Where applicable, the various components set forth herein may be combined into composite components and/or separated into sub-components. Where applicable, the ordering of various steps described herein may be changed, combined into composite steps, and/or separated into sub-steps to provide features described herein.

Embodiments described herein illustrate but do not limit the disclosure. It should also be understood that numerous modifications and variations are possible in accordance with the principles of the disclosure.

What is claimed is:

1. An actuator device, comprising:
a fixed frame;
a movable frame configured to rotate about a pivot axis relative to the fixed frame; and
interlocking flaps disposed at the pivot axis between the fixed frame and the movable frame and configured to restrict the movable frame from moving out of plane relative to the fixed frame at the pivot axis, wherein the interlocking flaps comprise a first flap extending from the fixed frame across the pivot axis and over a shoulder portion formed on the movable frame and a second flap extending from the movable frame across the pivot axis and over a shoulder portion formed on the fixed frame.

2. The actuator device of claim 1, wherein the interlocking flaps are disposed over a gap formed between the fixed frame and the movable frame.

3. The actuator device of claim 2, wherein portions of the gap are offset from the pivot axis.

4. The actuator device of claim 1, wherein the first flap and the second flap are configured to interact with the shoulder portions of the fixed frame and the movable frame to prevent the movable frame from moving out of plane relative to the fixed frame at the pivot axis.

5. The actuator device of claim 1, further comprising a snubber flap disposed at the pivot axis and configured to restrict a lateral movement of the movable frame relative to the fixed frame.

6. The actuator device of claim 1, further comprising a flap damper disposed at the pivot axis and configured to provide damping between the movable frame and the fixed frame.

7. The actuator device of claim 1, wherein each of the first and the second flaps have corners at respective front ends comprising a front surface, and wherein one or more corners of the front surface is elliptically shaped.

8. A portable device having a camera comprising the actuator device of claim 1.

9. A method for operating an actuator device, the method comprising:
rotating a movable frame of the actuator device about a pivot axis relative to a fixed frame of the actuator device; and
restricting the movable frame from moving out of plane relative to the fixed frame at the pivot axis by interlocking flaps disposed at the pivot axis between the fixed frame and the movable frame, the interlocking flaps comprise a first flap extending from the fixed frame across the pivot axis and over a shoulder portion formed on the movable frame and a second flap extending from the movable frame across the pivot axis and over a shoulder portion formed on the fixed frame.

10. The method of claim 9, wherein the movable frame is rotated by an electrostatic force generated between the movable frame and the fixed frame.

11. The method of claim 9, further comprising restricting, by a snubber flap disposed at the pivot axis, a lateral movement of the movable frame relative to the fixed frame.

12. The method of claim 9, further comprising providing damping between the fixed frame and the movable frame by a flap damper disposed at the pivot axis.

13. The method of claim 9, further comprising moving an optical element by actuation of the actuator device in a camera for one or more of a focusing operation, a zooming operation, an optical image stabilization operation in the camera.

14. A method of making interlocking flaps of an actuator device, the method comprising:
forming a trench in a substrate;
forming an oxide layer on an upper surface of the substrate and inner walls of the trench;
forming a polysilicon layer on the oxide layer;
removing a bottom portion of the substrate to extend the trench through the substrate to form a gap separating a fixed frame from a movable frame of the actuator device; and
etching selected areas of an oxide liner formed by the oxide layer and the polysilicon layer to form the interlocking flaps, the interlocking flaps comprising a first flap extending across the gap and over a shoulder portion of the movable frame of the actuator and a second flap extending across the gap and over a shoulder portion of the fixed frame of the actuator device.

15. The method of claim 14, wherein portions of the gap are offset from a pivot axis.

16. The method of claim 14, wherein the first flap and the second flap are configured to interact with the shoulder portions of the fixed frame and the movable frame to prevent the movable frame from moving out of plane relative to the fixed frame at the pivot axis.

17. The method of claim 14, further comprising forming a snubber flap at the pivot axis, the snubber flap configured to restrict a lateral movement of the movable frame relative to the fixed frame.

18. The method of claim 14, further comprising forming a flap damper at the pivot axis, the flap damper configured to provide damping between the movable frame and the fixed frame.

19. The method of claim 14, wherein one or more of the first and the second flaps are formed from the polysilicon layer.

* * * * *